United States Patent
Zhou et al.

(10) Patent No.: US 11,127,728 B2
(45) Date of Patent: Sep. 21, 2021

(54) THREE-DIMENSIONAL SEMICONDUCTOR CHIP CONTAINING MEMORY DIE BONDED TO BOTH SIDES OF A SUPPORT DIE AND METHODS OF MAKING THE SAME

(71) Applicant: SANDISK TECHNOLOGIES LLC, Addison, TX (US)

(72) Inventors: Fei Zhou, San Jose, CA (US); Raghuveer S. Makala, Campbell, CA (US); Adarsh Rajashekhar, Santa Clara, CA (US); Rahul Sharangpani, Fremont, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/848,137

(22) Filed: Apr. 14, 2020

(65) Prior Publication Data
US 2020/0243500 A1    Jul. 30, 2020

Related U.S. Application Data

(63) Continuation of application No. 16/255,413, filed on Jan. 23, 2019, now Pat. No. 10,665,581.

(51) Int. Cl.
*G11C 5/04* (2006.01)
*H01L 25/18* (2006.01)
(Continued)

(52) U.S. Cl.
CPC .............. *H01L 25/18* (2013.01); *G11C 16/08* (2013.01); *G11C 16/24* (2013.01); *G11C 16/26* (2013.01);
(Continued)

(58) Field of Classification Search
CPC .... G11C 5/02; G11C 5/04; G11C 5/06; H01L 25/18; H01L 25/50; H01L 23/481;
(Continued)

(56) References Cited

U.S. PATENT DOCUMENTS

| 5,915,167 | A | 6/1999 | Leedy |
| 6,442,894 | B2 | 9/2002 | Weder |

(Continued)

FOREIGN PATENT DOCUMENTS

WO    WO2019005220 A1    1/2019

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).
(Continued)

*Primary Examiner* — Alfredo Bermudez Lozada
(74) *Attorney, Agent, or Firm* — The Marbury Law Group PLLC

(57) ABSTRACT

A support die includes complementary metal-oxide-semiconductor (CMOS) devices, front support-die bonding pads electrically connected to a first subset of the peripheral circuitry, and backside bonding structures electrically connected to a second subset of the peripheral circuitry. A first memory die including a first three-dimensional array of memory elements is bonded to the support die. First memory-die bonding pads of the first memory die are bonded to the front support-die bonding pads. A second memory die including a second three-dimensional array of memory elements is bonded to the support die. Second memory-die bonding pads of the second memory die are bonded to the backside bonding structures.

20 Claims, 41 Drawing Sheets

(51) Int. Cl.
| | |
|---|---|
| *H01L 25/00* | (2006.01) |
| *H01L 23/00* | (2006.01) |
| *H01L 27/11556* | (2017.01) |
| *H01L 27/11582* | (2017.01) |
| *G11C 16/26* | (2006.01) |
| *G11C 16/08* | (2006.01) |
| *G11C 16/24* | (2006.01) |
| *G11C 16/30* | (2006.01) |
| *H01L 23/48* | (2006.01) |

(52) U.S. Cl.
CPC ............ *G11C 16/30* (2013.01); *H01L 23/481* (2013.01); *H01L 24/03* (2013.01); *H01L 24/09* (2013.01); *H01L 24/11* (2013.01); *H01L 24/14* (2013.01); *H01L 24/43* (2013.01); *H01L 24/46* (2013.01); *H01L 25/50* (2013.01); *H01L 27/11556* (2013.01); *H01L 27/11582* (2013.01); *H01L 2924/14511* (2013.01)

(58) Field of Classification Search
CPC ......... H01L 24/03; H01L 24/09; H01L 24/11; H01L 24/14; H01L 24/43; H01L 24/46
See application file for complete search history.

(56) References Cited

U.S. PATENT DOCUMENTS

| | | | |
|---|---|---|---|
| 6,537,842 B2 | 3/2003 | Akram | |
| 6,574,918 B2 | 6/2003 | Weder | |
| 6,593,645 B2 | 7/2003 | Shih et al. | |
| 6,753,830 B2 | 6/2004 | Gelbman | |
| 6,888,750 B2 | 5/2005 | Walker et al. | |
| 6,958,548 B2 | 10/2005 | Pozder et al. | |
| 7,084,512 B2 | 8/2006 | Higashida et al. | |
| 7,230,329 B2 | 6/2007 | Sawamoto et al. | |
| 7,387,913 B2 | 6/2008 | Yoshimura et al. | |
| 7,733,659 B2 | 6/2010 | Snider et al. | |
| 7,772,657 B2 | 8/2010 | Yaganov | |
| 7,823,470 B2 | 11/2010 | Shigeno et al. | |
| 8,247,895 B2 | 8/2012 | Haensch et al. | |
| 8,274,792 B2 | 9/2012 | Soffer | |
| 8,482,137 B2 | 7/2013 | Yoshioka et al. | |
| 8,993,061 B2 | 3/2015 | Jones et al. | |
| 9,005,710 B2 | 4/2015 | Jones et al. | |
| 9,142,261 B2 | 9/2015 | D'Abreu et al. | |
| 9,167,228 B2 | 10/2015 | Monari et al. | |
| 9,478,487 B2 | 10/2016 | Yang et al. | |
| 9,681,069 B2 | 6/2017 | El-Ghoroury et al. | |
| 9,689,863 B2 | 6/2017 | Yu et al. | |
| 9,721,855 B2 | 8/2017 | Kuczynski et al. | |
| 9,721,868 B2 | 8/2017 | Lin et al. | |
| 9,780,143 B2 | 10/2017 | Bandic et al. | |
| 9,787,914 B2 | 10/2017 | Sengupta et al. | |
| 9,823,209 B2 | 11/2017 | Yu et al. | |
| 9,914,274 B2 | 3/2018 | Jones et al. | |
| 10,011,098 B2 | 7/2018 | Yu et al. | |
| 10,115,681 B1* | 10/2018 | Ariyoshi ........... | H01L 27/11524 |
| 10,157,867 B1 | 12/2018 | Chen et al. | |
| 10,161,927 B2 | 12/2018 | Yu et al. | |
| 10,283,493 B1 | 5/2019 | Nishida | |
| 10,354,980 B1 | 7/2019 | Mushiga et al. | |
| 10,354,987 B1 | 7/2019 | Mushiga et al. | |
| 10,381,322 B1 | 8/2019 | Azuma et al. | |
| 10,381,362 B1 | 8/2019 | Cui et al. | |
| 10,510,738 B2 | 12/2019 | Kim et al. | |
| 2001/0006257 A1 | 7/2001 | Shih et al. | |
| 2001/0020935 A1 | 9/2001 | Gelbman | |
| 2001/0039757 A1 | 11/2001 | Weder | |
| 2001/0045060 A1 | 11/2001 | Weder | |
| 2001/0055838 A1 | 12/2001 | Walker et al. | |
| 2002/0006696 A1 | 1/2002 | Akram | |
| 2002/0011026 A1 | 1/2002 | Weder | |
| 2003/0058118 A1 | 3/2003 | Wilson | |
| 2003/0094697 A1 | 5/2003 | Higashida et al. | |
| 2004/0222534 A1 | 11/2004 | Sawamoto et al. | |
| 2004/0247236 A1 | 12/2004 | Yoshimura et al. | |
| 2005/0082526 A1 | 4/2005 | Bedell et al. | |
| 2005/0104193 A1 | 5/2005 | Pozder et al. | |
| 2006/0131262 A1 | 6/2006 | Pan et al. | |
| 2007/0214875 A1 | 9/2007 | Shigeno et al. | |
| 2007/0245836 A1 | 10/2007 | Vaganov | |
| 2007/0281439 A1 | 12/2007 | Bedell et al. | |
| 2008/0049949 A1 | 2/2008 | Snider et al. | |
| 2008/0165565 A1 | 7/2008 | Gunter et al. | |
| 2008/0253085 A1 | 10/2008 | Soffer | |
| 2008/0280416 A1 | 11/2008 | Bedell et al. | |
| 2010/0001933 A1 | 1/2010 | Coker et al. | |
| 2010/0167467 A1 | 7/2010 | Aoi | |
| 2011/0170266 A1 | 7/2011 | Haensch et al. | |
| 2011/0281138 A1 | 11/2011 | Yoshioka et al. | |
| 2012/0133381 A1 | 5/2012 | Bruland et al. | |
| 2013/0168674 A1 | 7/2013 | Franzon et al. | |
| 2013/0170171 A1 | 7/2013 | Wicker et al. | |
| 2013/0176401 A1 | 7/2013 | Monari et al. | |
| 2013/0183660 A1 | 7/2013 | Yu et al. | |
| 2013/0236882 A1 | 9/2013 | Yu et al. | |
| 2013/0316329 A1 | 11/2013 | Yu et al. | |
| 2013/0321581 A1 | 12/2013 | El-Ghoroury et al. | |
| 2014/0020191 A1 | 1/2014 | Jones et al. | |
| 2014/0020192 A1 | 1/2014 | Jones et al. | |
| 2014/0073884 A1 | 3/2014 | Yu et al. | |
| 2014/0218996 A1 | 8/2014 | D'Abreu et al. | |
| 2015/0179617 A1 | 6/2015 | Lin et al. | |
| 2015/0246496 A1 | 9/2015 | Jones et al. | |
| 2015/0369798 A1 | 12/2015 | Yu et al. | |
| 2015/0371925 A1 | 12/2015 | Thimmegowda et al. | |
| 2015/0372217 A1 | 12/2015 | Schoelkopf, III et al. | |
| 2016/0005686 A1 | 1/2016 | Yu et al. | |
| 2016/0043026 A1 | 2/2016 | Yang et al. | |
| 2016/0136877 A1 | 5/2016 | Rogers et al. | |
| 2016/0172324 A1 | 6/2016 | Kuczynski et al. | |
| 2016/0191823 A1 | 6/2016 | El-Ghoroury et al. | |
| 2017/0062519 A1 | 3/2017 | Bandic et al. | |
| 2017/0070685 A1 | 3/2017 | Sengupta et al. | |
| 2017/0186731 A1 | 6/2017 | Koike | |
| 2017/0294377 A1 | 10/2017 | Dunga et al. | |
| 2017/0316713 A1 | 11/2017 | Hyman | |
| 2018/0005974 A1* | 1/2018 | Chiu ................. | H01L 23/5384 |
| 2018/0259501 A1 | 9/2018 | Yu | |
| 2018/0277497 A1 | 9/2018 | Matsuo | |
| 2019/0252361 A1 | 8/2019 | Nishida | |

OTHER PUBLICATIONS

International Patent Application No. PCT/US2019/062901, International Search Report and Written Opinion, dated Mar. 12, 2020, 12 pgs.
U.S. Appl. No. 16/231,752, filed Dec. 24, 2018, Sandisk Technologies LLC.
U.S. Appl. No. 16/242,216, filed Jan. 8, 2019, Sandisk Technologies LLC.
U.S. Appl. No. 16/249,423, filed Jan. 16, 2019, Sandisk Technologies LLC.
U.S. Appl. No. 16/251,782, filed Jan. 18, 2019, Sandisk Technologies LLC.
U.S. Appl. No. 16/251,954, filed Jan. 18, 2019, Sandisk Technologies LLC.
U.S. Appl. No. 16/255,413, filed Jan. 23, 2019, Sandisk Technologies LLC.

* cited by examiner

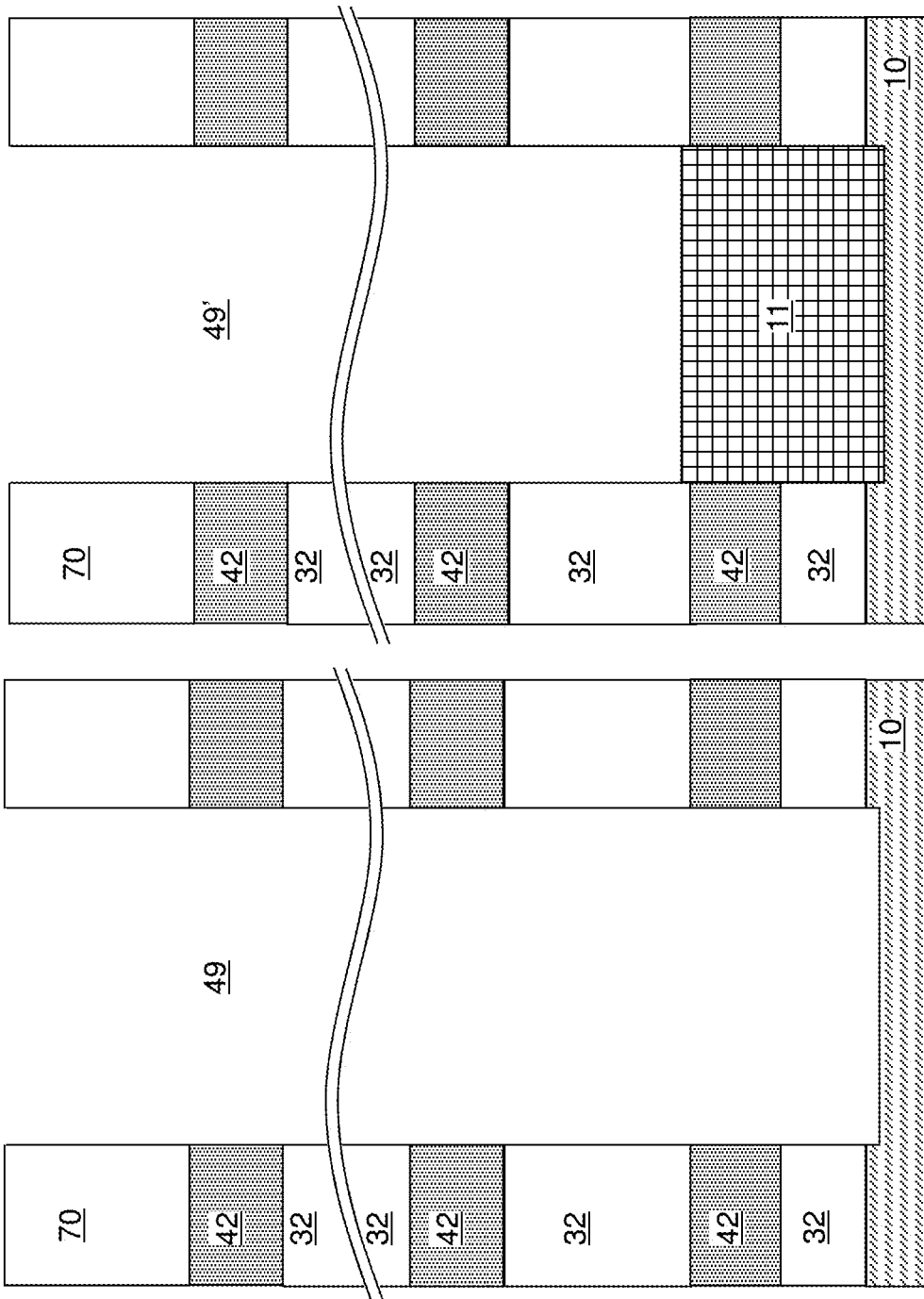

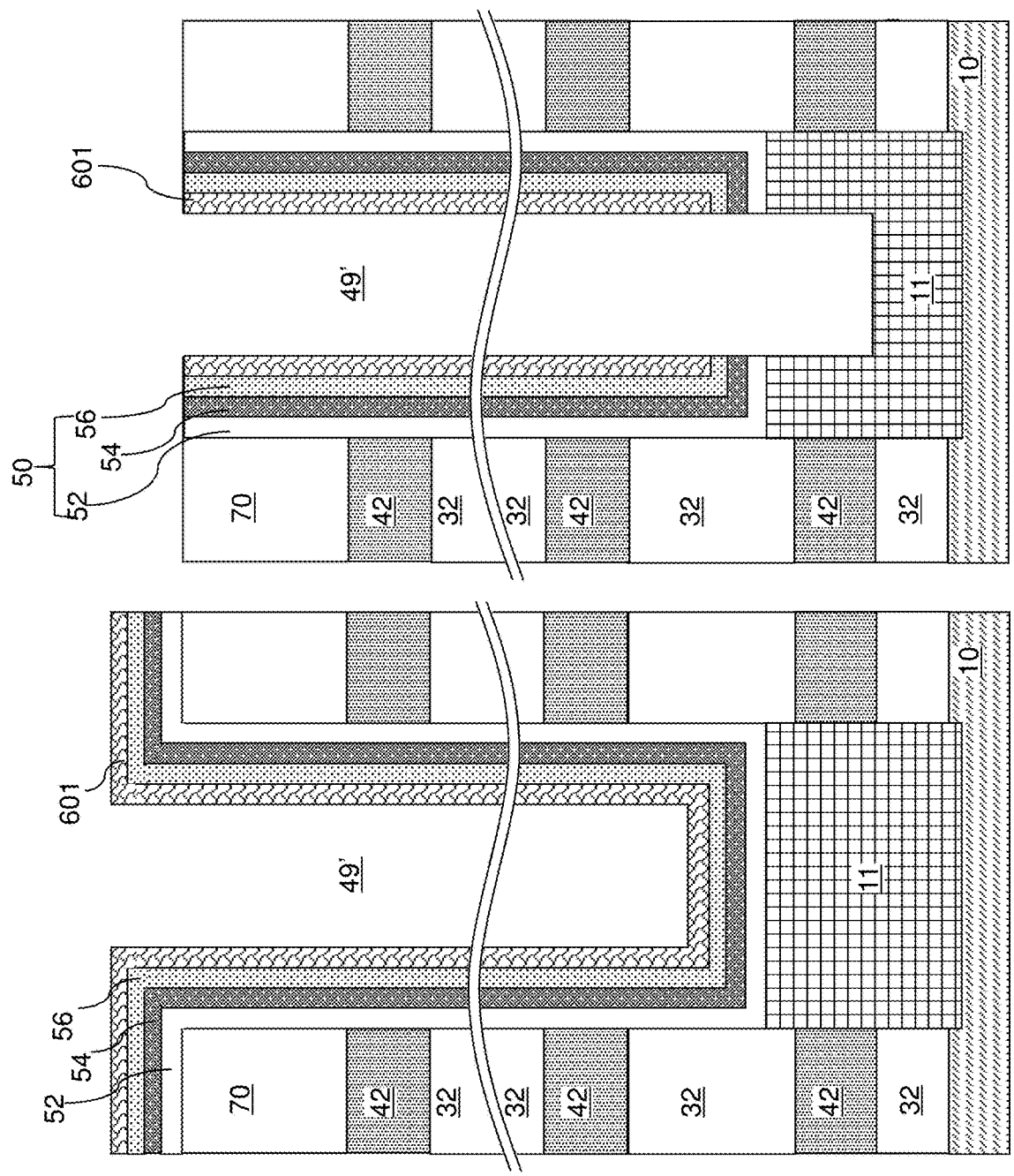

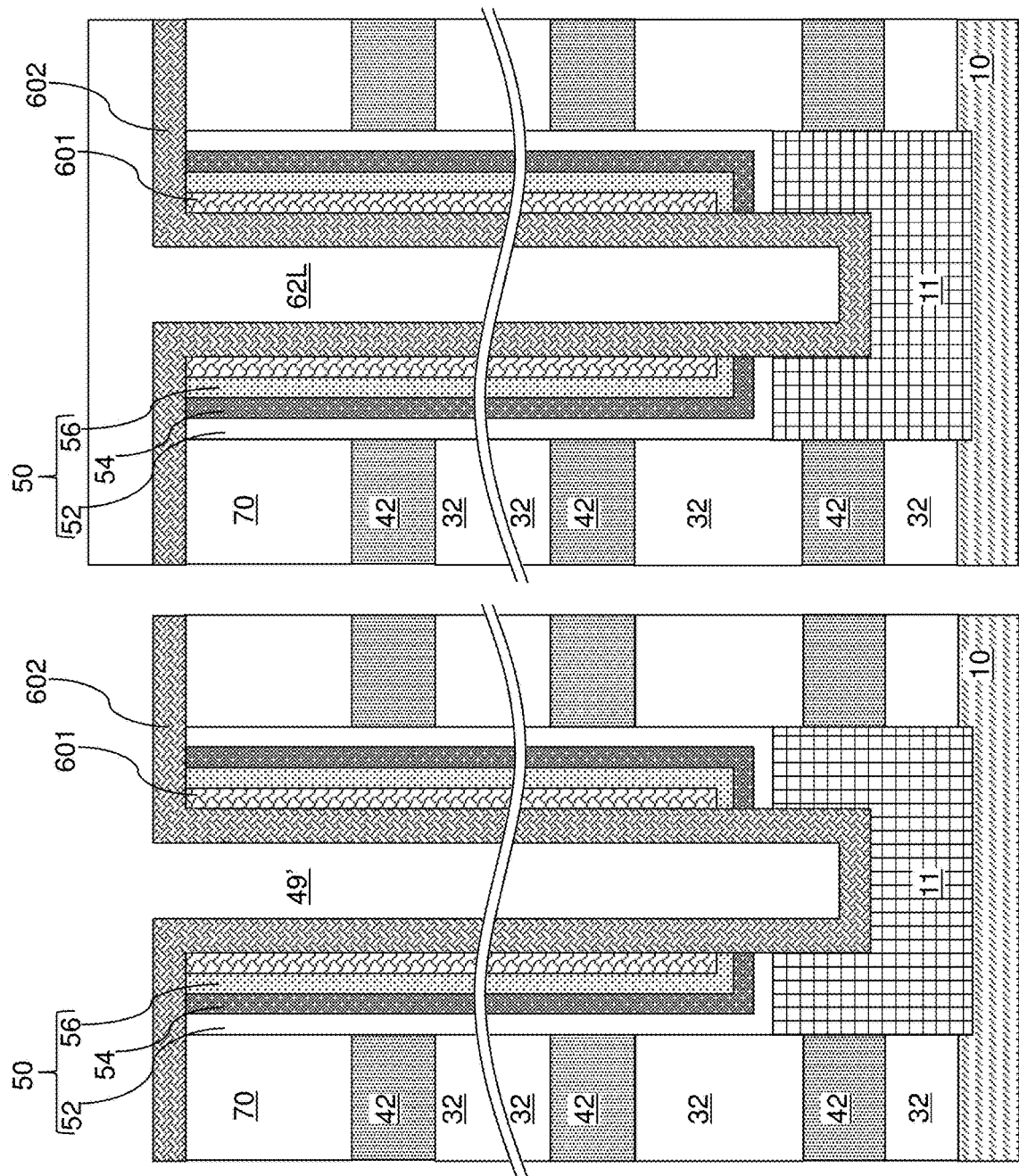

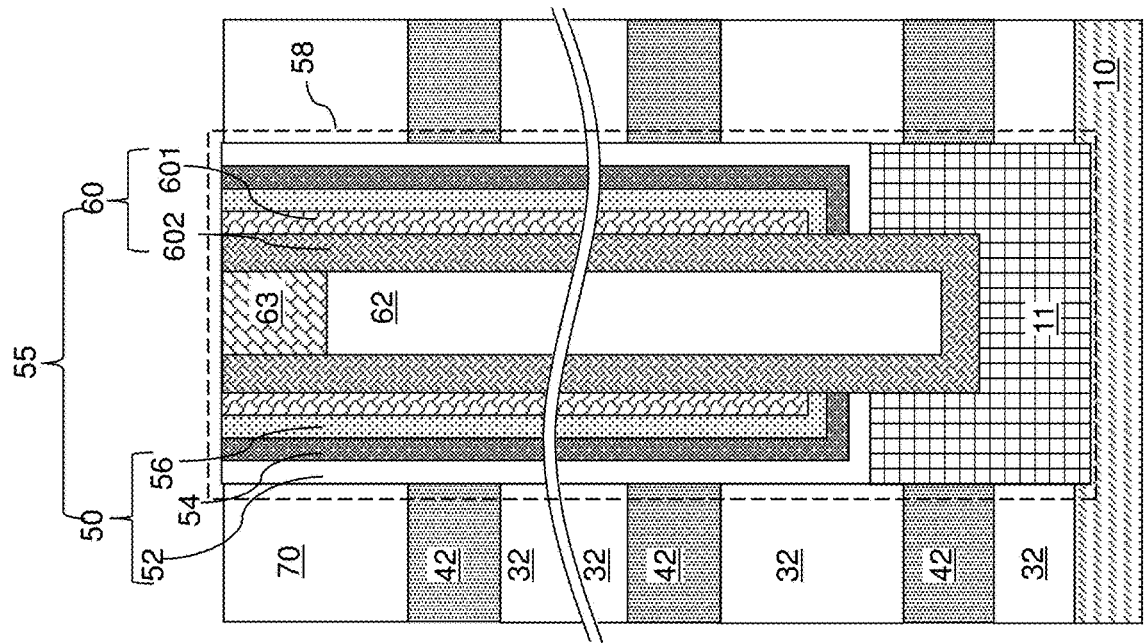
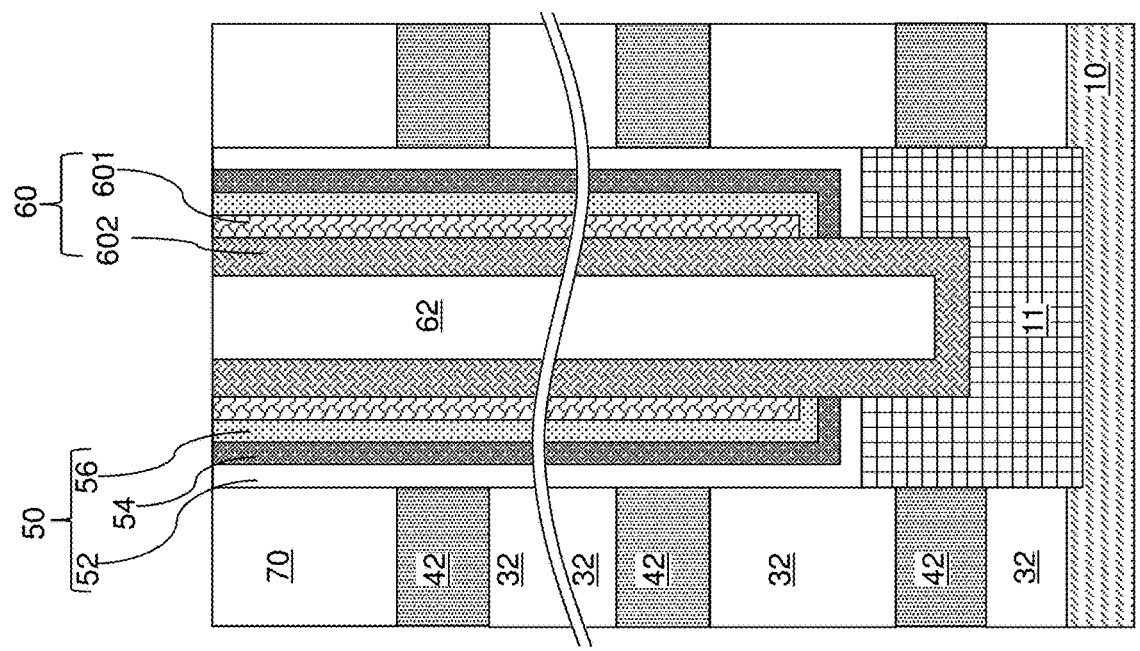

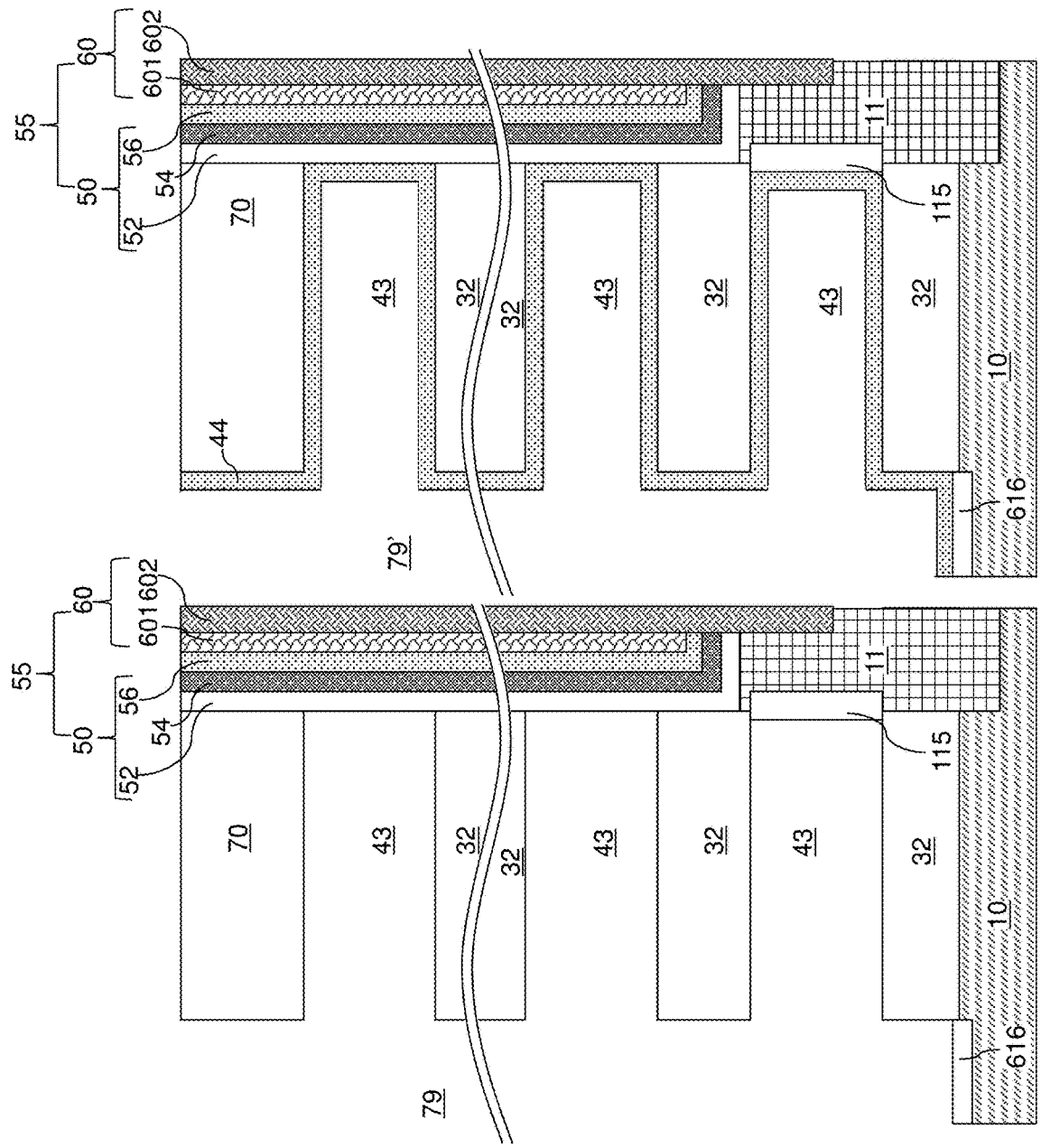

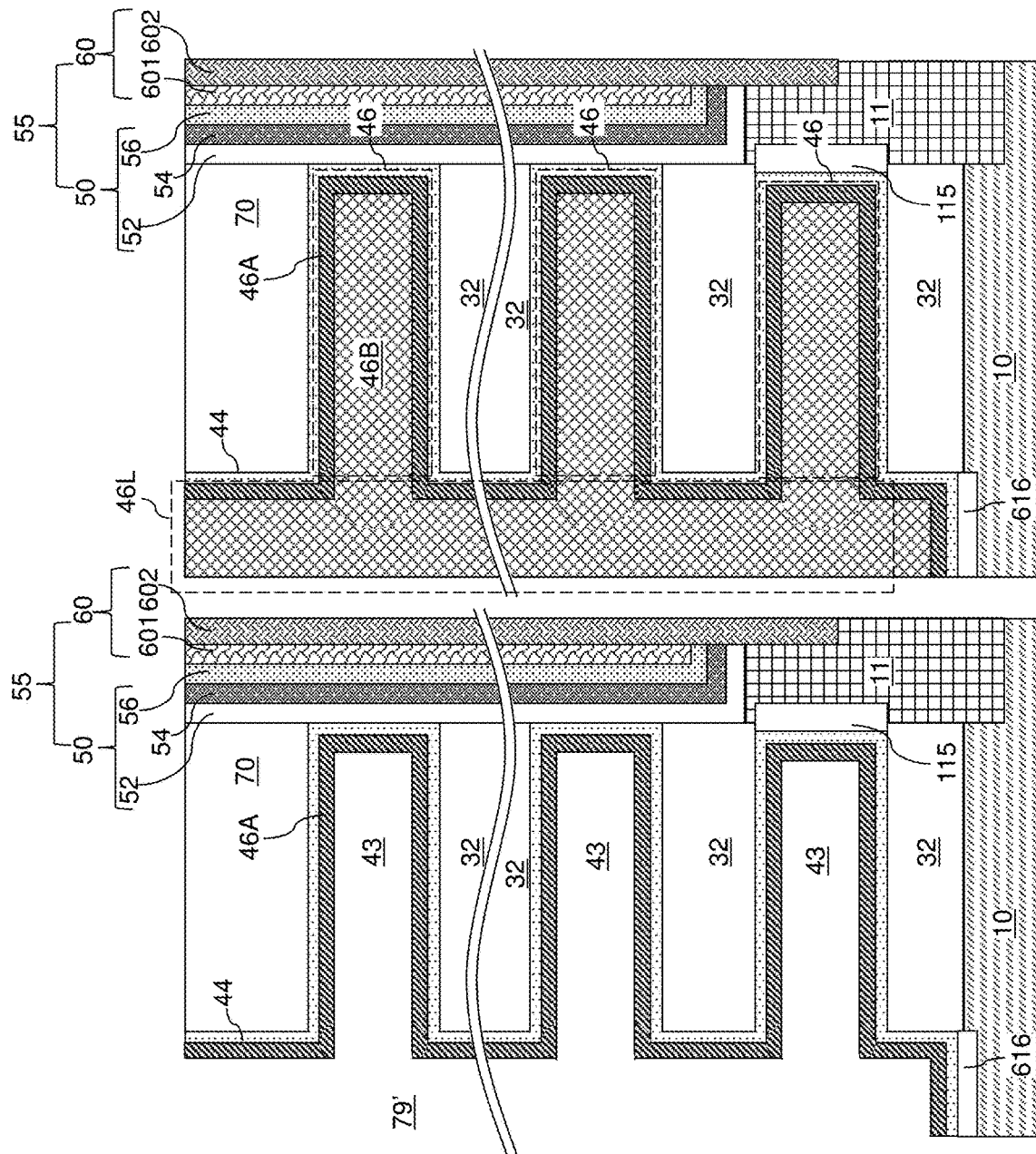

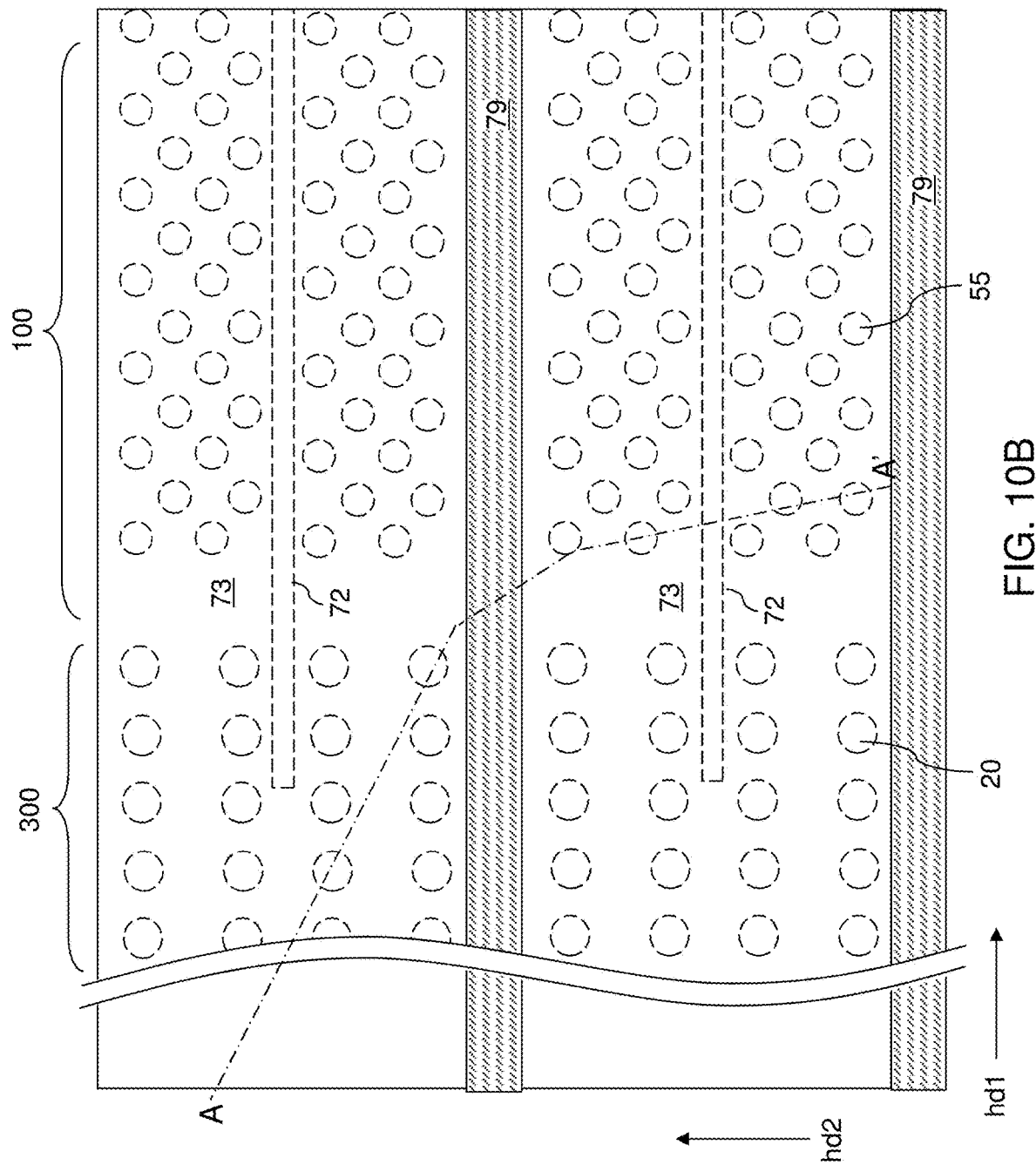

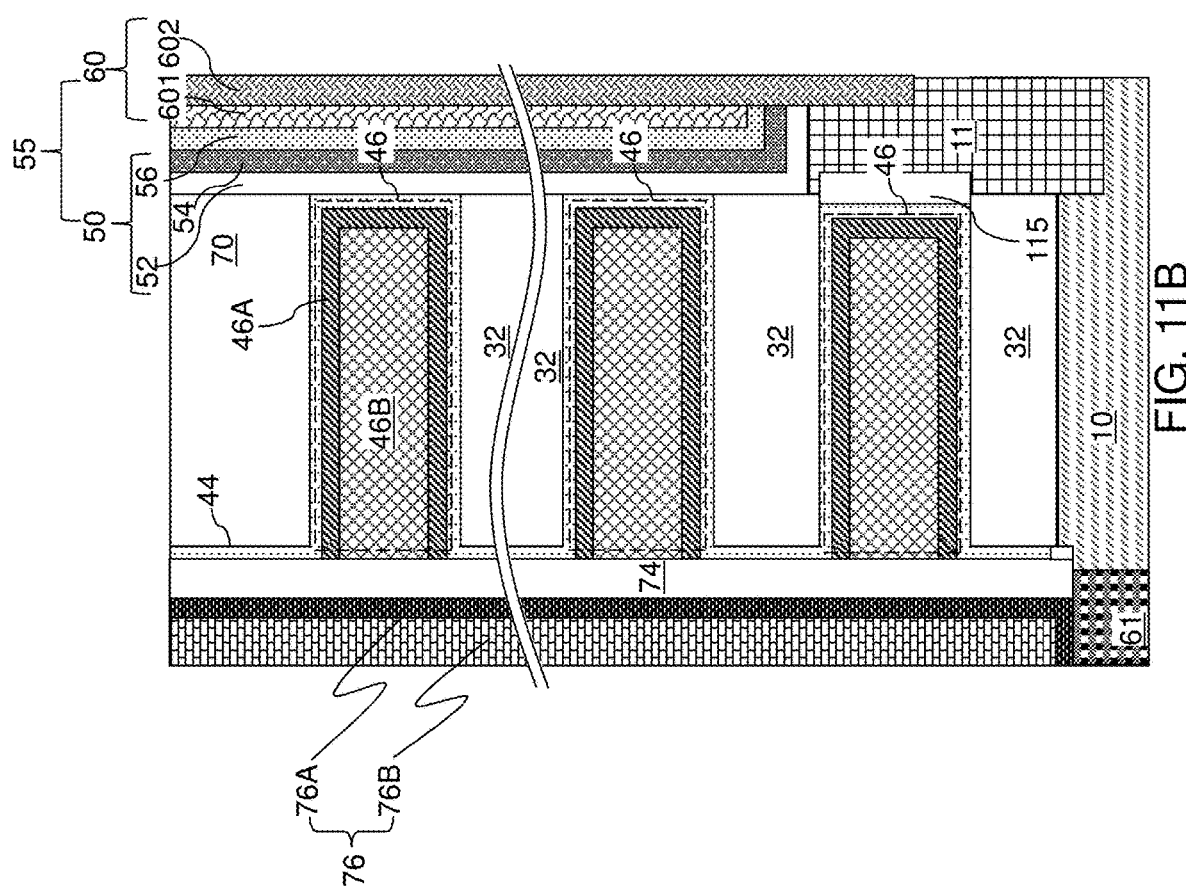

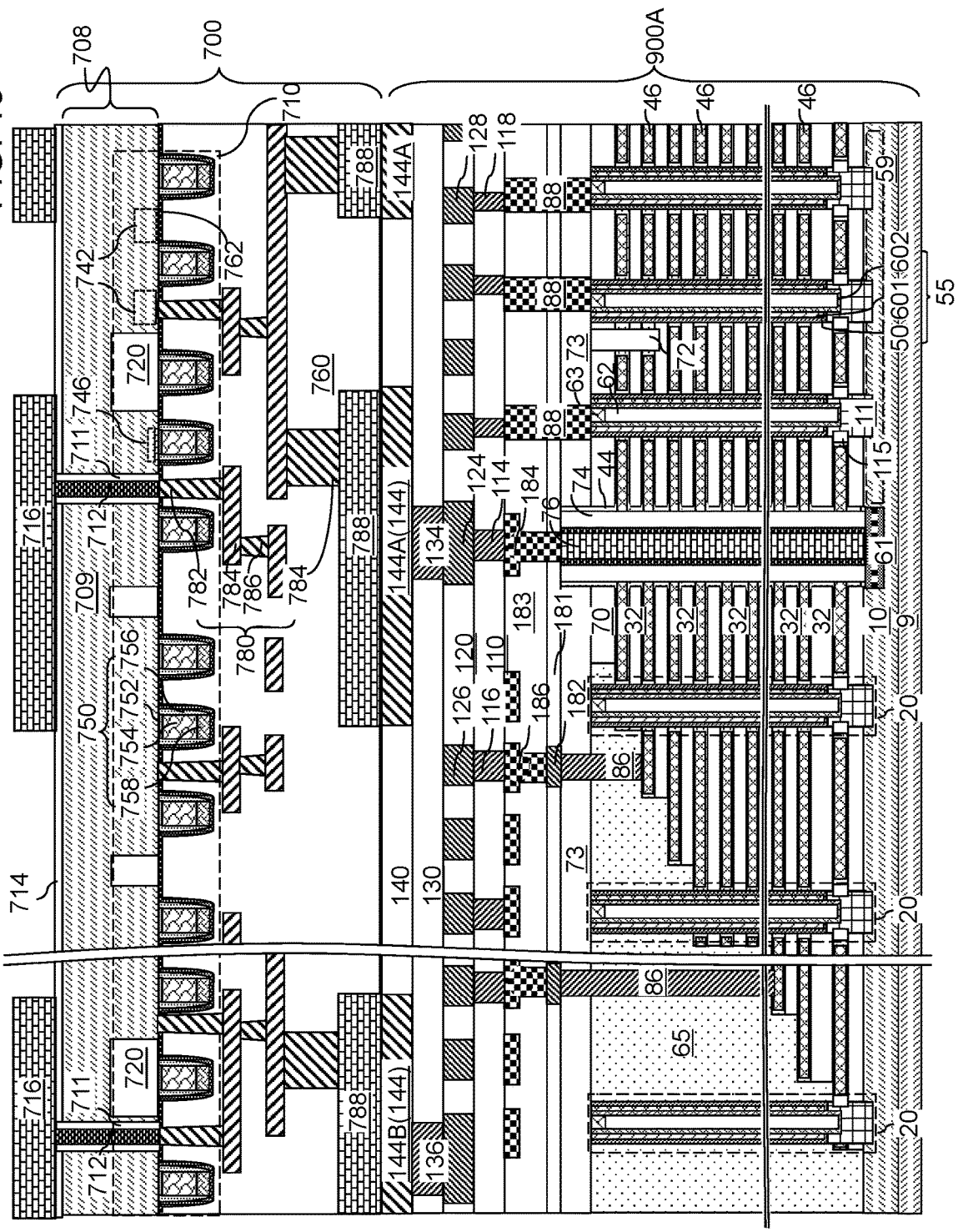

THREE-DIMENSIONAL SEMICONDUCTOR CHIP CONTAINING MEMORY DIE BONDED TO BOTH SIDES OF A SUPPORT DIE AND METHODS OF MAKING THE SAME

FIELD

The present disclosure relates generally to the field of semiconductor devices, and particular to a three-dimensional memory chip containing memory die bonded to both sides of a support die and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36. Support circuitry is used to perform write, read, and erase operations of the memory cells in the vertical NAND strings. Typically, complementary metal oxide semiconductor (CMOS) devices are formed on a same substrate as the three-dimensional memory device.

SUMMARY

According to an embodiment of the present disclosure, a bonded assembly is provided, which comprises: a support die comprising a peripheral circuitry, front support-die bonding pads electrically connected to a first subset of the peripheral circuitry, and backside bonding structures electrically connected to a second subset of the peripheral circuitry; a first memory die comprising a first three-dimensional array of memory elements and first memory-die bonding pads that are bonded to the front support-die bonding pads; and a second memory die comprising a second three-dimensional array of memory elements and second memory-die bonding pads that are bonded to the backside bonding structures.

According to another embodiment of the present disclosure, a method of forming a bonded assembly is provided, which comprises: providing a support die comprising complementary metal-oxide-semiconductor (CMOS) devices and front support-die bonding pads electrically connected to a first subset of the peripheral circuitry; bonding a first memory die comprising a first three-dimensional array of memory elements to the support die, wherein first memory-die bonding pads of the first memory die are bonded to the front support-die bonding pads; forming backside bonding structures electrically connected to a second subset of the peripheral circuitry through a semiconductor substrate of the support die; and bonding a second memory die comprising a second three-dimensional array of memory elements to the support die, wherein second memory-die bonding pads of the second memory die are bonded to the backside bonding structures

BRIEF DESCRIPTION OF THE DRAWINGS

FIGS. 4A-4H are sequential schematic vertical cross-sectional views of a memory opening within the exemplary structure during formation of a memory stack structure, an optional dielectric core, and a drain region therein according to an embodiment of the present disclosure.

FIGS. 8A-8D are sequential vertical cross-sectional views of a region of the exemplary structure during formation of electrically conductive layers according to an embodiment of the present disclosure.

FIG. 10B is a top-down view of the exemplary structure of FIG. 10A.

FIG. 11B is a magnified view of a region of the exemplary structure of FIG. 11A.

FIG. 19 is a vertical cross-sectional view of the bonded assembly after formation of backside support-die bonding pads according to an embodiment of the present disclosure.

DETAILED DESCRIPTION

Figure 1:
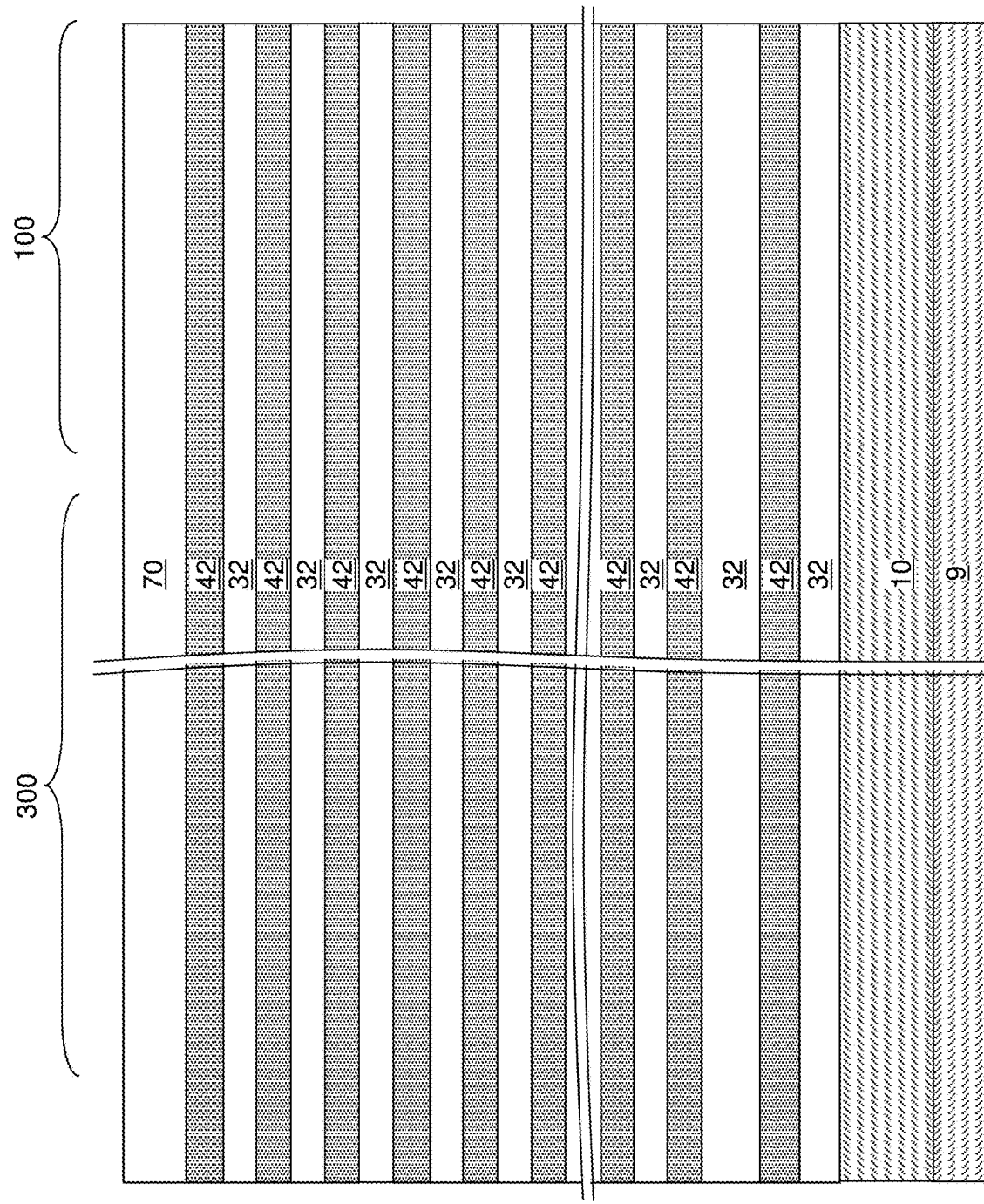
FIG. 1 is a schematic vertical cross-sectional view of an exemplary structure after formation of an alternating stack of insulating layers and sacrificial material layers according to an embodiment of the present disclosure.

Three-dimensional memory chips may include memory die containing vertical NAND strings. Support circuitry is used to perform write, read, and erase operations of the memory cells in the vertical NAND strings. Typically, complementary metal oxide semiconductor (CMOS) devices are formed on a same substrate as the three-dimensional memory device. However, degradation of peripheral circuitry due to collateral thermal cycling and hydrogen diffusion during manufacture of the three-dimensional memory device places a constraint on performance of the support circuitry which includes the peripheral circuitry. Further, the number of word lines in an alternating stack of insulating layers and word lines is limited due to constraints of the etch process used to pattern the alternating stack. Thus, the total number of word lines that may be vertically stacked is limited in a three-dimensional memory device in which the support circuitry is formed on the same substrate and the memory devices. The embodiments of the present disclosure are directed to a three-dimensional memory chip having memory die bonded to both sides of a support die and methods of manufacturing the same, the various aspects of which are described below. The embodiments of the present disclosure may be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. Three-dimensional memory devices of various embodiments of the present disclosure include monolithic three-dimensional NAND string memory devices, and may be fabricated using the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of dies therein. Each die includes one or more planes. Identical concurrent operations may be executed in each plane within a same die, although there may be some restrictions. When a die is a memory die, i.e., a die including memory elements, concurrent read operations, concurrent write operations, or concurrent erase operations may be performed in each plane within a same memory die. Each plane contains a number of memory blocks (or "blocks"), which are the smallest unit that may be erased by in a single erase operation. Each memory block contains a number of pages, which are the smallest units that may be selected for programming.

Referring to FIG. 1, an exemplary structure according to an embodiment of the present disclosure is illustrated, which may be used, for example, to fabricate a device structure containing vertical NAND memory devices. The exemplary structure includes a substrate (9, 10), which may be a semiconductor substrate. The substrate may include a substrate semiconductor layer 9 and an optional semiconductor material layer 10. The substrate semiconductor layer 9 may be a semiconductor wafer or a semiconductor material layer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A stack of an alternating plurality of first material layers (which may be insulating layers 32) and second material layers (which may be sacrificial material layer 42) may be formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer. In this case, the stack may include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) may include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 may include silicon oxide, and sacrificial material layers may include silicon nitride sacrificial material layers. The first material of the insulating layers 32 may be deposited, for example, by chemical vapor deposition (CVD). For example, if silicon oxide is used for the insulating layers 32, tetraethyl orthosilicate (TEOS) may be used as the precursor material for the CVD process. The second material of the sacrificial material layers 42 may be formed, for example, by CVD or atomic layer deposition (ALD).

The sacrificial material layers 42 may be suitably patterned so that conductive material portions to be subsequently formed by replacement of the sacrificial material layers 42 may function as electrically conductive electrodes, such as the control gate electrodes of the monolithic three-dimensional NAND string memory devices to be subsequently formed. The sacrificial material layers 42 may comprise a portion having a strip shape extending substantially parallel to a top surface of the substrate (9, 10).

The thicknesses of the insulating layers 32 and the sacrificial material layers 42 may be in a range from 20 nm to 50 nm, although lesser and greater thicknesses may be used for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions may also be used. The top and bottom gate electrodes in the stack may function as the select gate electrodes. In one embodiment, each sacrificial material layer 42 in the alternating stack (32, 42) may have a uniform thickness that is substantially invariant within each respective sacrificial material layer 42.

While the descriptions of the present disclosure use an embodiment in which the spacer material layers are sacrificial material layers 42 that are subsequently replaced with electrically conductive layers, in other embodiments the sacrificial material layers are formed as electrically conductive layers. In this case, steps for replacing the spacer material layers with electrically conductive layers may be omitted.

Optionally, an insulating cap layer 70 may be formed over the alternating stack (32, 42). The insulating cap layer 70 includes a dielectric material that is different from the material of the sacrificial material layers 42. In one embodiment, the insulating cap layer 70 may include a dielectric material that may be used for the insulating layers 32 as described above. The insulating cap layer 70 may have a greater thickness than each of the insulating layers 32. The insulating cap layer 70 may be deposited, for example, by chemical vapor deposition. In one embodiment, the insulating cap layer 70 may be a silicon oxide layer.

Figure 2A:
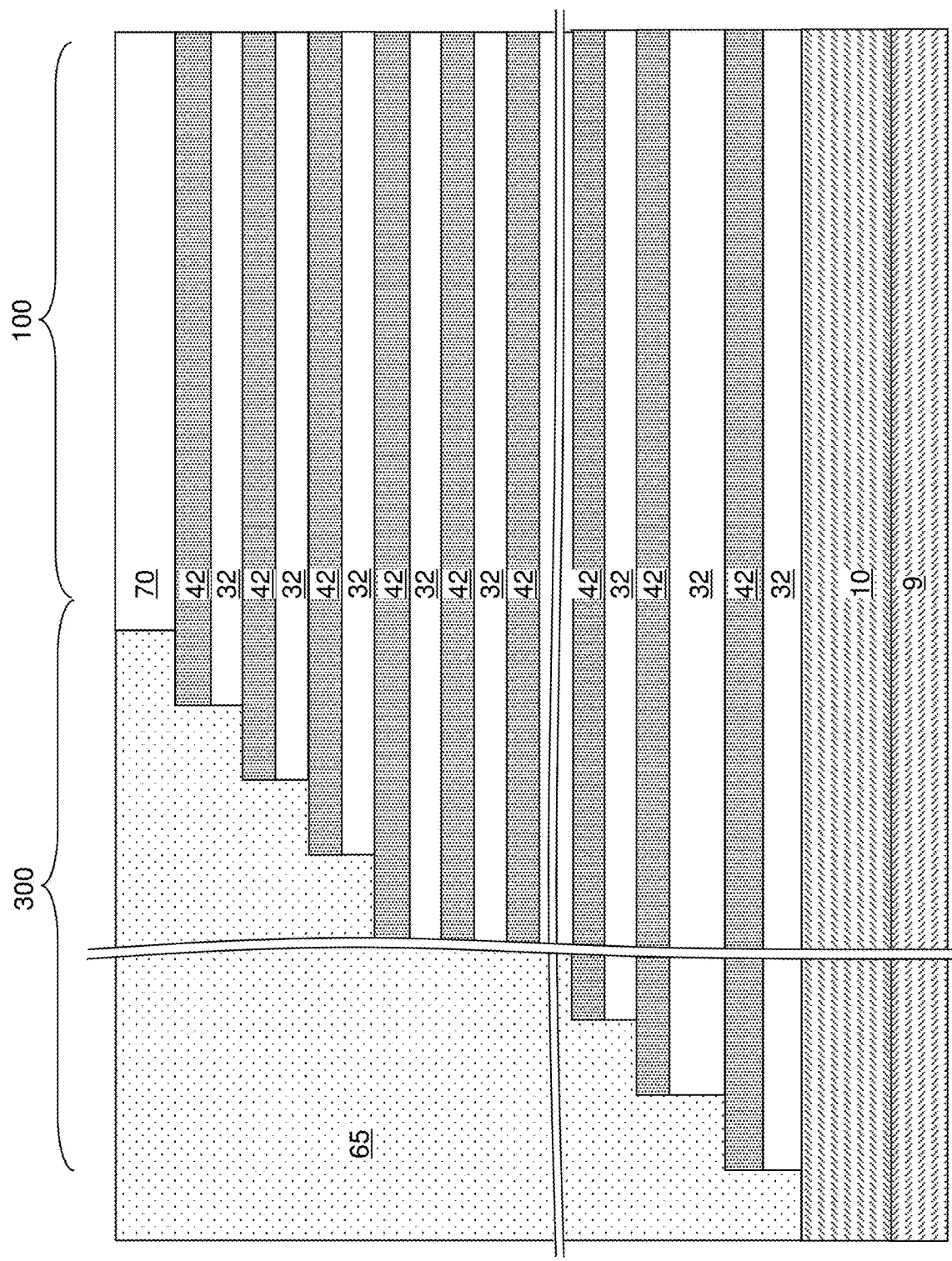
FIG. 2A is a schematic vertical cross-sectional view of the exemplary structure after formation of stepped terraces and a retro-stepped dielectric material portion according to an embodiment of the present disclosure.
Figure 2B:
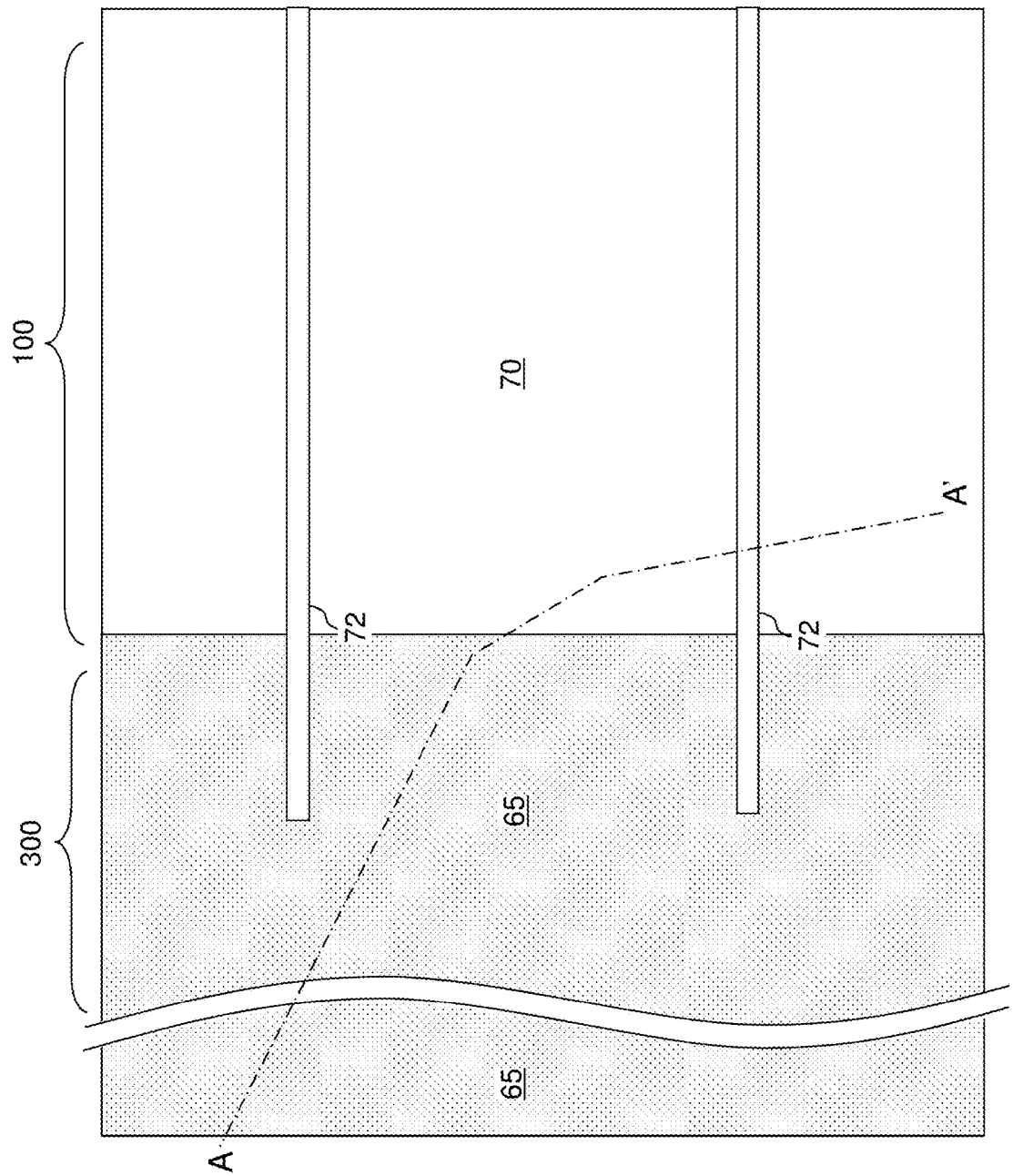
FIG. 2B is a top-down view of the exemplary structure of FIG. 2A. The vertical plane A-A' is the plane of the cross-section for FIG. 2A.

Referring to FIGS. 2A and 2B, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located adjacent to the memory array region 100. The stepped cavity may have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces may have the height of one or more pairs of an insulating layer 32 and a sacrificial material layer. In one embodiment, each vertical step may have the height of a single pair of an insulating layer 32 and a sacrificial material layer 42. In another embodiment, multiple "columns" of staircases may be formed along a first horizontal direction hd1 such that each vertical step has the height of a plurality of pairs of an insulating layer 32 and a sacrificial material layer 42, and the number of columns may be at least the number of the plurality of pairs. Each column of staircase may be vertically offset one from another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets formed along the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Optionally, drain-select-level isolation structures 72 may be formed through the insulating cap layer 70 and a subset of the sacrificial material layers 42 located at drain-select-levels. The drain-select-level isolation structures 72 may be formed, for example, by forming drain-select-level isolation trenches and filling the drain-select-level isolation trenches with a dielectric material such as silicon oxide. Excess portions of the dielectric material may be removed from above the top surface of the insulating cap layer 70.

Figure 3A:
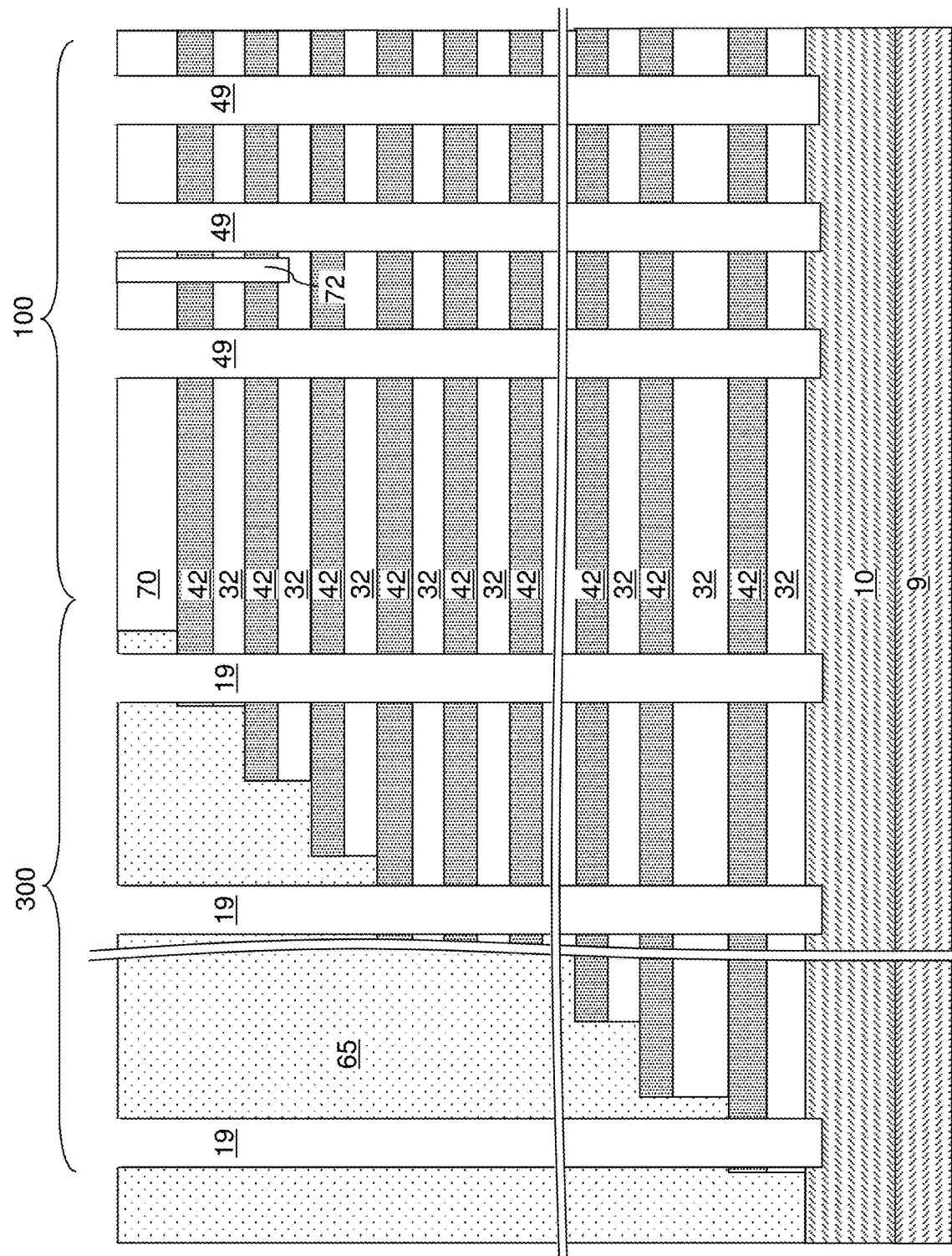
FIG. 3A is a schematic vertical cross-sectional view of the exemplary structure after formation of memory openings and support openings according to an embodiment of the present disclosure.
Figure 3B:
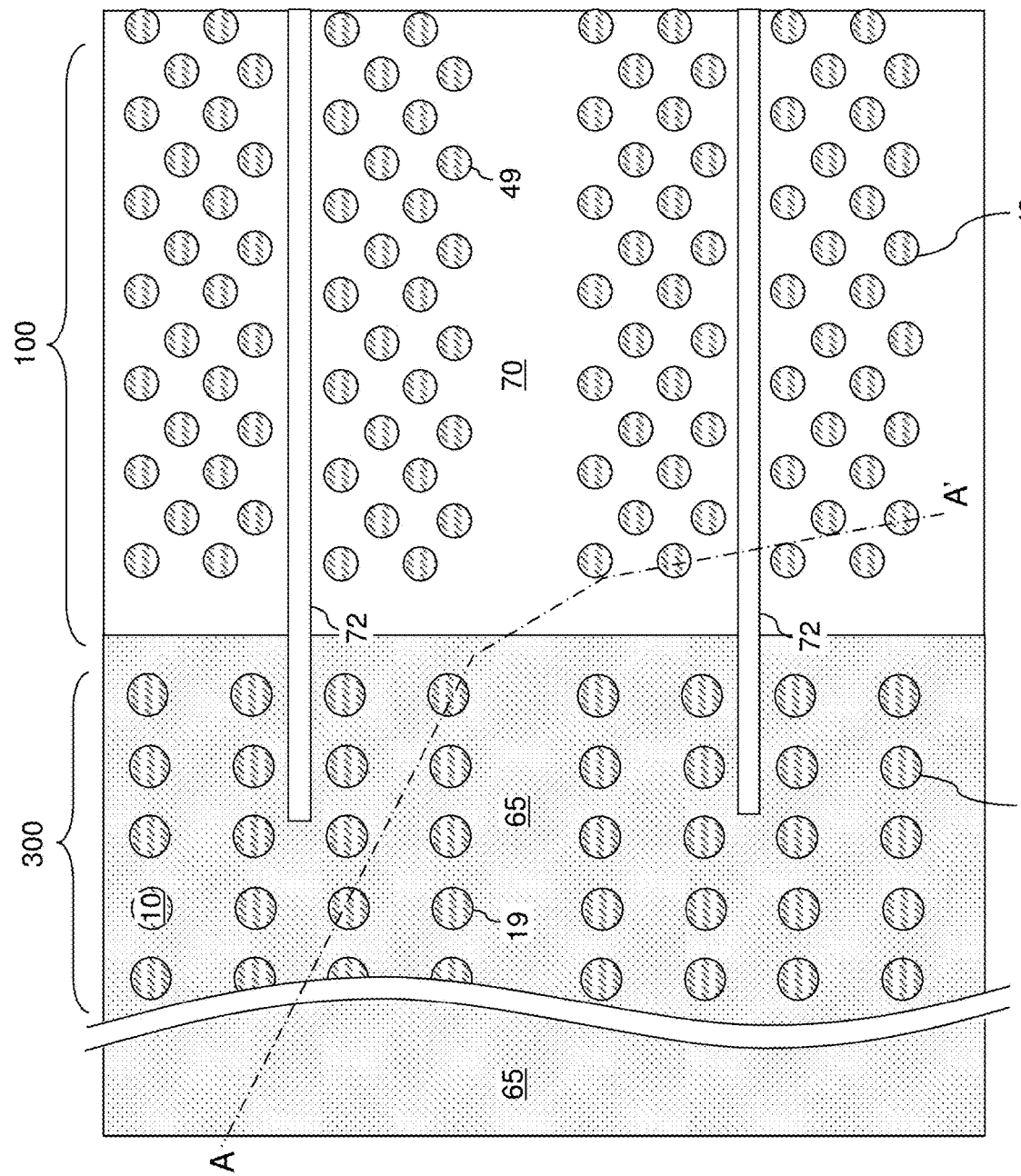
FIG. 3B is a top-down view of the exemplary structure of FIG. 3A. The vertical plane A-A' is the plane of the cross-section for FIG. 3A.

Referring to FIGS. 3A and 3B, a lithographic material stack (not shown) including at least a photoresist layer may be formed over the insulating cap layer 70 and the retro-stepped dielectric material portion 65, and may be lithographically patterned to form openings therein. The openings include a first set of openings formed over the memory array region 100 and a second set of openings formed over the staircase region 300. The pattern in the lithographic material stack may be transferred through the insulating cap layer 70 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) may alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be used. The overetch (as shown in the figures) is optional, and may be omitted. If the overetch is not performed, the bottom surfaces of the memory openings 49 and the support openings 19 may be coplanar with the topmost surface of the semiconductor material layer 10 (not shown).

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100. A two-dimensional array of support openings 19 may be formed in the staircase region 300. The substrate semiconductor layer 9 and the semiconductor material layer 10 collectively constitutes a substrate (9, 10), which may be a semiconductor substrate. Alternatively, the semiconductor material layer 10 may be omitted, and the memory openings 49 and the support openings 19 may be extend to a top surface of the substrate semiconductor layer 9.

FIGS. 4A-4H illustrate structural changes in a memory opening 49, which is one of the memory openings 49 in the exemplary structure of FIGS. 3A and 3B. The same structural change occurs simultaneously in each of the other memory openings 49 and in each support opening 19.

Referring to FIG. 4A, a memory opening 49 in the exemplary device structure of FIGS. 3A and 3B is illustrated. The memory opening 49 extends through the insulating cap layer 70, the alternating stack (32, 42), and optionally into an upper portion of the semiconductor material layer 10. At this processing step, each support opening 19 may extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 may be in a range from 0 nm to 30 nm, although greater recess depths may also be used. Optionally, the sacrificial material layers 42 may be laterally recessed partially to form lateral recesses (not shown), for example, by an isotropic etch.

Referring to FIG. 4B, an optional pedestal channel portion (e.g., an epitaxial pedestal) 11 may be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 may be doped with electrical dopants of the same conductivity type as the semiconductor material layer 10. In one embodiment, the top surface of each pedestal channel portion 11 may be formed above a horizontal plane including the top surface of a sacrificial material layer 42. In this case, at least one source select gate electrode may be subsequently formed by replacing each sacrificial material layer 42 located below the horizontal plane including the top surfaces of the pedestal channel portions 11 with a respective conductive material layer. The pedestal channel portion 11 may be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 may comprise single crystalline silicon. In one embodiment, the pedestal channel portion 11 may have a doping of the first conductivity type, which is the same as the conductivity type of the semiconductor material layer 10 that the pedestal channel portion contacts. If a semiconductor material layer 10 is not present, the pedestal channel portion 11 may be formed directly on the substrate semiconductor layer 9, which may have a doping of the first conductivity type.

Referring to FIG. 4C, a stack of layers including a blocking dielectric layer 52, a charge storage layer 54, a tunneling dielectric 56, and an optional first semiconductor channel layer 601 may be sequentially deposited in the memory openings 49.

The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer may be deposited, for example, by chemical vapor deposition (CVD), atomic layer deposition (ALD), pulsed laser deposition (PLD), liquid source misted chemical deposition, or a combination thereof. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. In one embodiment, the blocking dielectric layer 52 may include multiple dielectric metal oxide layers having different material compositions.

Alternatively or additionally, the blocking dielectric layer 52 may include a dielectric semiconductor compound such as silicon oxide, silicon oxynitride, silicon nitride, or a combination thereof. In one embodiment, the blocking dielectric layer 52 may include silicon oxide. In this case, the dielectric semiconductor compound of the blocking dielectric layer 52 may be formed by a conformal deposition method such as low pressure chemical vapor deposition, atomic layer deposition, or a combination thereof. The thickness of the dielectric semiconductor compound may be in a range from 1 nm to 20 nm, although lesser and greater thicknesses may also be used. Alternatively, the blocking dielectric layer 52 may be omitted, and a backside blocking dielectric layer may be formed after formation of backside recesses on surfaces of memory films to be subsequently formed.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 may have vertically coincident sidewalls, and the charge storage layer 54 may be formed as a single continuous layer.

In another embodiment, the sacrificial material layers 42 may be laterally recessed with respect to the sidewalls of the insulating layers 32, and a combination of a deposition process and an anisotropic etch process may be used to form the charge storage layer 54 as a plurality of memory material portions that are vertically spaced apart. While the descriptions in the present disclosure use an embodiment in which the charge storage layer 54 is a single continuous layer, in other embodiments the charge storage layer 54 is replaced with a plurality of memory material portions (which may be charge trapping material portions or electrically isolated conductive material portions) that are vertically spaced apart.

The charge storage layer 54 may be formed as a single charge storage layer of homogeneous composition, or may include a stack of multiple charge storage layers. The multiple charge storage layers, if used, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which may be, for example, ruthenium nanoparticles. The charge storage layer 54 may be formed, for example, by chemical vapor deposition (CVD), atomic layer deposition (ALD), physical vapor deposition (PVD), or any suitable deposition technique for storing electrical charges therein. The thickness of the charge storage layer 54 may be in a range from 2 nm to 20 nm, although lesser and greater thicknesses may also be used.

The tunneling dielectric 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric 56 may include a stack of a first silicon oxide layer, a silicon oxynitride layer, and a second silicon oxide layer, which is commonly known as an ONO stack. In one embodiment, the tunneling dielectric 56 may include a silicon oxide layer that is substantially free of carbon or a silicon oxynitride layer that is substantially free of carbon. The thickness of the tunneling dielectric 56 may be in a range from 2 nm to 20 nm, although lesser and greater thicknesses may also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 may be formed by a conformal deposition method such as low pressure chemical vapor deposition (LPCVD). The thickness of the first semiconductor channel layer 601 may be in a range from 2 nm to 10 nm, although lesser and greater thicknesses may also be used. A memory cavity 49' is formed in the volume of each memory opening 49 that is not filled with the deposited material layers (52, 54, 56, 601).

Referring to FIG. 4D, the optional first semiconductor channel layer 601, the tunneling dielectric 56, the charge storage layer 54, the blocking dielectric layer 52 are sequentially anisotropically etched using at least one anisotropic etch process. The portions of the first semiconductor channel layer 601, the tunneling dielectric 56, the charge storage layer 54, and the blocking dielectric layer 52 located above the top surface of the insulating cap layer 70 may be removed by the at least one anisotropic etch process. Further, the horizontal portions of the first semiconductor channel layer 601, the tunneling dielectric 56, the charge storage layer 54, and the blocking dielectric layer 52 at a bottom of each memory cavity 49' may be removed to form openings in remaining portions thereof. Each of the first semiconductor channel layer 601, the tunneling dielectric 56, the charge storage layer 54, and the blocking dielectric layer 52 may be etched by a respective anisotropic etch process using a respective etch chemistry, which may, or may not, be the same for the various material layers.

Each remaining portion of the first semiconductor channel layer 601 may have a tubular configuration. The charge storage layer 54 may comprise a charge trapping material or a floating gate material. In one embodiment, each charge storage layer 54 may include a vertical stack of charge storage regions that store electrical charges upon programming. In one embodiment, the charge storage layer 54 may be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not used) may be physically exposed underneath the opening through the first semiconductor channel layer 601, the tunneling dielectric 56, the charge storage layer 54, and the blocking dielectric layer 52. Optionally, the physically exposed semiconductor surface at the bottom of each memory cavity 49' may be vertically recessed so that the recessed semiconductor surface underneath the memory cavity 49' is vertically offset from the topmost surface of the pedestal channel portion 11 (or of the semiconductor material layer 10 in case pedestal channel portions 11 are not used) by a recess distance. A tunneling dielectric 56 is located over the charge storage layer 54. A set of a blocking dielectric layer 52, a charge storage layer 54, and a tunneling dielectric 56 in a memory opening 49 constitutes a memory film 50, which includes a plurality of charge storage regions (comprising the charge storage layer 54) that are insulated from surrounding materials by the blocking dielectric layer 52 and the tunneling dielectric 56. In one embodiment, the first semiconductor channel layer 601, the tunneling dielectric 56, the charge storage layer 54, and the blocking dielectric layer 52 may have vertically coincident sidewalls.

Referring to FIG. 4E, a second semiconductor channel layer 602 may be deposited directly on the semiconductor surface of the pedestal channel portion 11 or the semiconductor material layer 10 if the pedestal channel portion 11 is optionally omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 may be formed by a conformal deposition method such as low pressure chemical vapor deposition (LPCVD). The thickness of the second semiconductor channel layer 602 may be in a range from 2 nm to 10 nm, although lesser and greater thicknesses may also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 4F, in case the memory cavity 49' in each memory opening is not completely filled by the second semiconductor channel layer 602, a dielectric core layer 62L may be deposited in the memory cavity 49' to fill any remaining portion of the memory cavity 49' within each memory opening. The dielectric core layer 62L includes a dielectric material such as silicon oxide or organosilicate glass. The dielectric core layer 62L may be deposited by a conformal deposition method such as low pressure chemical vapor deposition (LPCVD), or by a self-planarizing deposition process such as spin coating.

Referring to FIG. 4G, the horizontal portion of the dielectric core layer 62L may be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 may be removed by a planarization process, which may use a recess etch or chemical mechanical planarization (CMP). Each remaining portion of the second semiconductor channel layer 602 may be located entirely within a memory opening 49 or entirely within a support opening 19.

Each adjoining pair of a first semiconductor channel layer 601 and a second semiconductor channel layer 602 may collectively form a vertical semiconductor channel 60 through which electrical current may flow when a vertical NAND device including the vertical semiconductor channel 60 is turned on. A tunneling dielectric 56 is surrounded by a charge storage layer 54, and laterally surrounds a portion of the vertical semiconductor channel 60. Each adjoining set of a blocking dielectric layer 52, a charge storage layer 54, and a tunneling dielectric 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 4H, the top surface of each dielectric core 62 may be further recessed within each memory opening, for example, by a recess etch to a depth that is located between the top surface of the insulating cap layer 70 and the bottom surface of the insulating cap layer 70. Drain regions 63 may be formed by depositing a doped semiconductor material within each recessed region above the dielectric cores 62. The drain regions 63 may have a doping of a second conductivity type that is the opposite of the first conductivity type. For example, if the first conductivity type is p-type, the second conductivity type is n-type, and vice versa. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon. Excess portions of the deposited semiconductor material may be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 5:
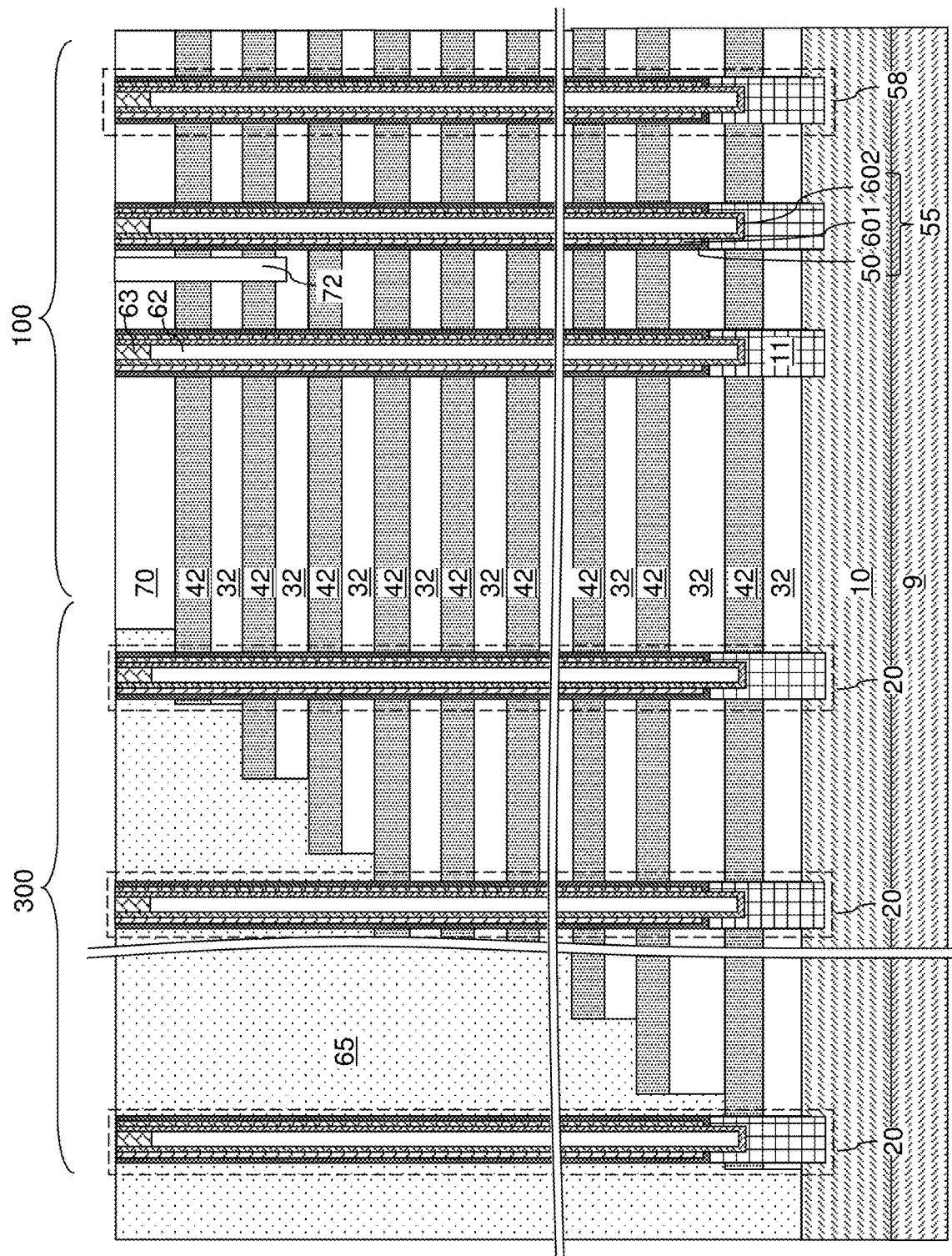
FIG. 5 is a schematic vertical cross-sectional view of the exemplary structure after formation of memory stack structures and support pillar structures according to an embodiment of the present disclosure.

Referring to FIG. 5, the exemplary structure is illustrated after formation of memory opening fill structures 58 and support pillar structure 20 within the memory openings 49 and the support openings 19, respectively. An instance of a memory opening fill structure 58 may be formed within each memory opening 49 of the structure of FIGS. 4A and 4B. An instance of the support pillar structure 20 may be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric 56 laterally surrounding the vertical semiconductor channel 60 and a vertical stack of charge storage regions laterally surrounding the tunneling dielectric 56 (comprising a charge storage layer 54) and an optional blocking dielectric layer 52. While the descriptions in present disclosure use the illustrated configuration for the memory stack structure, the methods of various embodiments of the present disclosure may be applied to alternative memory stack structures including different layer stacks or structures for the memory film 50 and/or for the vertical semiconductor channel 60.

Figure 6A:
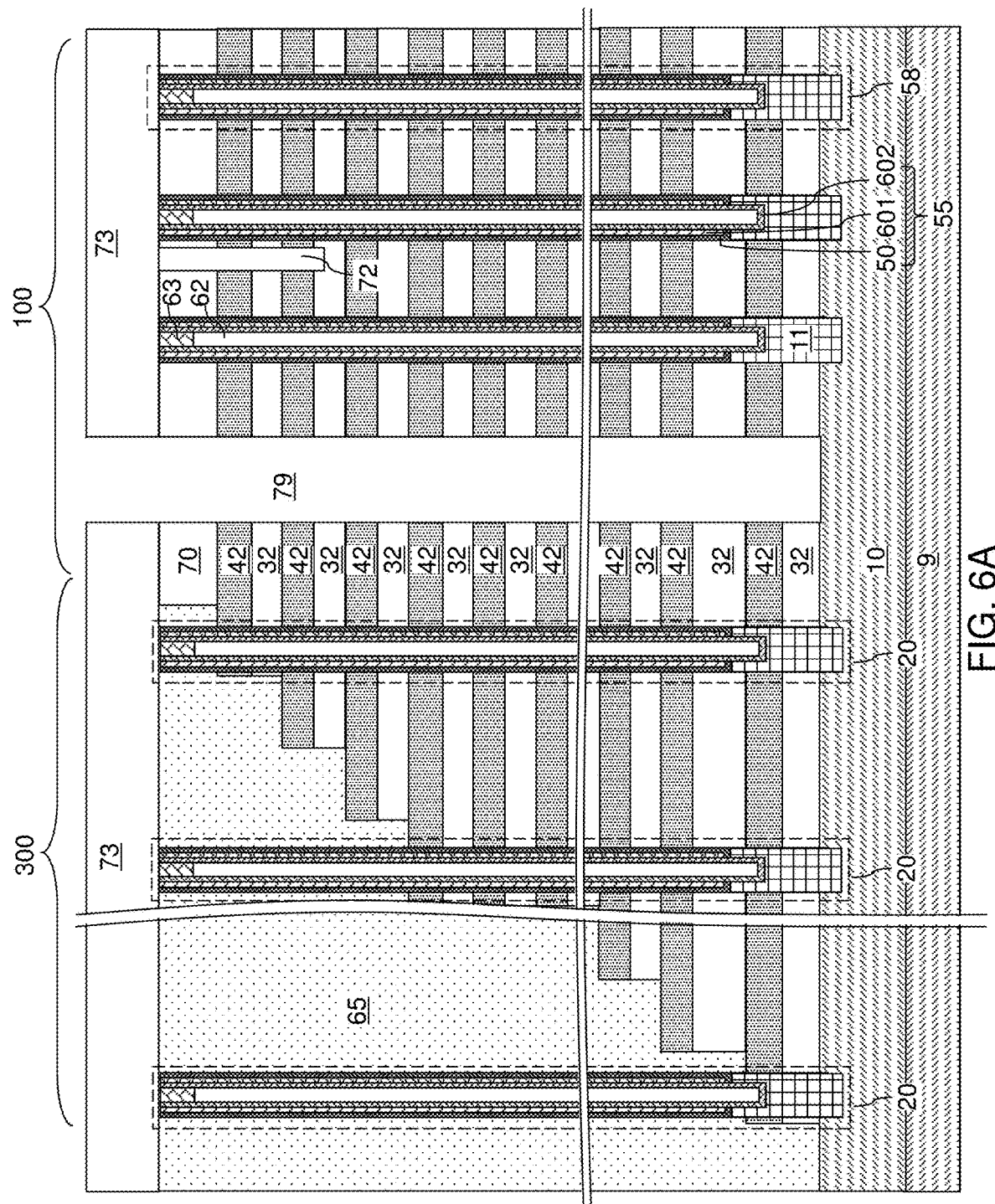
FIG. 6A is a schematic vertical cross-sectional view of the exemplary structure after formation of backside trenches according to an embodiment of the present disclosure.
Figure 6B:
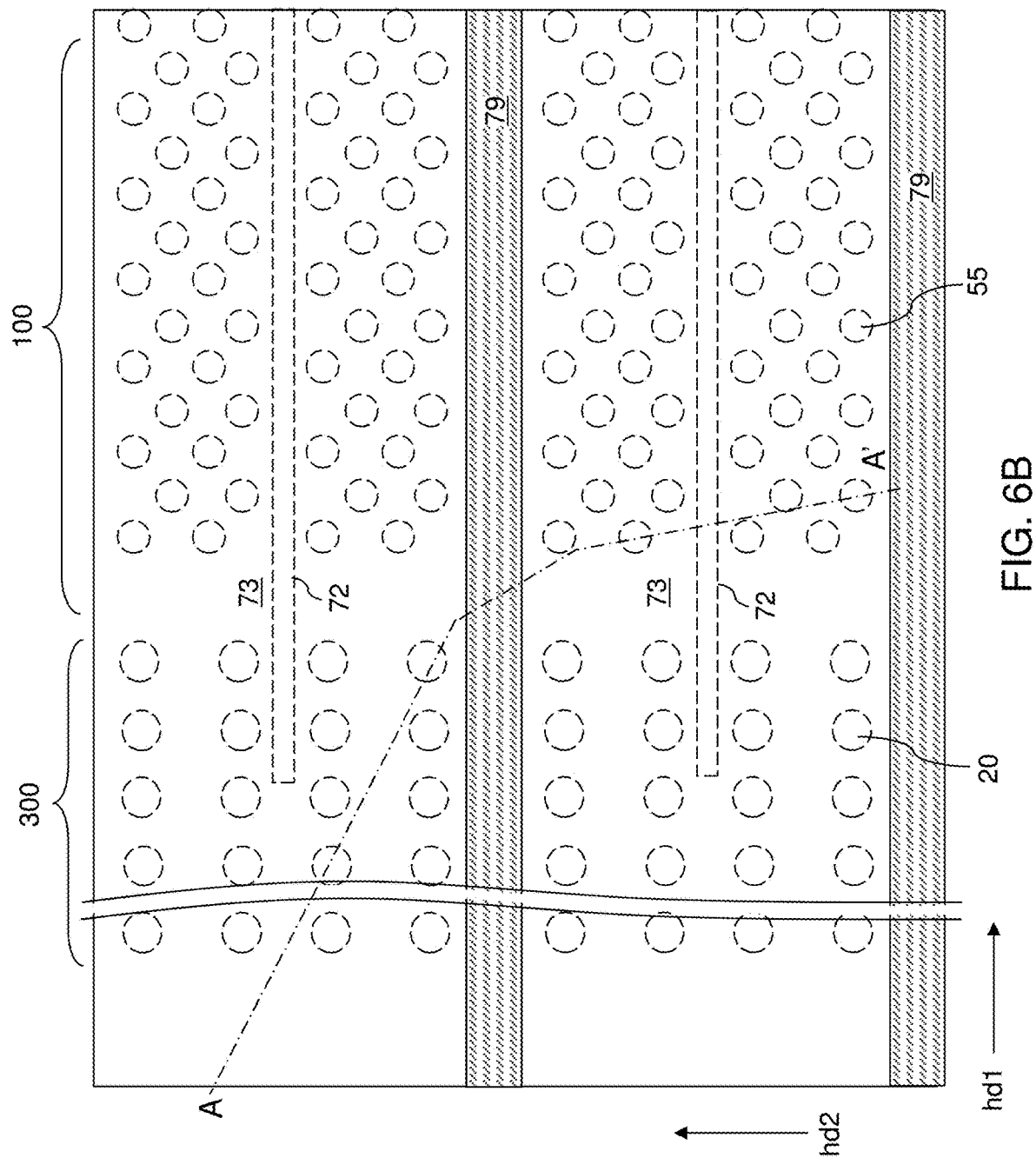
FIG. 6B is a partial see-through top-down view of the exemplary structure of FIG. 6A. The vertical plane A-A' is the plane of the schematic vertical cross-sectional view of FIG. 6A.

Referring to FIGS. 6A and 6B, a lower contact level dielectric layer 73 may be formed over the alternating stack (32, 42) of insulating layer 32 and sacrificial material layers 42, and over the memory stack structures 55 and the support pillar structures 20. The lower contact level dielectric layer 73 includes a dielectric material that is different from the dielectric material of the sacrificial material layers 42. For example, the lower contact level dielectric layer 73 may include silicon oxide. The lower contact level dielectric layer 73 may have a thickness in a range from 50 nm to 500 nm, although lesser and greater thicknesses may also be used.

A photoresist layer (not shown) may be applied over the lower contact level dielectric layer 73, and is lithographically patterned to form openings in areas between clusters of memory stack structures 55. The pattern in the photoresist layer may be transferred through the lower contact level dielectric layer 73, the alternating stack (32, 42) and/or the retro-stepped dielectric material portion 65 using an anisotropic etch to form backside trenches 79, which vertically extend from the top surface of the lower contact level dielectric layer 73 at least to the top surface of the substrate (9, 10), and laterally extend through the memory array region 100 and the staircase region 300.

In one embodiment, the backside trenches 79 may laterally extend along a first horizontal direction hd1 and may be laterally spaced apart one from another along a second horizontal direction hd2 that is perpendicular to the first horizontal direction hd1. The memory stack structures 55 may be arranged in rows that extend along the first horizontal direction hd1. The drain-select-level isolation structures 72 may laterally extend along the first horizontal direction hd1. Each backside trench 79 may have a uniform width that is invariant along the lengthwise direction (i.e., along the first horizontal direction hd1). Each drain-select-level isolation structure 72 may have a uniform vertical cross-sectional profile along vertical planes that are perpendicular to the first horizontal direction hd1 that is invariant with translation along the first horizontal direction hd1. Multiple rows of memory stack structures 55 may be located between a neighboring pair of a backside trench 79 and a drain-select-level isolation structure 72, or between a neighboring pair of drain-select-level isolation structures 72. In one embodiment, the backside trenches 79 may include a source contact opening in which a source contact structure may be subsequently formed. The photoresist layer may be removed, for example, by ashing.

Figure 7:
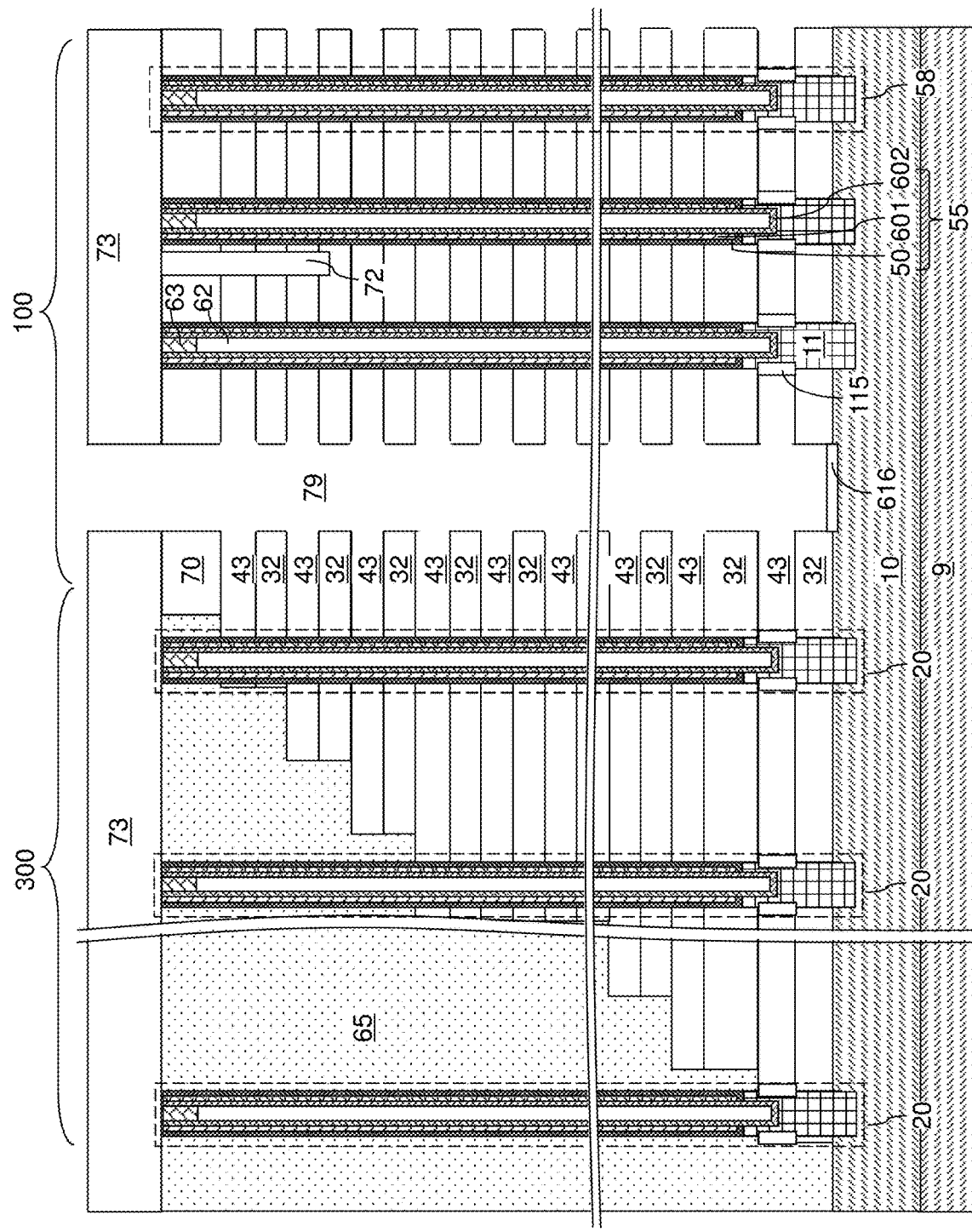
FIG. 7 is a schematic vertical cross-sectional view of the exemplary structure after formation of backside recesses according to an embodiment of the present disclosure.

Referring to FIGS. 7 and 8A, an etchant that selectively etches the second material of the sacrificial material layers 42 with respect to the first material of the insulating layers 32 may be introduced into the backside trenches 79, for example, using an etch process. FIG. 9A illustrates a region of the exemplary structure of FIG. 8. Backside recesses 43 are formed in volumes from which the sacrificial material layers 42 are removed. The removal of the second material of the sacrificial material layers 42 may be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 may include silicon nitride, and the materials of the insulating layers 32 and the retro-stepped dielectric material portion 65 may be selected from silicon oxide and dielectric metal oxides.

The etch process that removes the second material selective to the first material and the outermost layer of the memory films 50 may be a wet etch process using a wet etch solution, or may be a gas phase (dry) etch process in which the etchant is introduced in a vapor phase into the backside trenches 79. For example, if the sacrificial material layers 42 include silicon nitride, the etch process may be a wet etch process in which the exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 may define a space for receiving a respective word line of the array of monolithic three-dimensional NAND strings.

Each of the plurality of backside recesses 43 may extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 may have a uniform height throughout.

Physically exposed surface portions of the optional pedestal channel portions 11 and the semiconductor material layer 10 may be converted into dielectric material portions by thermal conversion and/or plasma conversion of the semiconductor materials into dielectric materials. For example, thermal conversion and/or plasma conversion may be used to convert a surface portion of each pedestal channel portion 11 into a tubular dielectric spacer 115, and to convert each physically exposed surface portion of the semiconductor material layer 10 into a planar dielectric portion 616. In one embodiment, each tubular dielectric spacer 115 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 115 include a dielectric material that includes the same semiconductor element as the pedestal channel portions 11 and additionally includes at least one non-metallic element such as oxygen and/or nitrogen such that the material of the tubular dielectric spacers 115 is a dielectric material. In one embodiment, the tubular dielectric spacers 115 may include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Referring to FIG. 8B, a backside blocking dielectric layer 44 may be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 may be formed in the backside recesses 43 and on a sidewall of the backside trench 79. The backside blocking dielectric layer 44 may be formed directly on horizontal surfaces of the insulating layers 32 and sidewalls of the memory stack structures 55 within the backside recesses 43. If the backside blocking dielectric layer 44 is formed, formation of the tubular dielectric spacers 115 and the planar dielectric portion 616 prior to formation of the backside blocking dielectric layer 44 is optional. In one embodiment, the backside blocking dielectric layer 44 may be formed by a conformal deposition process such as atomic layer deposition (ALD). The backside blocking dielectric layer 44 may consist essentially of aluminum oxide. The thickness of the backside blocking dielectric layer 44 may be in a range from 1 nm to 15 nm, such as 2 to 6 nm, although lesser and greater thicknesses may also be used.

The dielectric material of the backside blocking dielectric layer 44 may be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 may include a silicon oxide layer. The backside blocking dielectric layer 44 may be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 8C, a metallic barrier layer 46A may be deposited in the backside recesses 43. The metallic barrier layer 46A includes an electrically conductive metallic material that may function as a diffusion barrier layer and/or adhesion promotion layer for a metallic fill material to be subsequently deposited. The metallic barrier layer 46A may include a conductive metallic nitride material such as TiN, TaN, WN, or a stack thereof, or may include a conductive metallic carbide material such as TiC, TaC, WC, or a stack thereof. In one embodiment, the metallic barrier layer 46A may be deposited by a conformal deposition process such as chemical vapor deposition (CVD) or atomic layer deposition (ALD). The thickness of the metallic barrier layer 46A may be in a range from 2 nm to 8 nm, such as from 3 nm to 6 nm, although lesser and greater thicknesses may also be used. In one embodiment, the metallic barrier layer 46A may consist essentially of a conductive metal nitride such as TiN.

Figure 9:
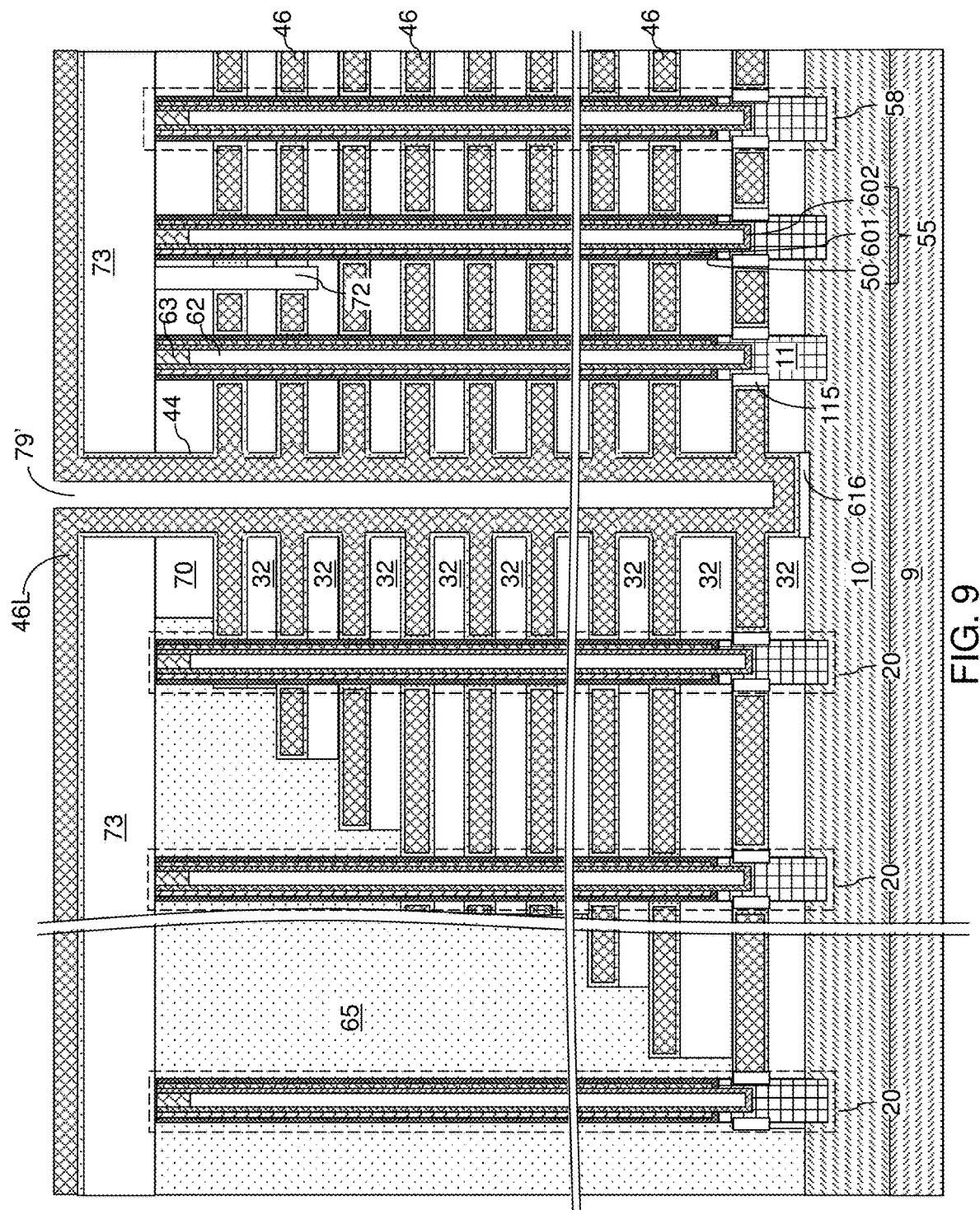
FIG. 9 is a schematic vertical cross-sectional view of the exemplary structure at the processing step of FIG. 8D.

Referring to FIGS. 8D and 9, a metal fill material is deposited in the plurality of backside recesses 43, on the sidewalls of the at least one backside trench 79, and over the top surface of the lower contact level dielectric layer 73 to form a metallic fill material layer 46B. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material layer 46B may consist essentially of at least one elemental metal. The at least one elemental metal of the metallic fill material layer 46B may be selected, for example, from tungsten, cobalt, ruthenium, titanium, and tantalum. In one embodiment, the metallic fill material layer 46B may consist essentially of a single elemental metal. In one embodiment, the metallic fill material layer 46B may be deposited using a fluorine-containing precursor gas such as $WF_6$. In one embodiment, the metallic fill material layer 46B may be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 may be formed in the plurality of backside recesses 43, and a continuous electrically conductive material layer 46L may be formed on the sidewalls of each backside trench 79 and over the lower contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the lower contact level dielectric layer 73.

Each sacrificial material layer 42 may be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 115 laterally surrounds a pedestal channel portion 11. A bottommost electrically conductive layer 46 laterally surrounds each tubular dielectric spacer 115 upon formation of the electrically conductive layers 46.

Figure 10A:
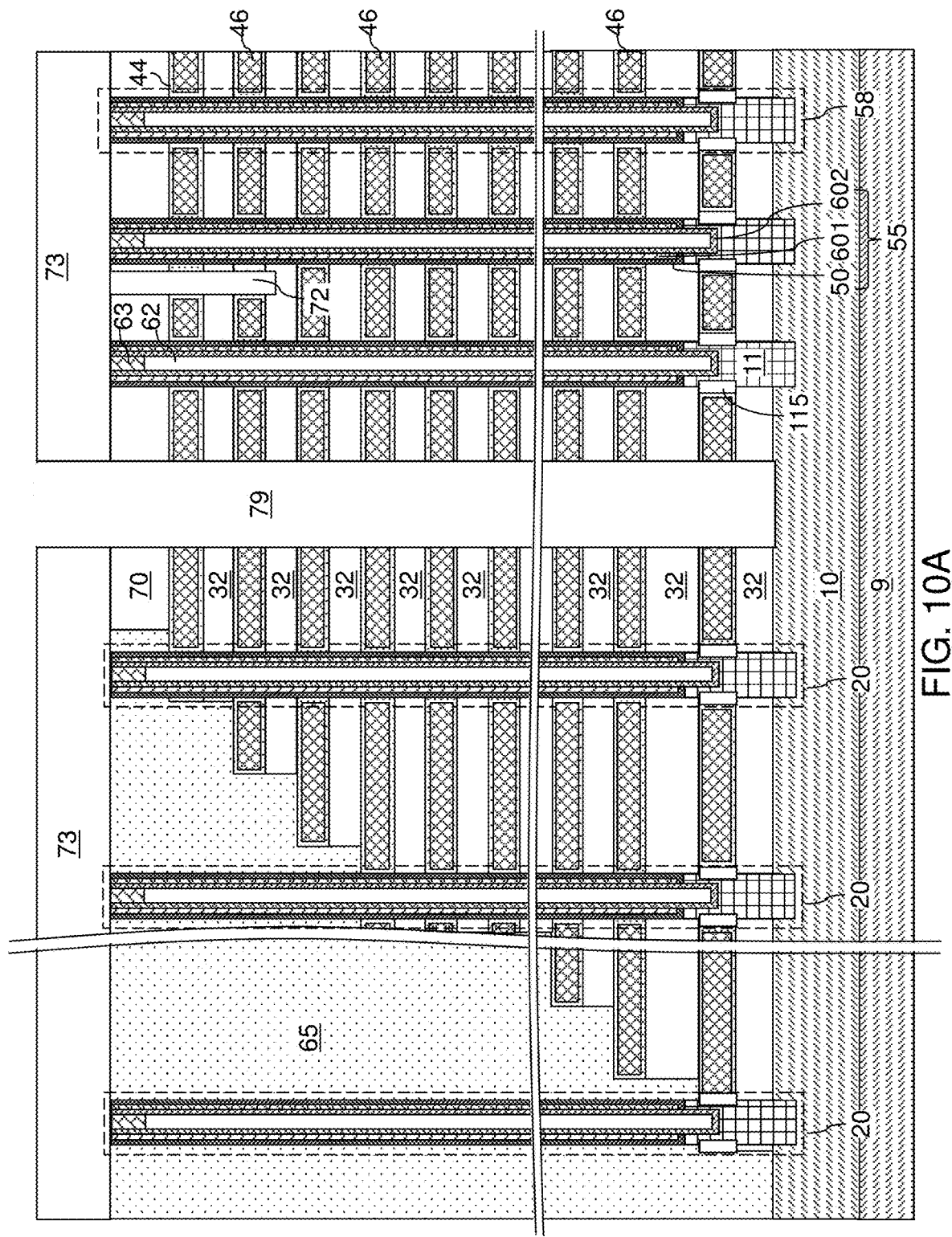
FIG. 10A is a schematic vertical cross-sectional view of the exemplary structure after removal of a deposited conductive material from within the backside trench according to an embodiment of the present disclosure.

Referring to FIG. 10A and 10B, the deposited metallic material of the continuous electrically conductive material layer 46L is etched back from the sidewalls of each backside trench 79 and from above the lower contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 may be a conductive line structure. Thus, the sacrificial material layers 42 are replaced with the electrically conductive layers 46.

Each electrically conductive layer 46 may function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 may be a word line that functions as a common control gate electrode for the plurality of vertical memory devices.

In one embodiment, the removal of the continuous electrically conductive material layer 46L may be selective to the material of the backside blocking dielectric layer 44. In this case, a horizontal portion of the backside blocking dielectric layer 44 may be present at the bottom of each backside trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 may be removed during removal of the continuous electrically conductive material layer 46L. A backside cavity 79' is present within each backside trench 79.

Figure 11A:
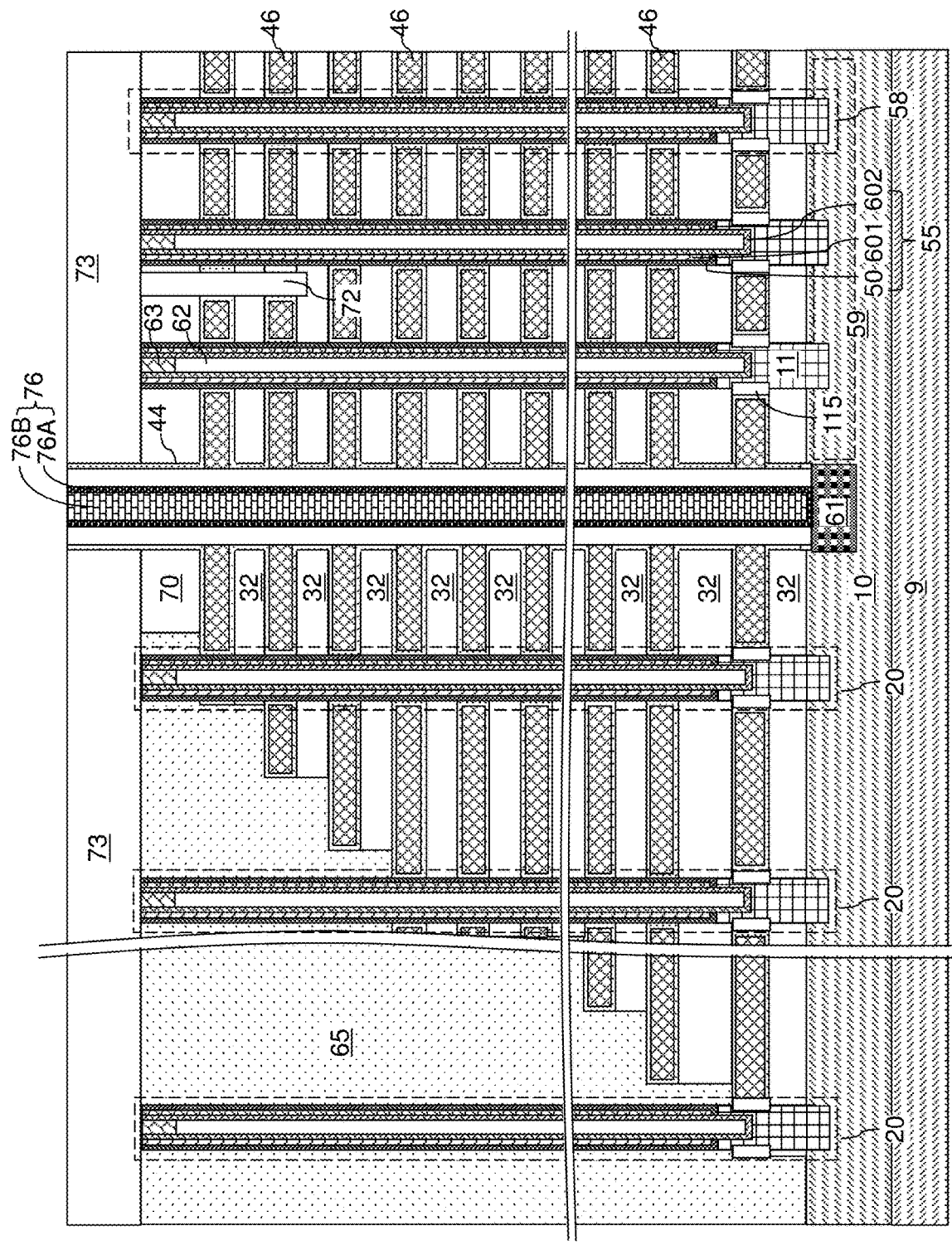
FIG. 11A is a schematic vertical cross-sectional view of the exemplary structure after formation of an insulating spacer and a source contact structure within each backside trench according to an embodiment of the present disclosure.

Referring to FIGS. 11A and 11B, an insulating material layer may be formed in the backside trenches 79 and over the lower contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses may also be used.

If a backside blocking dielectric layer 44 is present, the insulating material layer may be formed directly on surfaces of the backside blocking dielectric layer 44 and directly on the sidewalls of the electrically conductive layers 46. If a backside blocking dielectric layer 44 is not used, the insulating material layer may be formed directly on sidewalls of the insulating layers 32 and directly on sidewalls of the electrically conductive layers 46.

An anisotropic etch is performed to remove horizontal portions of the insulating material layer from above the lower contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 may be physically exposed at the bottom of each backside trench 79.

A source region 61 may be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 may have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) may comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A source contact structure 76 may be formed within each backside cavity 79'. Each contact via structure 76 may fill a respective cavity 79'. The contact via structures 76 may be formed by depositing at least one conductive material in the remaining unfilled volume (i.e., the backside cavity 79') of the backside trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses may also be used. The conductive fill material portion 76B may include a metal or a metallic alloy. For example, the conductive fill material portion 76B may include W, Cu, Al, Co, Ru, Ni, an alloy thereof, or a stack thereof.

The at least one conductive material may be planarized using the lower contact level dielectric layer 73 overlying the alternating stack (32, 46) as a stopping layer. If chemical mechanical planarization (CMP) process is used, the lower contact level dielectric layer 73 may be used as a CMP stopping layer. Each remaining continuous portion of the at least one conductive material in the backside trenches 79 constitutes a source contact structure 76.

The source contact structure 76 extends through the alternating stack (32, 46), and contacts a top surface of the source region 61. If a backside blocking dielectric layer 44 is used, the source contact structure 76 may contact a sidewall of the backside blocking dielectric layer 44.

Figure 12A:
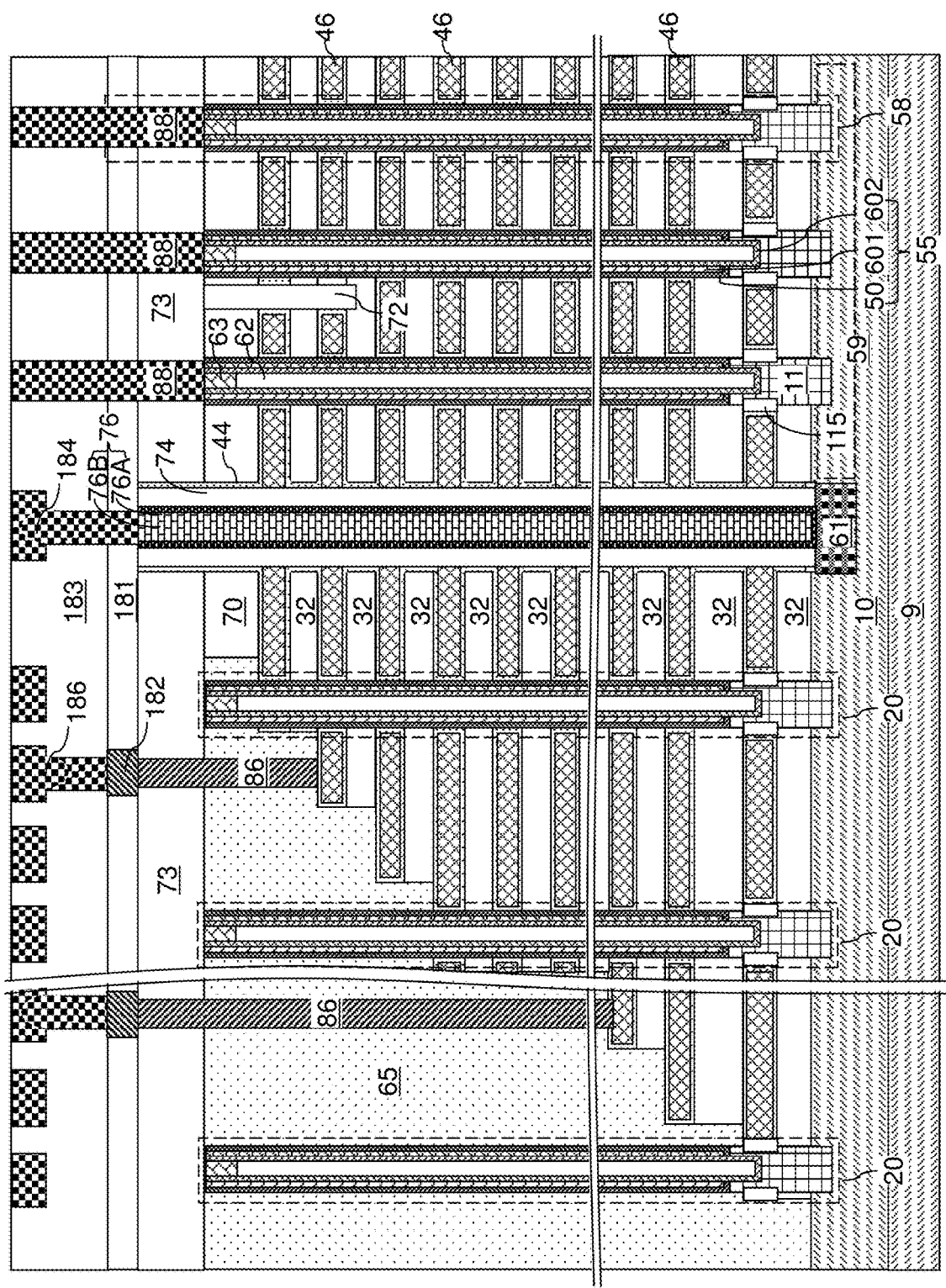
FIG. 12A is a schematic vertical cross-sectional view of the exemplary structure after formation of contact level dielectric material layers and contact via structures according to an embodiment of the present disclosure.
Figure 12B:
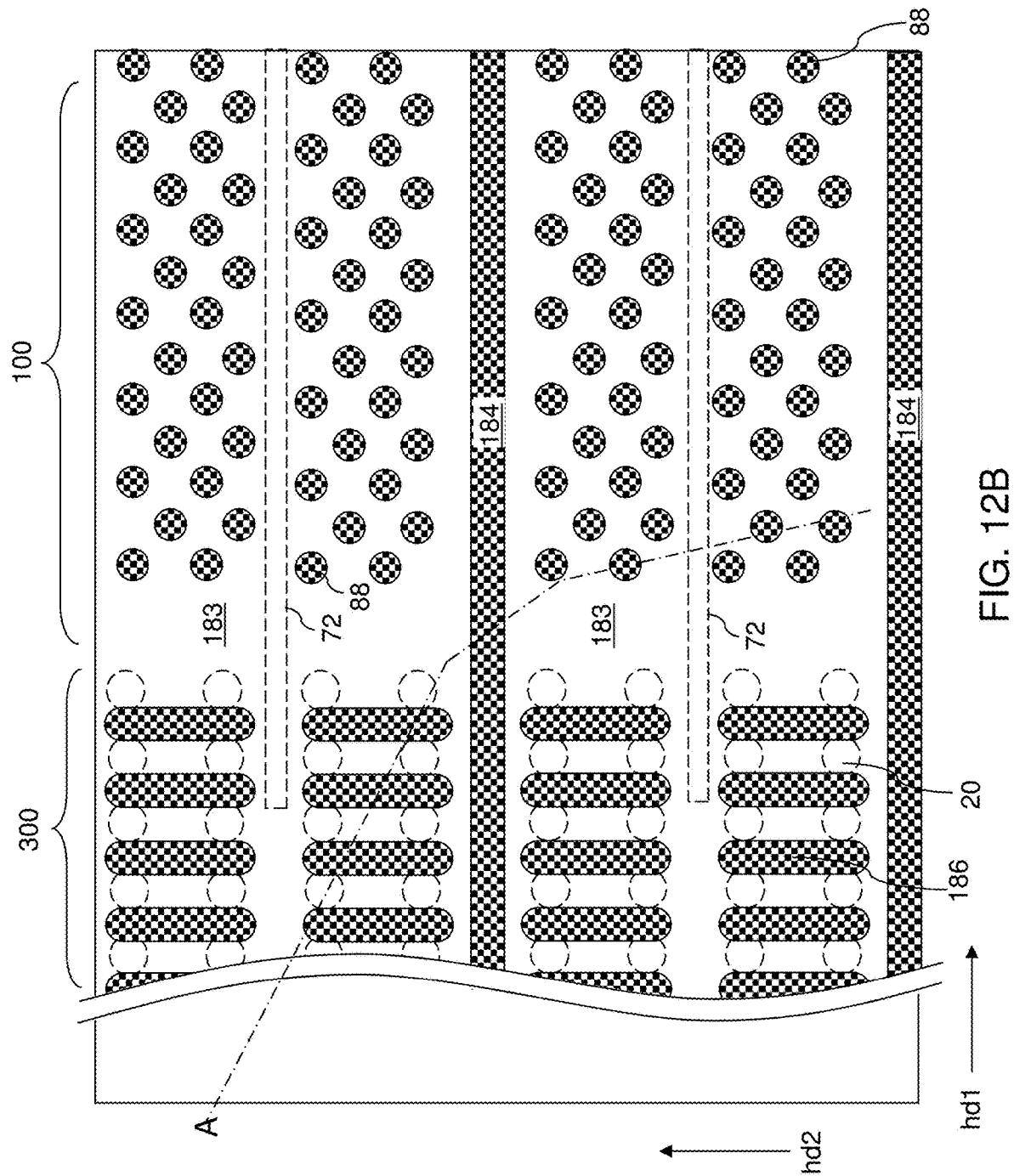
FIG. 12B is a top-down view of the exemplary structure of FIG. 12A. The vertical plane A-A' is the plane of the schematic vertical cross-sectional view of FIG. 12A.

Referring to FIGS. 12A and 12B, layer contact via structures 86 may be formed through the lower contact level dielectric layer 73 and the retro-stepped dielectric material portion 65 to a top surface of a respective one of the electrically conductive layers 46 in the staircase region. The layer contact via structures 86 include word line contact via structures that contact a subset of the electrically conductive layers 46 that functions as word lines. In one embodiment, top surfaces of the layer contact via structures 86 may be coplanar with the top surface of the lower contact level dielectric layer 73.

A middle contact level dielectric layer 181 may be deposited over the lower contact level dielectric layer 73. The middle contact level dielectric layer 181 includes a dielectric material such as silicon oxide. Line trenches may be formed through the middle contact level dielectric layer 181 over the layer contact via structures 86. The line trenches in the middle contact level dielectric layer 181 may be filled with at least one conductive material to form contact-connection line structures 182 that contact a top surface of a respective underlying one of the layer contact via structures 86.

Alternatively, the middle contact level dielectric layer 181 may be formed over the lower contact level dielectric layer 73 prior to formation of the layer contact via structures 86, and integrated line and via cavities may be formed through the middle contact level dielectric layer 181 and the lower contact level dielectric layer 73. Each integrated line and via cavity may include a combined volume for a layer contact via structure 86 and a contact-connection line structure 182. The integrated line and via cavities are filled with at least one conductive material to form integrated line and via structures. Each integrated line and via structure may include a combination of a layer contact via structure 86 and a contact-connection line structure 182, An upper contact level dielectric layer 183 may be formed over the middle contact level dielectric layer 181. The upper contact level dielectric layer 183 includes a dielectric material such as silicon oxide. Contact via cavities extending through the upper contact level dielectric layer 183, optionally through the middle contact level dielectric layer 181, and optionally through the lower contact level dielectric layer 73 may be formed, for example, by application and patterning of a photoresist layer (not shown) over the upper contact level dielectric layer 183, and by an anisotropic etch process that transfers the pattern in the photoresist layer through underlying portions of the upper contact level dielectric layer 183, the middle contact level dielectric layer 181, and the lower contact level dielectric layer 73. The contact via cavities may be formed over the memory opening fill structures 58, the source contact structures 76, and the contact-connection line structure 182, which may function as etch stop structures during formation of the contact via cavities. The photoresist layer may be removed, for example, by ashing.

Optionally, a line pattern may be formed in an upper region of a subset of the contact via cavities. For example, a photoresist layer (not shown) may be applied over the upper contact level dielectric layer 183, and may be lithographically patterned to form line-shaped openings that overlie the subset of the contact via cavities. The pattern in the photoresist layer may be transferred into the upper region of the upper contact level dielectric layer 183 by an anisotropic etch process. Integrated line and via cavities may be formed through the upper contact level dielectric layer 183. In one embodiment, the integrated line and via cavities may be formed over the source contact structures 76 and the contact-connection line structure 182. Cylindrical via cavities including vertical sidewalls that extend from the top surface of the upper contact level dielectric layer 183 to the top surface of a respective one of the drain regions 63 may be formed in the memory array region. The photoresist layer may be subsequently removed, for example, by ashing.

At least one conductive material may be deposited in the integrated line and via cavities and the cylindrical via cavities. Various contact via structures (88, 184, 186) may be formed through the upper contact level dielectric layer 183, the middle contact level dielectric layer 181, and the lower contact level dielectric layer 73. The contact via structures (88, 184, 186) may include drain contact via structures 88 that extend through the upper contact level dielectric layer 183, the middle contact level dielectric layer 181, and the lower contact level dielectric layer 73, and contacts a top surface of a respective one of the drain regions 63. Each drain contact via structure 88 may have a cylindrical shape, i.e., a shape having horizontal cross-sectional area that is invariant with translation along the vertical direction. The contact via structures (88, 184, 186) may further include word-line-connection contact via structures 186 that are formed on a top surface of a respective one of the contact-connection line structures 182. Each word-line-connection contact via structure 186 may extend through the upper contact level dielectric layer 183. Further, the contact via structures (88, 184, 186) may further include source-connection contact via structures 184 that are formed on a top surface of a respective one of the source contact structures 76. Each source-connection contact via structure 184 may extend through the upper contact level dielectric layer 183 and the middle contact level dielectric layer 181. In one embodiment, each of the word-line-connection contact via structures 186 and the source-connection contact via structures 184 may be an integrated line and via structure that includes a respective via portion and a respective line portion. In one embodiment, the line portion of each source-connection contact via structure 184 may laterally extend along the first horizontal direction hd1 along a predominant fraction (i.e., more than 50%) of the entire length of an underlying source contact structure 76. A source-connection contact via structure 184 may be formed above, and may be electrically connected to, each source contact structure 76.

Figure 13A:
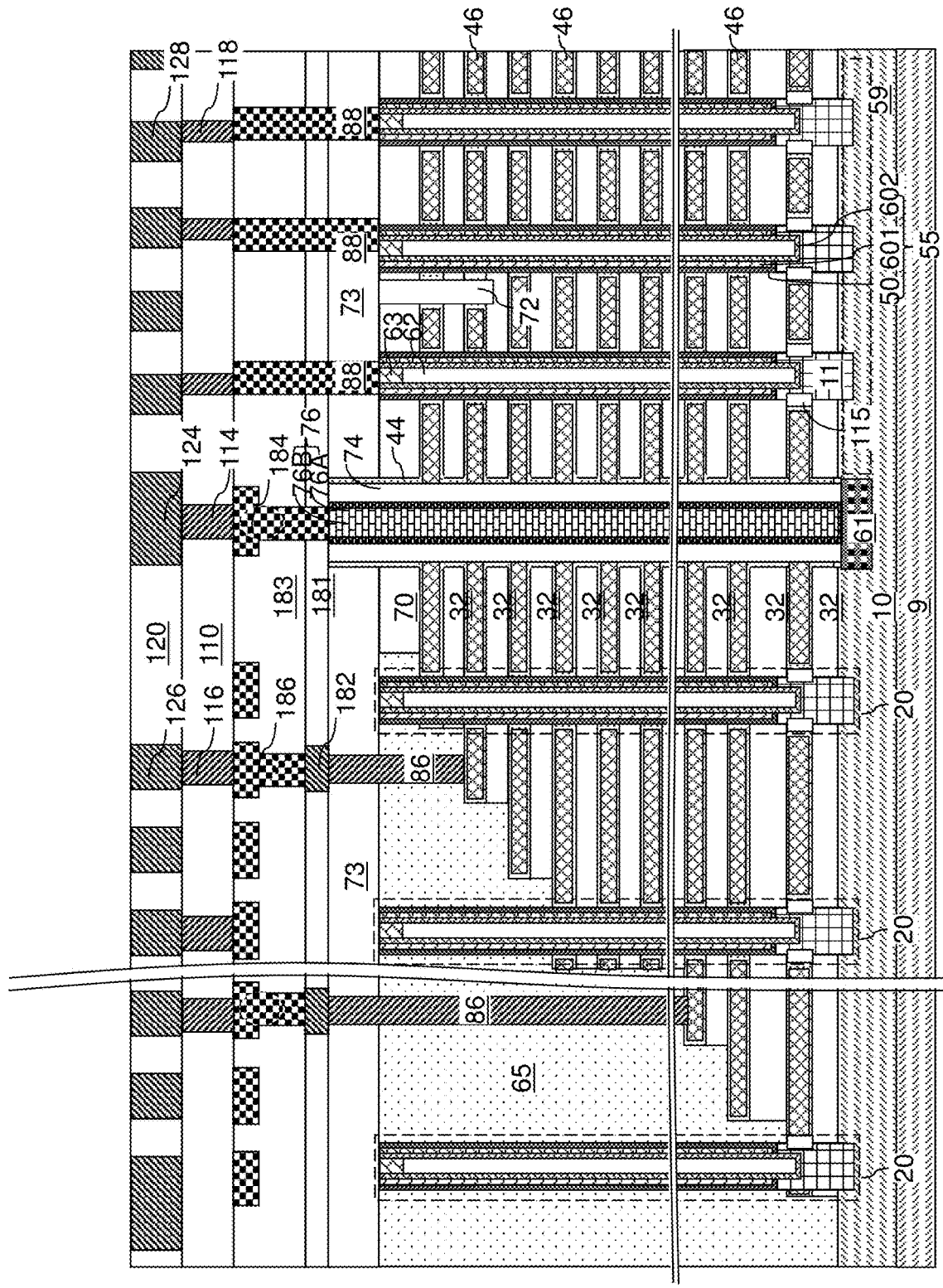
FIG. 13A is a schematic vertical cross-sectional view of the exemplary structure after formation of first-level dielectric material layers and first-level metal interconnect structures according to an embodiment of the present disclosure.
Figure 13B:
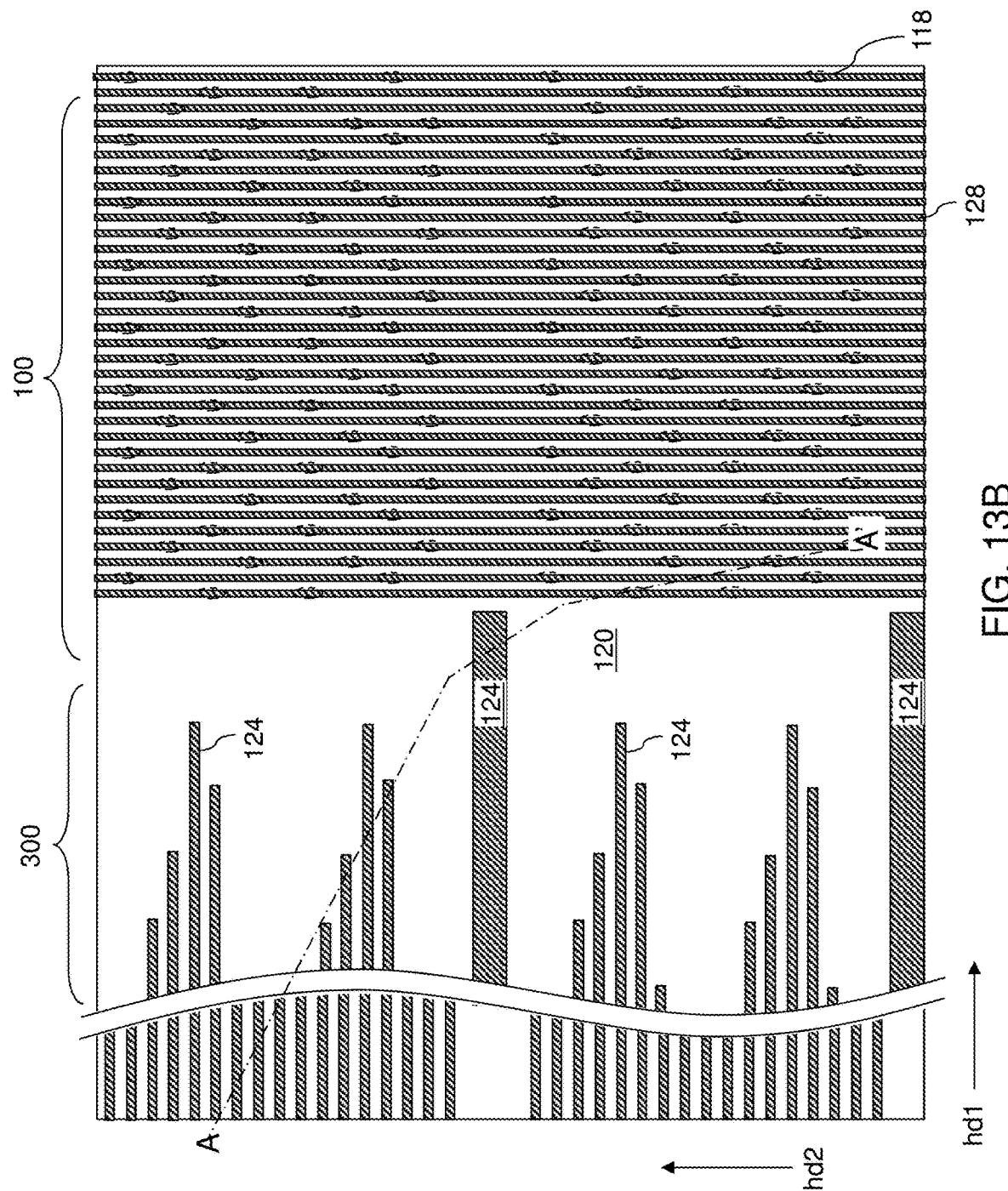
FIG. 13B is a top-down view of the exemplary structure of FIG. 13A. The vertical plane A-A' is the plane of the schematic vertical cross-sectional view of FIG. 13A.

Referring to FIGS. 13A and 13B, a first via level dielectric layer 110 may be deposited over the upper contact level dielectric layer 183. The first via level dielectric layer 110 includes a dielectric material such as undoped silicate glass, a doped silicate glass, or an organosilicate glass. The thickness of the first via level dielectric layer 110 may be in a range from 50 nm to 300 nm, although lesser and greater thicknesses may also be used.

Via cavities are formed through the first via level dielectric layer 110, for example, by application and patterning of a photoresist layer (not shown) over the first via level dielectric layer 110 and by anisotropically etching unmasked portions of the first via level dielectric layer 110. The photoresist layer may be subsequently removed. A conductive material may be deposited in the via cavities to form various first via structures (118, 114, 116). The first via structures (118, 114, 116) may include bit-line-connection via structures 118 that are formed on a top surface of a respective one of the drain contact via structures 88, first source-connection via structures 114 that are formed on a top surface of a respective one of the source-connection contact via structures 184, and first word-line-connection via structures 116 that are formed on a top surface of a respective one of the word-line-connection contact via structures 186.

A first line level dielectric layer 120 may be deposited over the first via level dielectric layer 110. The first line level dielectric layer 120 includes a dielectric material such as undoped silicate glass, a doped silicate glass, or an organosilicate glass. The thickness of the first line level dielectric layer 120 may be in a range from 50 nm to 300 nm, although lesser and greater thicknesses may also be used.

Line cavities are formed through the first line level dielectric layer 120, for example, by application and patterning of a photoresist layer (not shown) over the first line level dielectric layer 120 and by anisotropically etching unmasked portions of the first line level dielectric layer 120. The photoresist layer may be subsequently removed. A conductive material may be deposited in the line cavities to form various first line structures (128, 124, 126). The first line structures (128, 124, 126) may include bit lines 128 that are formed on a top surface of a respective one of the bit-line-connection via structures 118, first source-connection line structures 124 that are formed on a top surface of a respective one of the first source-connection via structures 114, and first word-line-connection line structures 126 that are formed on a top surface of a respective one of the first word-line-connection via structures 116.

In one embodiment, the bit lines 128 may laterally extend along the second horizontal direction hd2, and may be laterally spaced apart along the first horizontal direction hd1 with a uniform pitch, which is herein referred to as a bit line pitch. The first source-connection line structures 124 and the first word-line-connection line structures 126 may laterally extend along the first horizontal direction hd1, and may be formed in the staircase region 300. Each source region 61 may be electrically connected to a respective set of at least one first source-connection line structures 124 through a respective source contact structure 76 and a respective at least one first source-connection via structure 114.

Figure 14A:
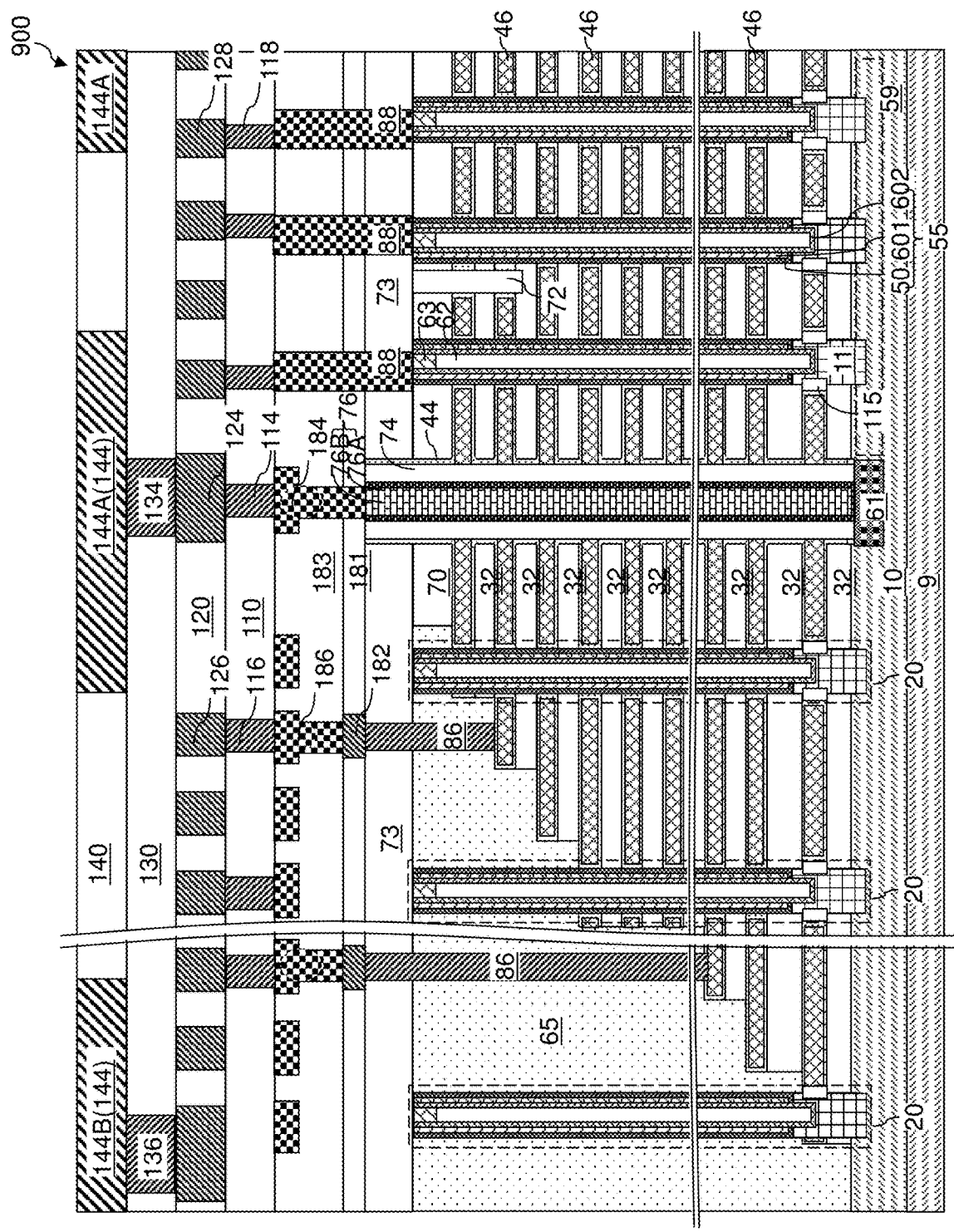
FIG. 14A is a schematic vertical cross-sectional view of the exemplary structure after formation of pad connection via structures and memory-die bonding pads according to an embodiment of the present disclosure.
Figure 14B:
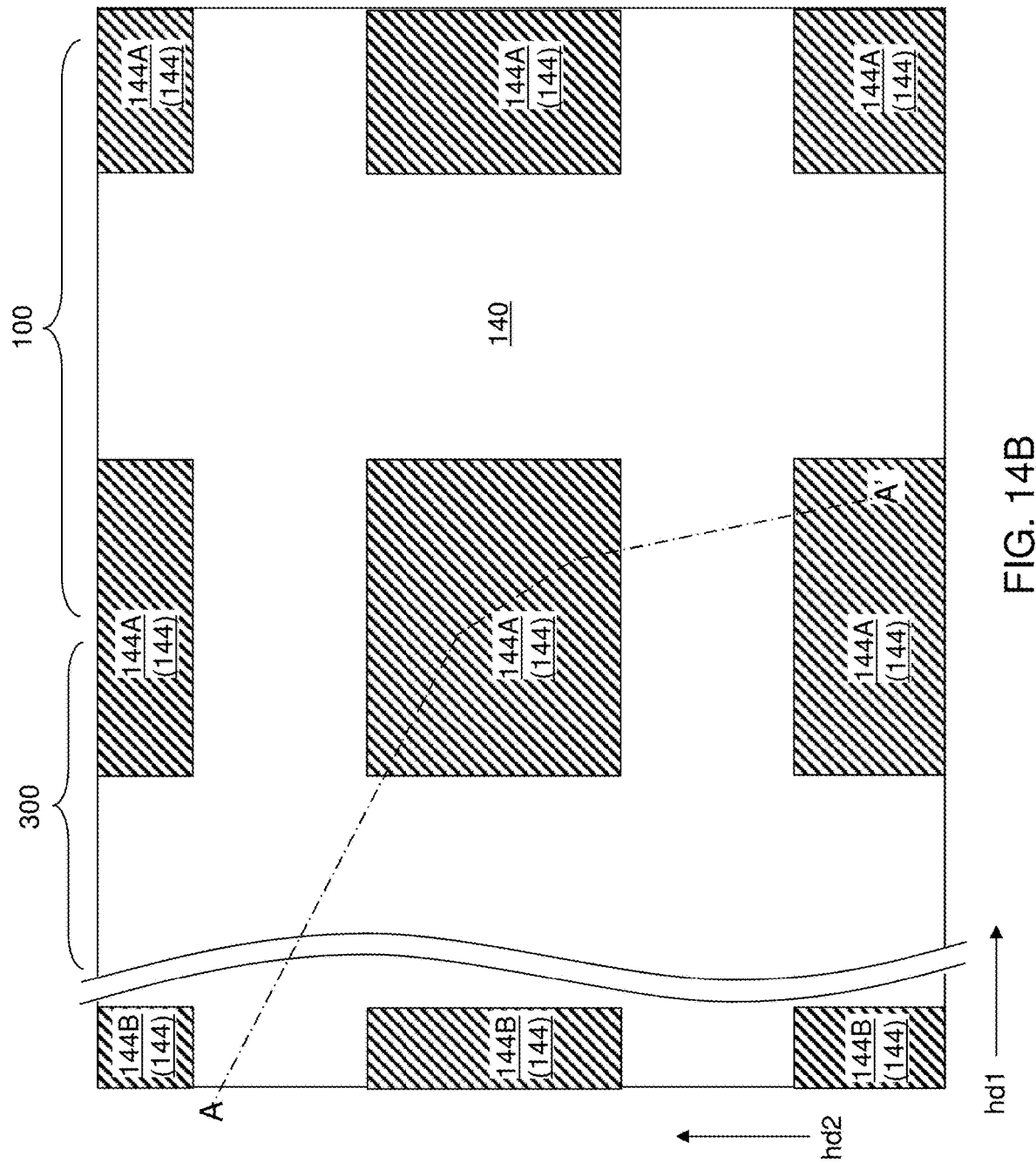
FIG. 14B is a top-down view of a region of the exemplary structure of FIG. 14A.
Figure 14C:
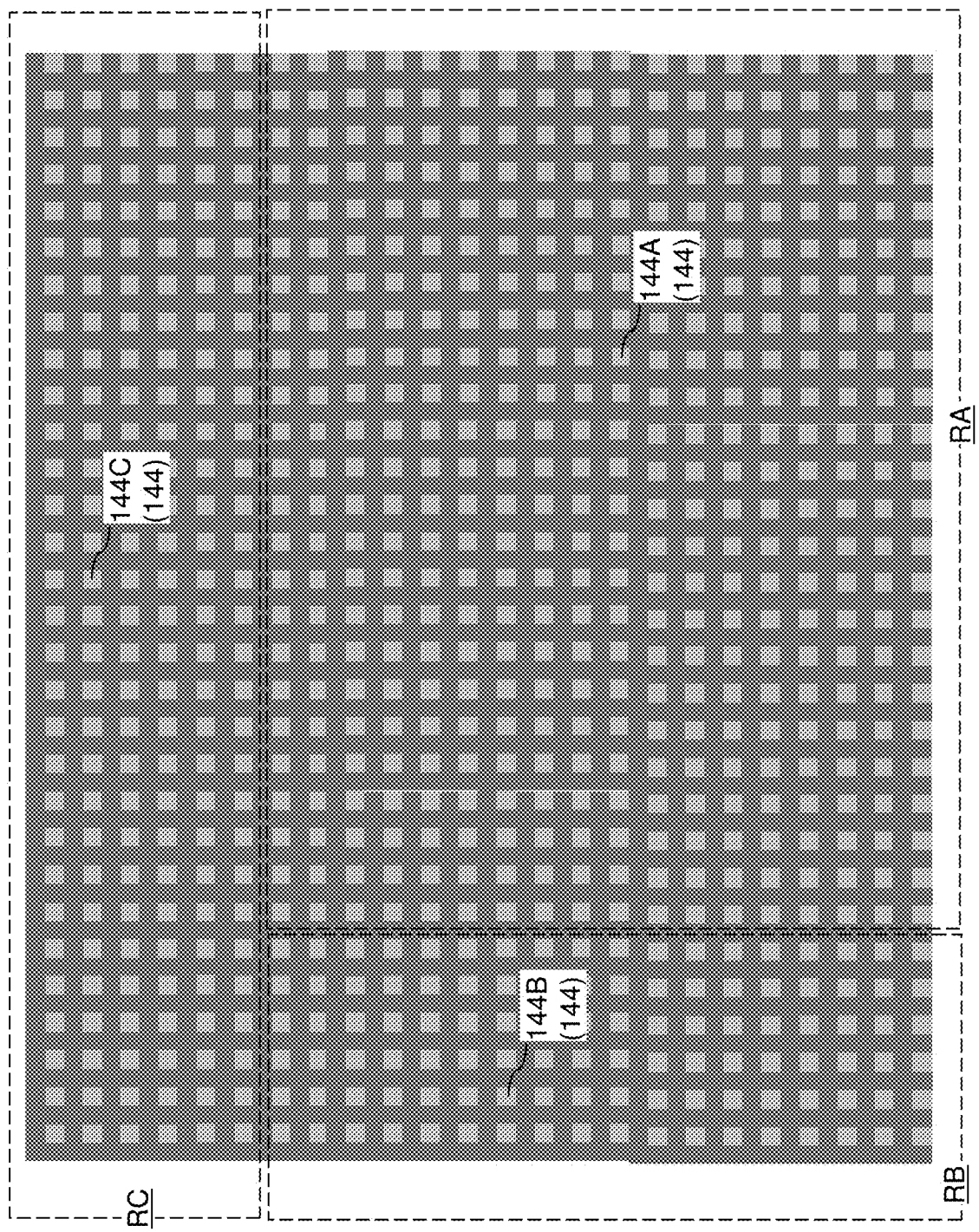
FIG. 14C is a top-down view of a larger region of the exemplary structure of FIGS. 14A and 14B.

Referring to FIGS. 14A-14C, a second via level dielectric layer 130 may be deposited over the upper contact level dielectric layer 183. The second via level dielectric layer 130 includes a dielectric material such as undoped silicate glass, a doped silicate glass, or an organosilicate glass. The thickness of the second via level dielectric layer 130 may be in a range from 50 nm to 300 nm, although lesser and greater thicknesses may also be used.

Via cavities are formed through the second via level dielectric layer 130, for example, by application and patterning of a photoresist layer (not shown) over the second via level dielectric layer 130 and by anisotropically etching unmasked portions of the second via level dielectric layer 130. The photoresist layer may be subsequently removed. A conductive material may be deposited in the via cavities to form second via structures (134, 136). The second via structures (134, 136) may include second source-connection via structures 134 that are formed on a respective one of the first source-connection line structures 124, second word-line-connection via structures 136 that are formed on a respective one of the word-line-connection line structures 126, and bit-line-connection via structures (not shown) that are formed on a top surface of a respective one of the bit lines 128.

A memory-side pad level dielectric layer 140 may be deposited over the second via level dielectric layer 130. The memory-side pad level dielectric layer 140 includes a dielectric material such as undoped silicate glass, a doped silicate glass, or an organosilicate glass. The thickness of the memory-side pad level dielectric layer 140 may be in a range from 50 nm to 300 nm, although lesser and greater thicknesses may also be used.

Pad cavities are formed through the memory-side pad level dielectric layer 140, for example, by application and patterning of a photoresist layer (not shown) over the memory-side pad level dielectric layer 140 and by anisotropically etching unmasked portions of the memory-side pad level dielectric layer 140. The photoresist layer may be subsequently removed. The pad cavities may have a rectangular shape and may be arranged in a rectangular periodic array, or may have a non-rectangular shape such as a "H-shape," and may be arranged in a periodic array which may, or may not, be a rectangular array.

A conductive material may be deposited in the pad cavities to form various memory-die bonding pads 144. The memory-die bonding pads 144 may include source-network memory-die bonding pads 144A that are formed on a top surface of a respective one of the second source-connection via structures 134, word-line-connection memory-die bonding pads 144B that are formed on a top surface of a respective one of the second word-line-connection via structures 136, and bit-line-connection memory-die bonding pads 144C that are formed on a top surface of a respective one of the bit-line-connection via structures. An array of source-network memory-die bonding pads 144A may be formed in a first area RA that overlies the memory array region 100. The array of source-network memory-die bonding pads 144A may be formed as a first periodic two-dimensional array, and may be used as components of a power distribution network for supplying power to the source regions 61. An array of word-line-connection memory-die bonding pads 144B may be formed in a second area RB that overlies the staircase region 300. The array of word-line-connection memory-die bonding pads 144B may be formed as a second periodic two-dimensional array. Each word-line-connection memory-die bonding pad 144B may be electrically connected to a respective one of the electrically conductive layers 46. An array of bit-line-connection memory-die bonding pads 144C may be formed in a third area RC that is laterally offset from the first area RA and the second area RB. Each bit-line-connection memory-die bonding pads 144C may be connected to a respective bit line 128 and a respective subset of the drain regions 63.

The exemplary structure illustrated in FIGS. 14A-14C includes a memory die 900. Generally, the memory die 900 may include an alternating stack of insulating layers 32 and electrically conductive layers 46 located over a substrate (9, 10), memory stack structures 55 extending through the alternating stack (32, 46), wherein each of the memory stack structures 55 comprises a memory film 50 and a vertical semiconductor channel 60, source regions 61 located on, or in, the substrate (9, 10), source contact structures 76 vertically extending through the alternating stack (32, 46) and contacting the source regions 61, and an array of memory-die bonding pads (i.e., the source-network memory-die bonding pads 144A) electrically connected to the source contact structures 76 through a subset of memory-side metal interconnect structures, which may include source-connection contact via structures 184, first source-connection via structures 114, first source-connection line structures 124, and second source-connection via structures 134.

A plurality of memory dies 900 may be provided. Each of the memory dies 900 may include an alternating stack of insulating layers 32 and word lines comprising a subset of the electrically conductive layers 46. The alternating stack (32, 46) has stepped surfaces in which a subset of the electrically conductive layers 46 has a lateral extent that increases with a distance from a bonding surface of the memory die 900 including the memory-die bonding pads 144. Memory stack structures 55 vertically extend through the alternating stack (32, 46). Each of the memory stack structures 55 include a respective vertical semiconductor channel 60 and a respective set of vertically stacked memory elements located at levels of the electrically conductive layers 46. Each set of vertically stacked memory elements may include portions of a charge storage layer 54 located at the levels of the electrically conductive layers 46. Word line contact via structures (which are a subset of layer contact via structures 86 that contact a subset of the electrically conductive layers 46 that function as word lines) may contact a respective one of the word lines. Each of the word line contact via structures vertically extend from a respective one of the word lines toward the bonding surface of the memory die 900.

Figure 15A:
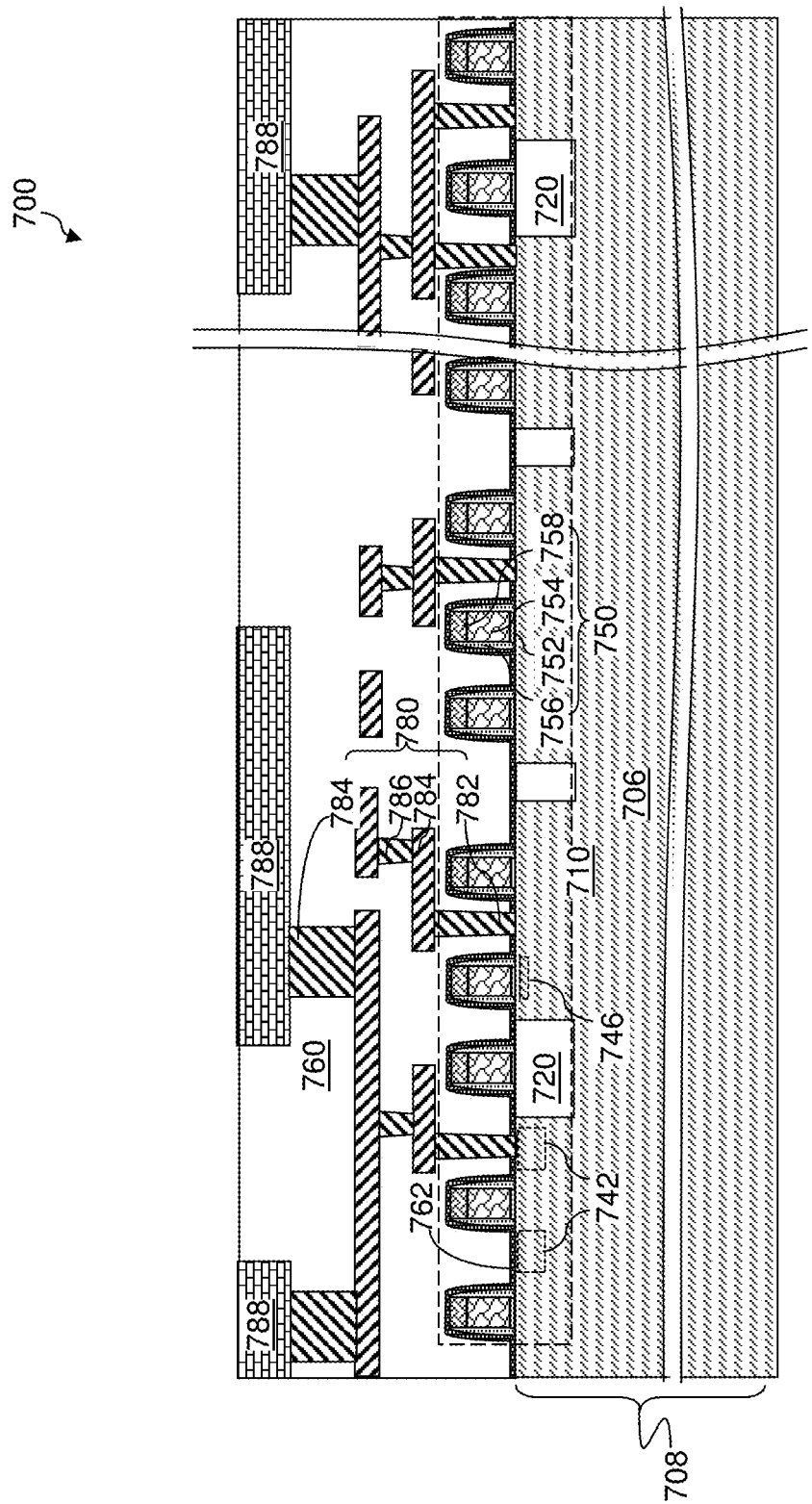
FIG. 15A is a vertical cross-sectional view of a support die after formation of front support-die bonding pads according to an embodiment of the present disclosure.
Figure 15B:
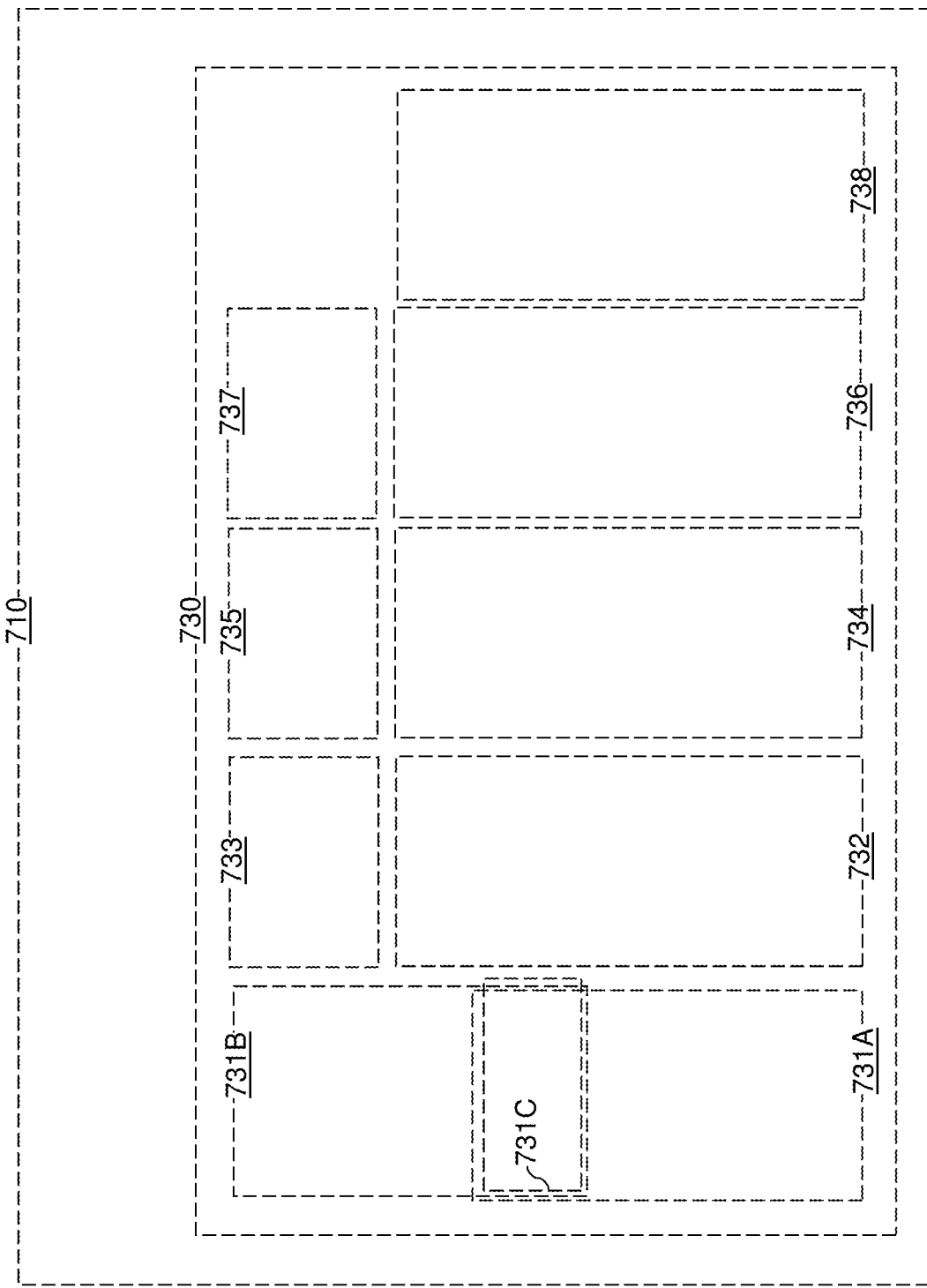
FIG. 15B is a plan view of a first configuration of a peripheral circuitry in the support die according to an embodiment of the present disclosure.
Figure 15C:
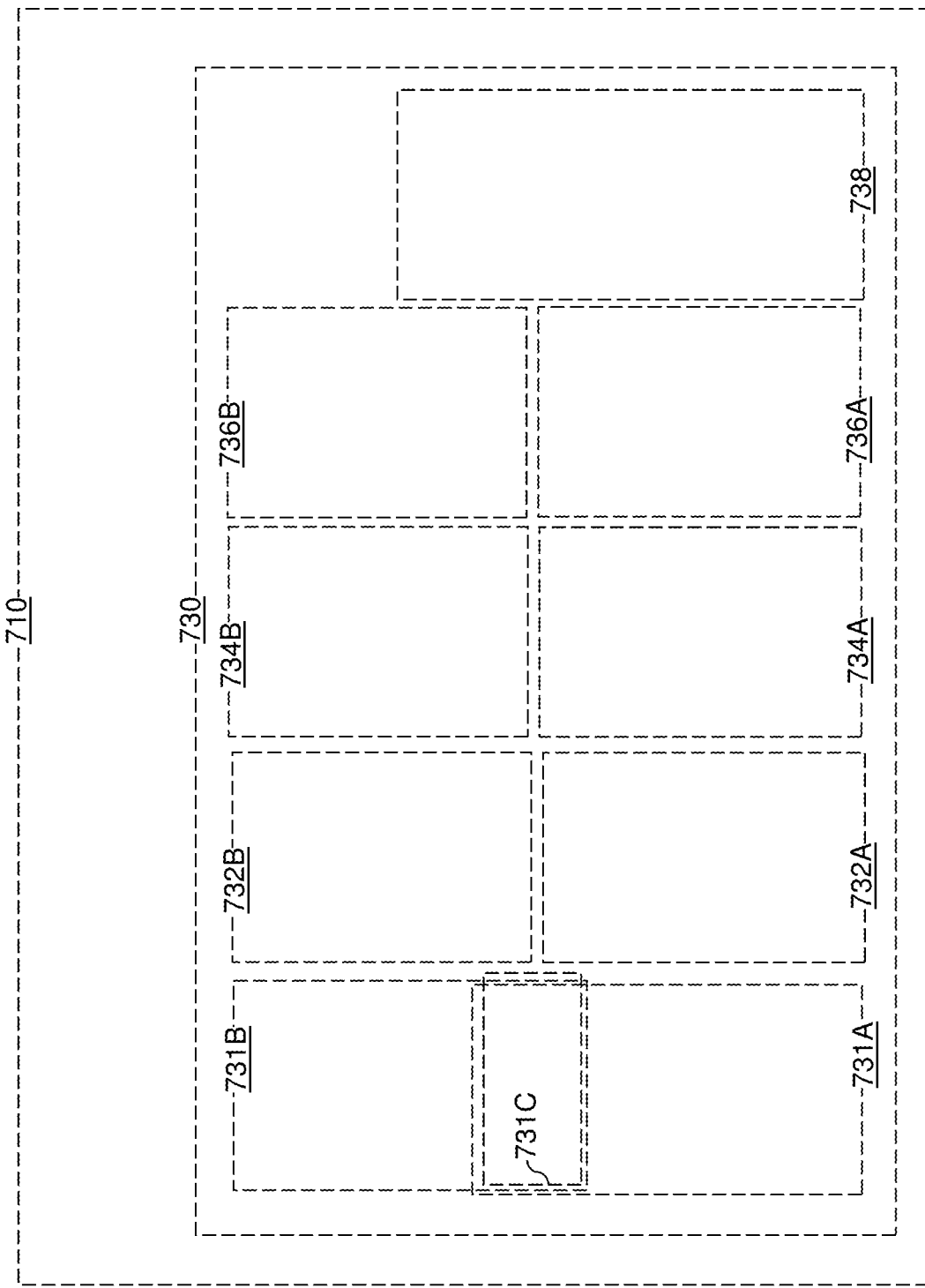
FIG. 15C is a plan view of a second configuration of a peripheral circuitry in the support die according to an embodiment of the present disclosure.

Referring to FIGS. 15A-15C, a support die 700 including various semiconductor devices 710 is provided. The semiconductor devices 710 includes a peripheral circuitry 730 for operation of the three-dimensional memory arrays in the memory die 900. The peripheral circuitry 730 may include a word line driver 734 that drives word lines of the three-dimensional memory array (comprising the electrically conductive layers 46) within the memory die 900, a bit line driver 736 that drives the bit lines 128 in the memory die 900, a word line decoder circuit that decodes the addresses for the electrically conductive layers 46, a bit line decoder circuit that decodes the addresses for the bit lines 128, a sense amplifier 732 circuit that senses the states of memory elements within the memory stack structures 55 in the memory die 900, a source power supply circuit that provides power to source regions 61 the memory die 900, a data buffer and/or latch, or any other semiconductor circuit that may be used to operate the array of memory stack structures 58 in the memory die 900.

The support die 700 may include a support-die substrate 708, which may include a support-die semiconductor layer 706. The support-die semiconductor layer 706 may include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

Shallow trench isolation structures 720 may be provided in a surface region of the support-die semiconductor layer 706 to provide electrical isolation from semiconductor devices of the peripheral circuitry 730. The various semiconductor devices 710 may include field effect transistors, which include respective transistor active regions 742 (i.e., source regions and drain regions), a channel 746, and a gate structure 750. The field effect transistors may be arranged in a CMOS configuration. Each gate structure 750 may include, for example, a gate dielectric 752, a gate electrode 754, a dielectric gate spacer 756 and a gate cap dielectric 758. For example, the semiconductor devices 710 may include word line driver 734 for electrically biasing word lines of the memory die 900, which comprise the electrically conductive layers 46, and source power supply field effect transistors that generate power to be supplied to the source regions 61 the memory die 900

Dielectric material layers are formed over the semiconductor devices 710, which are herein referred to as Support-chip dielectric layers 760. Optionally, a dielectric liner 762 (such as a silicon nitride liner) may be formed to apply mechanical stress to the various field effect transistors and/or to prevent diffusion of hydrogen or impurities from the Support-chip dielectric layers 760 into the semiconductor devices 710. Support-chip metal interconnect structures 780 are formed within the Support-chip dielectric layers 760. The support-chip metal interconnect structures 780 may include various device contact via structures 782 (e.g., source and drain electrodes which contact the respective source and drain nodes of the device or gate electrode contacts), interconnect-level metal line structures 784, interconnect-level metal via structures 786, and front support-die bonding pads 788. The front support-die bonding pads 788 are configured to mate with the memory-die bonding pads 144 to provide electrically conductive paths between the memory die 900 and the support die 700.

In one embodiment, the semiconductor devices 710 of the support die 700 may include complementary metal-oxide-semiconductor (CMOS) devices. In one embodiment, the peripheral circuitry 730 may include a peripheral circuitry 730 configured to drive multiple memory dies 900. In one embodiment, the front support-die bonding pads 788 may be electrically connected to a first subset 731A of the peripheral circuitry 730 that is configured to drive a first instance of the memory die 900. A second subset 731B of the peripheral circuitry 730 may be configured to drive a second instance of the memory die 900. An intersection set (i.e., a common subset) of the first subset 731A of the peripheral circuitry 730 and the second subset 731B of the peripheral circuitry 730 includes a third subset 731C of the peripheral circuitry 730 that is configured to electrically connected to electrical nodes within the first instance of a memory die 900 and to electrical nodes within the second instance of the memory die 900.

In one embodiment, the peripheral circuitry 730 may include a sense amplifier 732 and a first switchable electrical connection circuit 733. The first switchable electrical connection circuit 733 may be configured to connect the sense amplifier 732 to a set of nodes that is selected from a set of first bit lines 128 located within a first instance of the memory die 900 to be subsequently bonded to the support die 700 and a set of second bit lines 128 located within a second instance of the memory die 900 to be subsequently bonded to the support die 700.

In one embodiment, the peripheral circuitry 730 comprises a word line driver 734 and a second switchable electrical connection circuit 735. The second switchable electrical connection circuit 735 is configured to connect the word line driver 734 to a set of nodes that is selected from a set of first word lines (comprising a subset of the electrically conductive layers 46) located within the first instance of the memory die 900 to be subsequently bonded to the support die 700 and a set of second word lines (comprising a subset of the electrically conductive layers 46) located within the second instance of the memory die 900 to be subsequently bonded to the support die 700.

In one embodiment, the peripheral circuitry 730 comprises a bit line driver 736 and a third switchable electrical connection circuit 737. The third switchable electrical connection circuit 737 is configured to connect the bit line driver 736 to a set of nodes that is selected from a set of first bit lines 128 located within the first instance of the memory die 900 to be subsequently bonded to the support die 700 and a set of second bit lines 128 located within the second instance of the memory die 900 to be subsequently bonded to the support die 700.

In one embodiment, the peripheral circuitry 730 comprises a source power supply circuit 738 configured to drive a first source line (comprising a combination of the source regions 61, the source contact structure 76, the source-connection contact via structures 184, the first source-connection via structures 114, the first source-connection line structures 124, and the second source-connection via structures 134) in the first instance of the memory die 900 and a second source line in the second instance of the memory die 900. The support die 700 may comprise a source power distribution network including a subset of metal interconnect structures 780 and connected to the source power supply circuit and a subset of the front support-die bonding pads 788, and to be connected to a subset of the backside bonding structures to be subsequently formed.

Separate driver circuits may be used in lieu of any combination of a driver circuit and a switchable electrical connection circuit. For example, a combination of a first sense amplifier 732A and a second sense amplifier 732B may be used in lieu of a combination of a sense amplifier 732 and a first switchable electrical connection circuit 733. In this case, the first sense amplifier 732A may be connected to a set of first bit lines 128 located within a first instance of the memory die 900 to be subsequently bonded to the support die 700, and the second sense amplifier 732B may be connected to a set of second bit lines 128 located within a second instance of the memory die 900 to be subsequently bonded to the support die 700.

In one embodiment, the peripheral circuitry 730 comprises a first bit line driver 736A that may be subsequently connected to first bit lines 128 within the first instance of the memory die 900 through a first subset of the front support-die bonding pads 788 and a first subset of the first memory-die bonding pads 144 (such as the bit-line-connection memory-die bonding pads 144C), and a second bit line driver 736B that may be subsequently connected to second bit lines 128 within the second instance of the memory die 900 through a first subset of the backside bonding structures to be subsequently formed on the support die 700 and through a first subset of the second memory-die bonding pads (such as the bit-line-connection memory-die bonding pads 144C).

In one embodiment, the peripheral circuitry 730 comprises a first word line driver 734A that may be subsequently connected to first word lines (comprising a subset of the electrically conductive layers 46) within the first instance of the memory die 900 through a second subset of the front support-die bonding pads 788 and a second subset of the first memory-die bonding pads 144 (such as the word-line-connection memory-die bonding pads 144B), and a second word line driver 734B that may be subsequently connected to second word lines (comprising a subset of the electrically conductive layers 46) within the second instance of the memory die 900 through a second subset of the backside bonding structures to be subsequently formed on the support die 700 and through a second subset of the second memory-die bonding pads (such as the word-line-connection memory-die bonding pads 144B).

Figure 16:
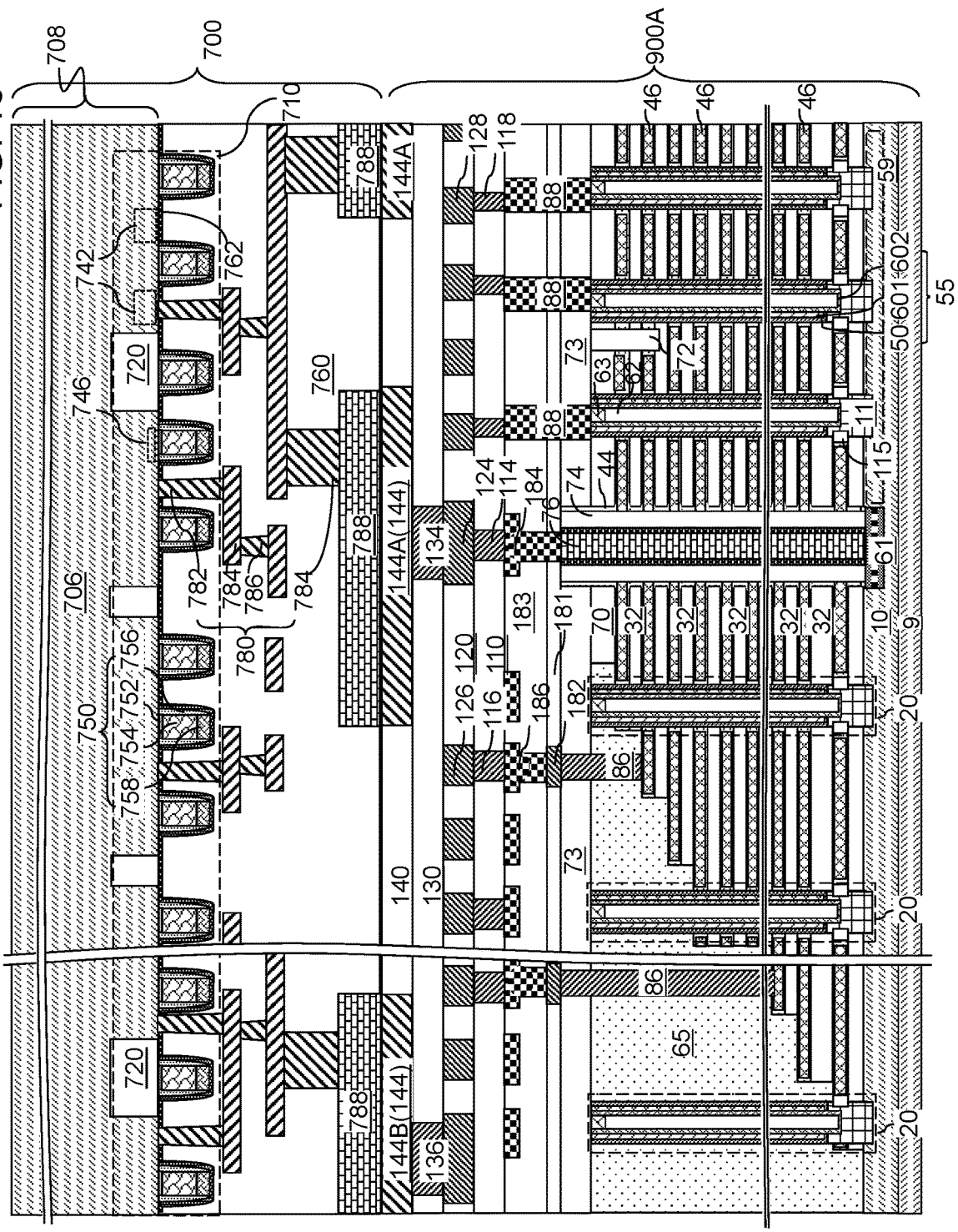
FIG. 16 is a vertical cross-sectional view of a bonded assembly of the support die and a first memory die according to an embodiment of the present disclosure.

Referring to FIG. 16, a bonded assembly of the support die 700 and a first instance of the memory die 900 may be formed. The first instance of the memory die 900 is herein referred to as a first memory die 900A. The memory-die bonding pads 144 of the first memory die 900A are herein referred to as first memory-die bonding pads 144. The first memory-die bonding pads 144 of the first memory die 900A may be bonded to the front support-die bonding pads 788 of the support die 700 via metal-to-metal bonding or through an array of solder balls (not shown).

Figure 17:
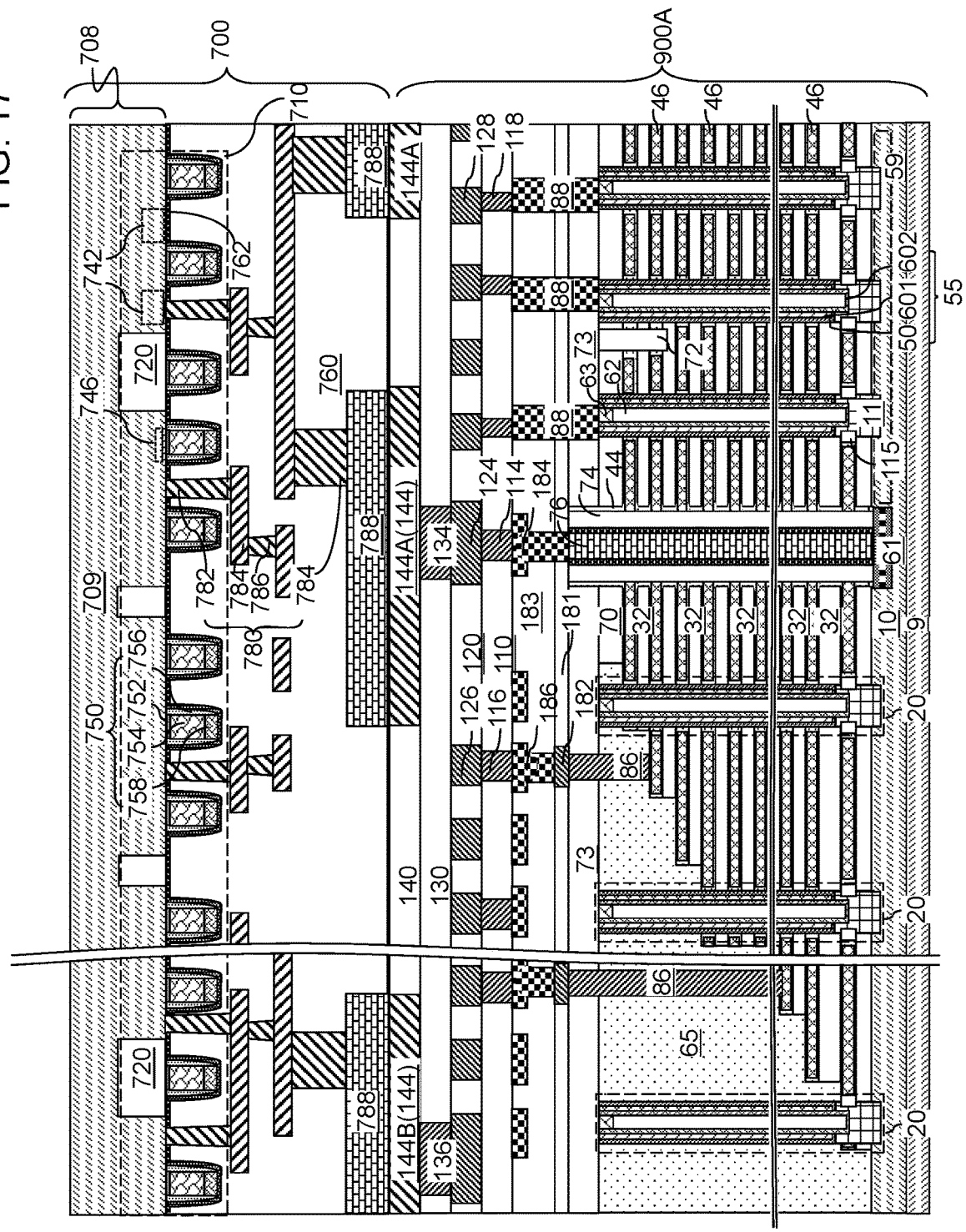
FIG. 17 is a vertical cross-sectional view of the bonded assembly after thinning the support die according to an embodiment of the present disclosure.

Referring to FIG. 17, the support-die semiconductor layer 706 may be thinned from the backside, for example, by grinding to provide a thinned support-die semiconductor layer 709, which is a semiconductor material layer. The thinned support-die semiconductor layer 709 may have a thickness in a range from 1 μm to 100 μm, such as from 3 μm to 30 μm, although lesser and greater thicknesses may also be used.

Figure 18:
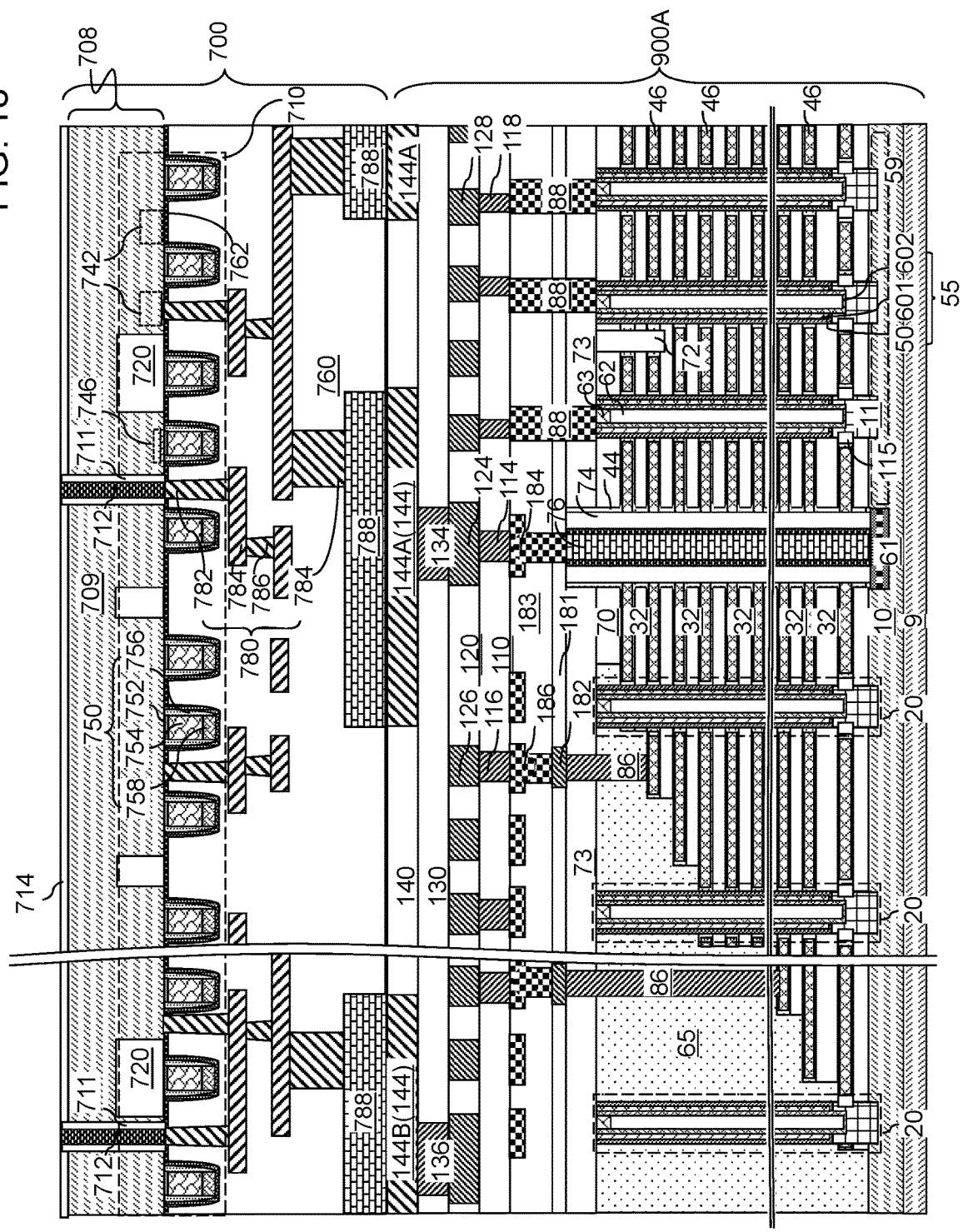
FIG. 18 is a vertical cross-sectional view of the bonded assembly after formation of tubular insulating spacers and through-substrate via structures according to an embodiment of the present disclosure.

Referring to FIG. 18, a backside insulating layer 714 may be deposited on the backside surface of the thinned support-die semiconductor layer 709. The backside insulating layer 714 includes a dielectric material such as silicon oxide, and may have a thickness in a range from 30 nm to 1,000 nm, although lesser and greater thicknesses may also be used. A photoresist layer (not shown) may be applied over the backside of the thinned support-die semiconductor layer 709, and is lithographically patterned to form openings therein. The openings in the photoresist layer may be formed directly above a respective one of the support-chip metal interconnect structures 780.

An anisotropic etch process may be performed using the photoresist layer as an etch mask layer to etch through the thinned support-die semiconductor layer 709 to a surface of a respective one of the support-chip metal interconnect structures 780. Through-substrate via cavities are formed through the backside insulating layer 714 and the thinned support-die semiconductor layer 709. The photoresist layer may be subsequently removed, for example, by ashing. An insulating liner layer may be deposited in the through-substrate via cavities and over the backside insulating layer 714. Horizontal portions of the insulating liner layer may be removed from above the backside insulating layer 714 by an anisotropic etch process. Each remaining tubular portion of the insulating liner layer constitutes a tubular insulating spacer 711. The tubular insulating spacers 711 include a dielectric material such as silicon oxide, and may have a lateral thickness in a range from 10 nm to 300 nm between an inner sidewall and an outer sidewall. At least one conductive material such as a combination of a metallic liner (e.g., TiN) and a metallic fill material (e.g., W) may be deposited in remaining volumes of the through-substrate via cavities to form through-substrate via structures 712.

Referring to FIG. 19, backside support-die bonding pads 716 may be optionally formed directly on a respective one of the through-substrate via structures 712. In case the backside support-die bonding pads 716 are formed, the backside support-die bonding pads 716 may have a mirror image pattern of the pattern of the front support-die bonding pads 788. Each combination of a through-substrate via structure 712 and a backside support die bonding pad 716 constitutes a backside bonding structure (712, 716). Each of the backside bonding structures (712, 716) may comprise a through-substrate via structure 712 extending through a semiconductor substrate (comprising the support-die substrate 708) of the support die 700 and laterally electrically insulated from the semiconductor substrate by a tubular insulating spacer 711, and a backside support-die bonding pad 716 contacting the through-substrate via structure 712, and is subsequently bonded to a memory-die bonding pad 144 of a second memory die.

In case the backside support die bonding pads 716 are not formed, each backside bonding structure may comprise, and/or may consist of, a through-substrate via structure 712 extending through a semiconductor substrate (comprising the support-die substrate 708) of the support die 700. The through-substrate via structure 712 is laterally electrically insulated from the semiconductor substrate by a tubular insulating spacer 711, and is subsequently bonded to a memory-die bonding pad 144 of a second memory die. In one embodiment, the backside bonding structures electrically connected to a second subset 731B of the peripheral circuitry 730 through the semiconductor substrate (comprising the support-die substrate 708) of the support die 700.

Figure 20A:
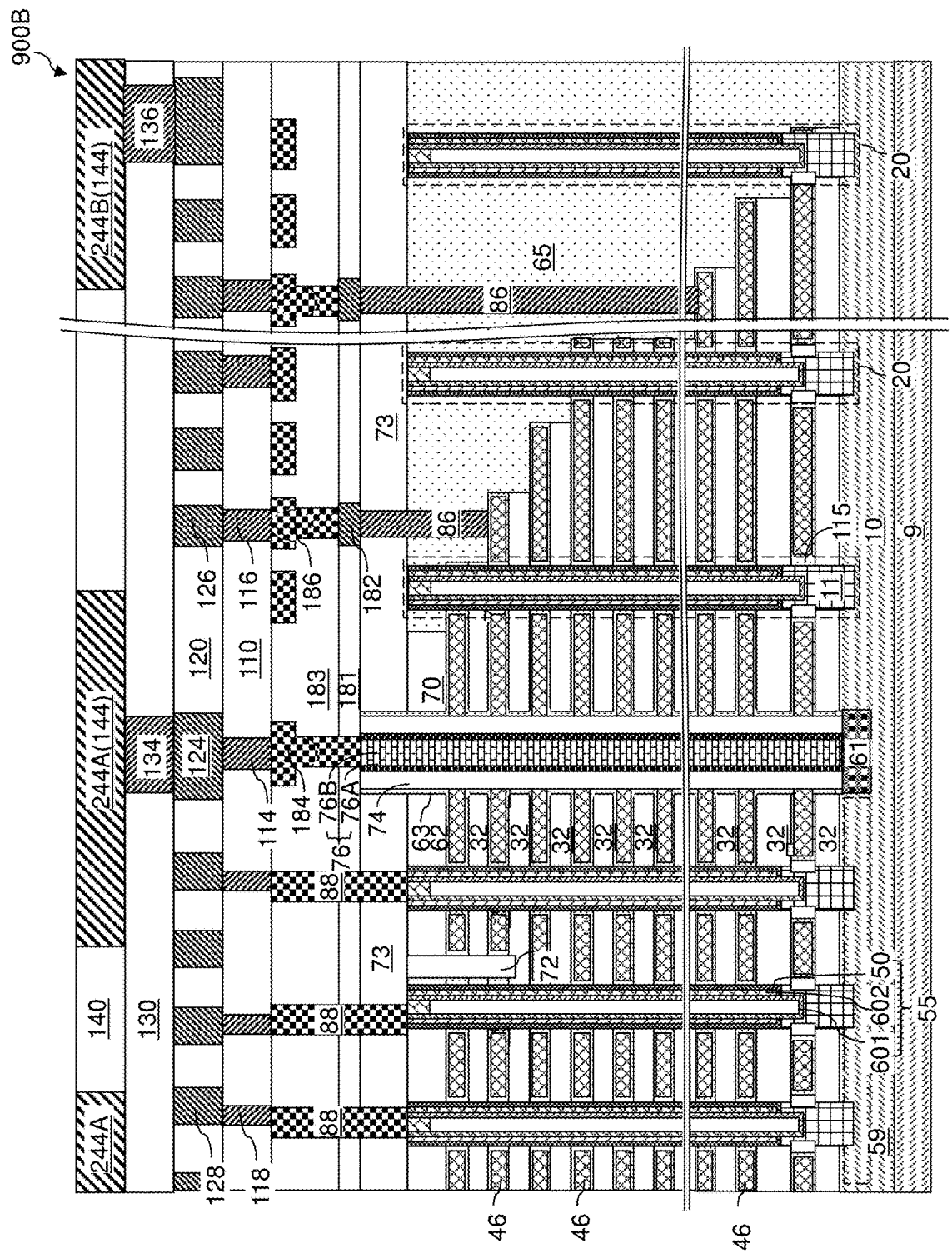
FIG. 20A is a schematic vertical cross-sectional view of a second memory die according to an embodiment of the present disclosure.
Figure 20B:
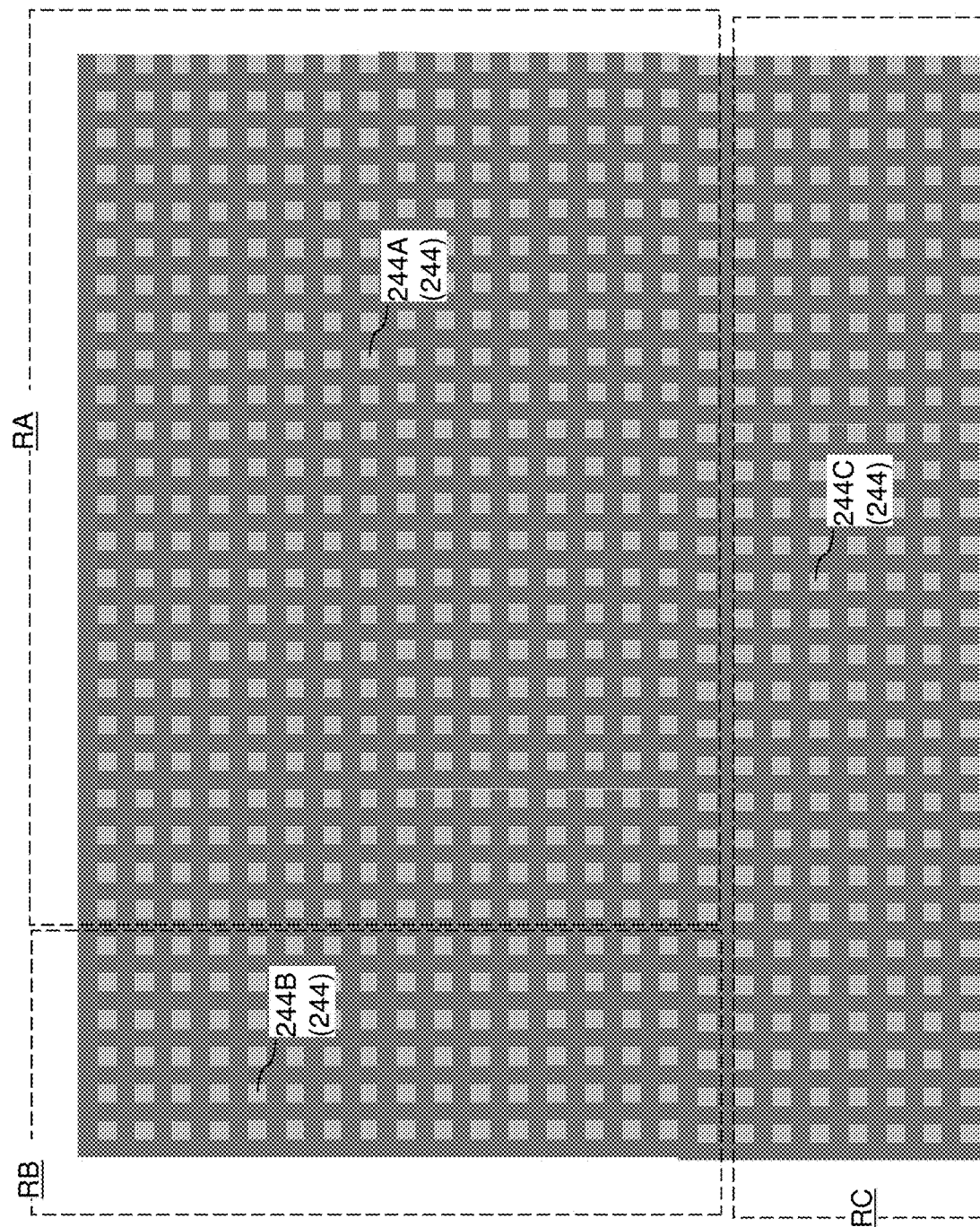
FIG. 20B is a top-down view of the second memory die of FIG. 20A.

Referring to FIGS. 20A and 20B, a second instance of the memory die 900 of the present disclosure is illustrated, which is herein referred to as a second memory die 900B. The memory-die bonding pads of the second memory die 900B are herein referred to as second memory-die bonding pads 244. The second memory-die bonding pads 244 may include second source-network memory-die bonding pads 244A that are formed on a top surface of a respective one of the second source-connection via structures 134, second word-line-connection memory-die bonding pads 244B that are formed on a top surface of a respective one of the second word-line-connection via structures 136, and second bit-line-connection memory-die bonding pads 244C that are formed on a top surface of a respective one of the bit-line-connection via structures. An array of second source-network memory-die bonding pads 244A may be formed in a first area RA that overlies the memory array region 100. The array of second source-network memory-die bonding pads 244A may be formed as a first periodic two-dimensional array, and may be used as components of a power distribution network for supplying power to the source regions 61. An array of second word-line-connection memory-die bonding pads 244B may be formed in a second area RB that overlies the staircase region 300. The array of second word-line-connection memory-die bonding pads 244B may be formed as a second periodic two-dimensional array. Each second word-line-connection memory-die bonding pad 244B may be electrically connected to a respective one of the electrically conductive layers 46. An array of second bit-line-connection memory-die bonding pads 244C may be formed in a third area RC that is laterally offset from the first area RA and the second area RB. Each second bit-line-connection memory-die bonding pads 244C may be connected to a respective bit line 128 and a respective subset of the drain regions 63.

Figure 21A:
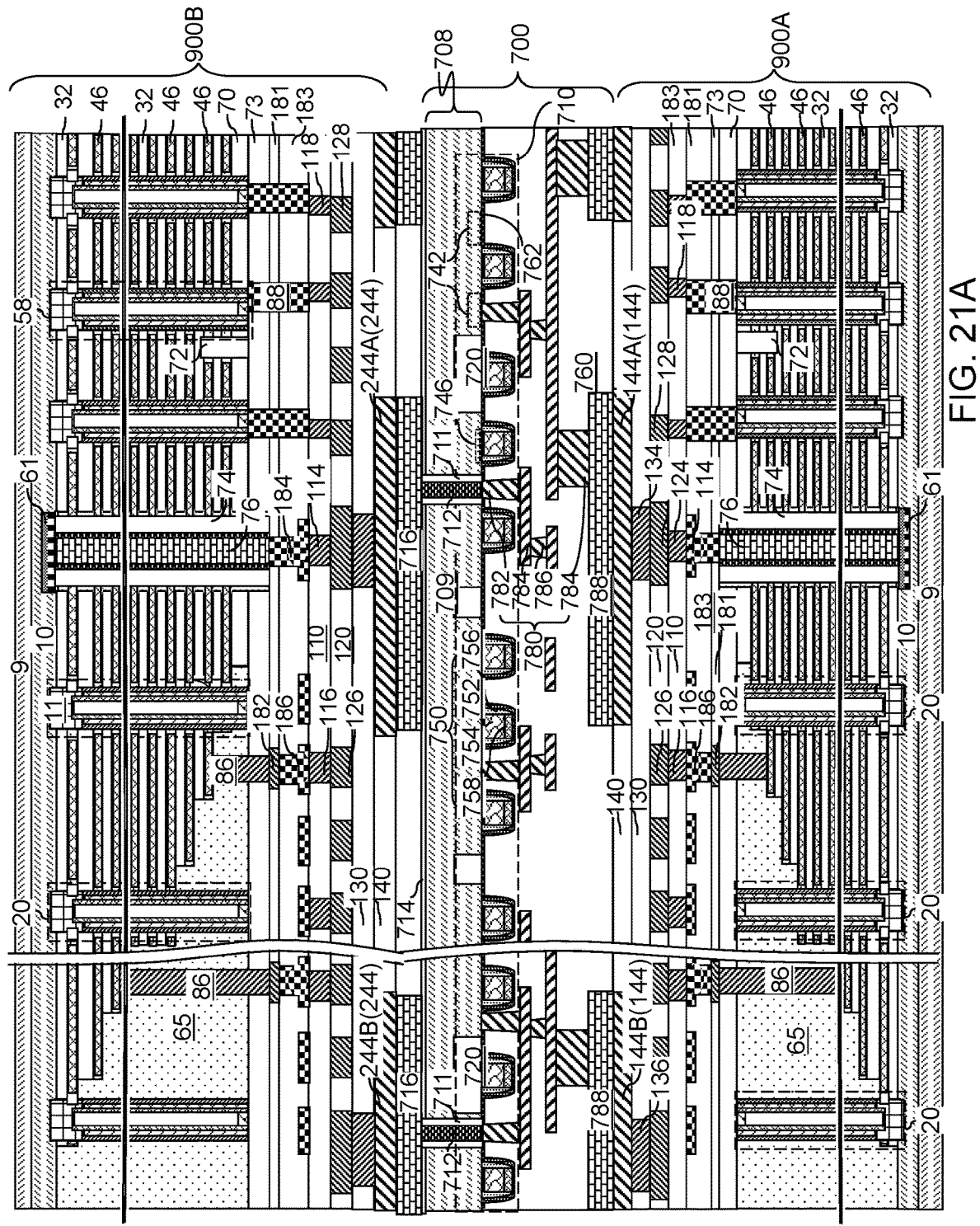
FIG. 21A is a vertical cross-sectional view of a bonded assembly of the support die, the first memory die, and the second memory die according to an embodiment of the present disclosure.
Figure 21B:
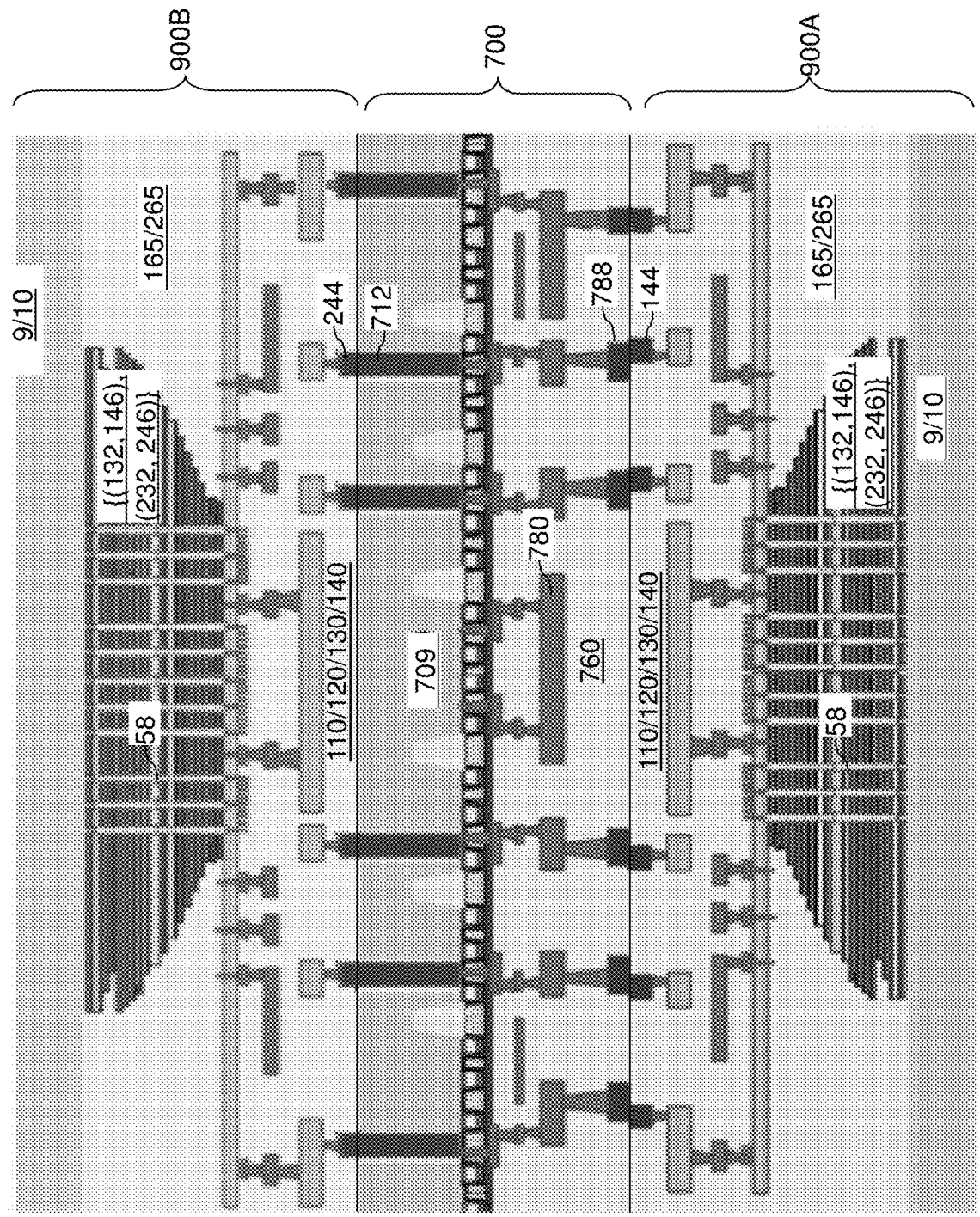
FIG. 21B is a vertical cross-sectional view of another configuration of the bonded assembly of the support die, the first memory die, and the second memory die according to an embodiment of the present disclosure.

Referring to FIGS. 21A and 21B, the second memory die 900B may be bonded to the backside of the support die 700 in the bonded assembly of FIG. 19. The second memory-die bonding pads 244 are bonded to the backside bonding structures {(712, 716) or 712} of the support die 700. In case the backside support-die bonding pads 716 are present, the configuration illustrated in FIG. 21A may be provided, in which the second memory-die bonding pads 244 are bonded to the backside support-die bonding pads 716. In case the backside support bonding pads 716 are not used, the configuration of FIG. 21B may be provided, in which the second memory-die bonding pads 244 are bonded to the through-substrate via structures 712.

In one embodiment, the first memory-die bonding pads 144 may be bonded to the front support-die bonding pads 788 by metal-to-metal bonding, and the second memory-die bonding pads 244 may be bonded to the backside bonding structures {(712, 716) or 712} by metal-to-metal bonding. Alternatively, the first memory-die bonding pads 144 may be bonded to the front support-die bonding pads 788 through an array of front-side solder balls, and/or the second memory-die bonding pads 244 may be bonded to the backside bonding structures {(712, 716) or 712} through an array of backside solder balls.

Each of the first memory die 900A and the second memory die 900B comprises an alternating stack of insulating layers 32 and word lines (comprising a subset of the electrically conductive layers 46). Each alternating stack (32, 46) has stepped surfaces in which a subset of the electrically conductive layers 46 has a lateral extent that increases with a distance from the support die 700. Each of the first memory die 900A and the second memory die 900B comprises memory stack structures 55 vertically extending through the alternating stack (32, 46) and including a respective vertical semiconductor channel 60 and a respective set of vertically stacked memory elements (comprising portions of a charge storage layer 54) located at levels of the electrically conductive layers 46. Word line contact via structures (which are a subset of layer contact via structures 86) may contact a respective one of the word lines (which are a subset of the electrically conductive layers 46), and may extend from a respective one of the word lines toward the support die 700.

Figure 22:
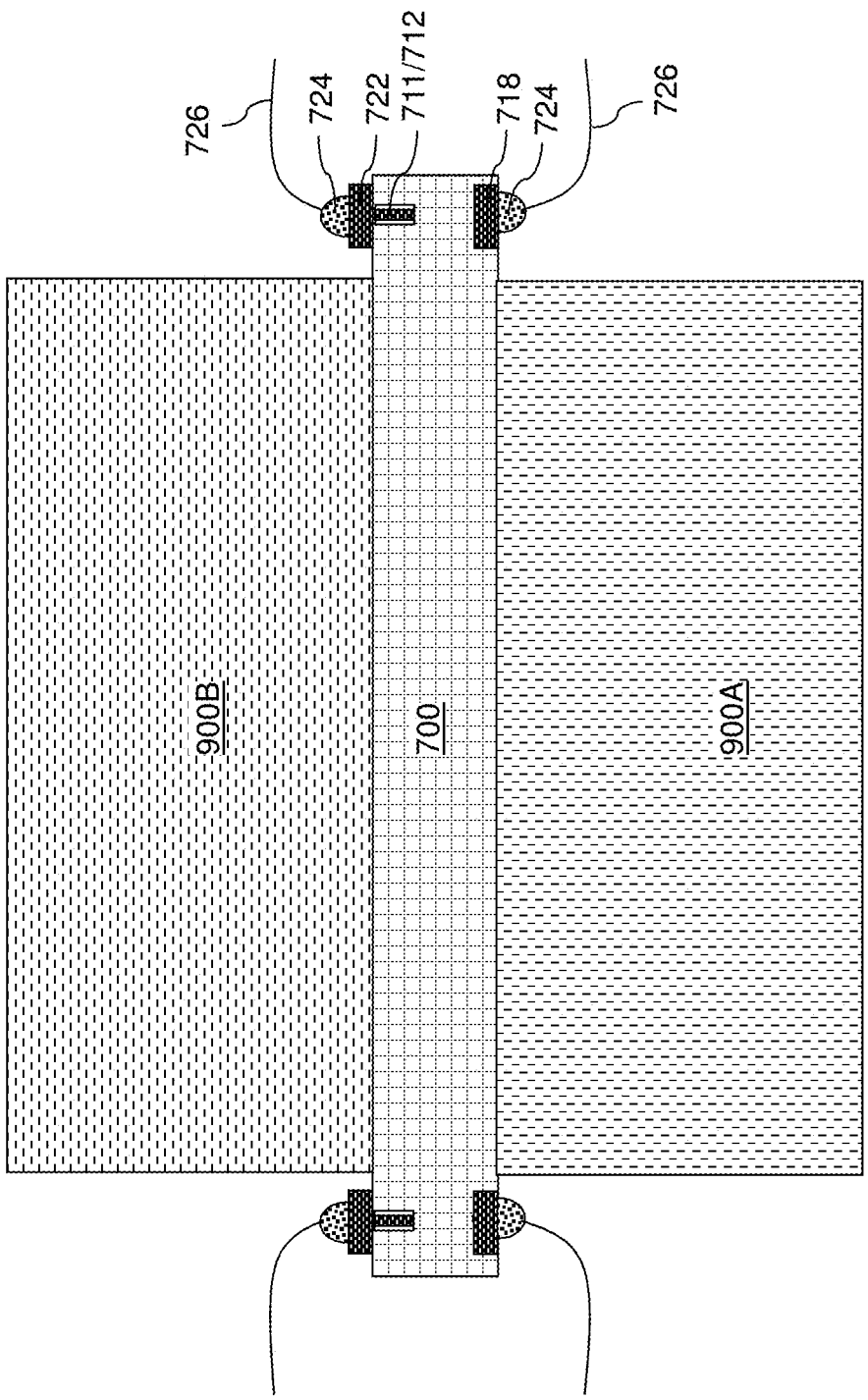
FIG. 22 is a vertical cross-sectional view of a first configuration of the bonded assembly of FIG. 21A or FIG. 21B after formation of external bonding pads, solder structures, and bonding wires according to an embodiment of the present disclosure.
Figure 23:
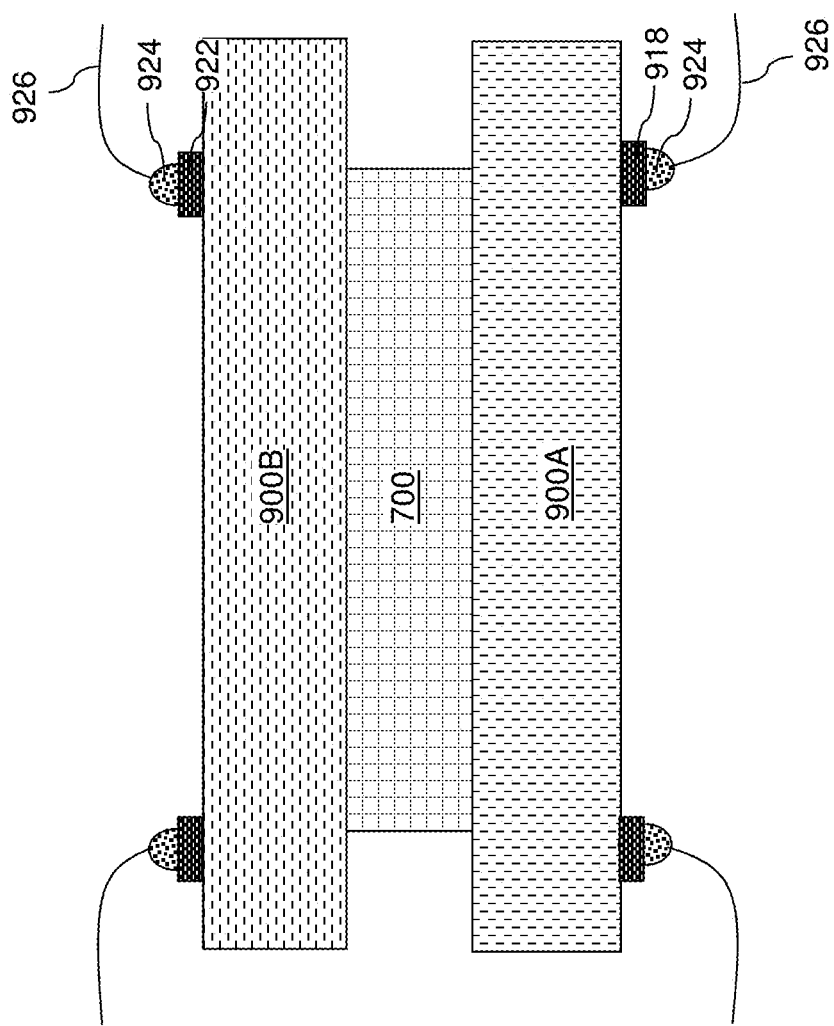
FIG. 23 is a vertical cross-sectional view of a second configuration of the bonded assembly of FIG. 21A or FIG. 21B after formation of external bonding pads, solder structures, and bonding wires according to an embodiment of the present disclosure.
Figure 24:
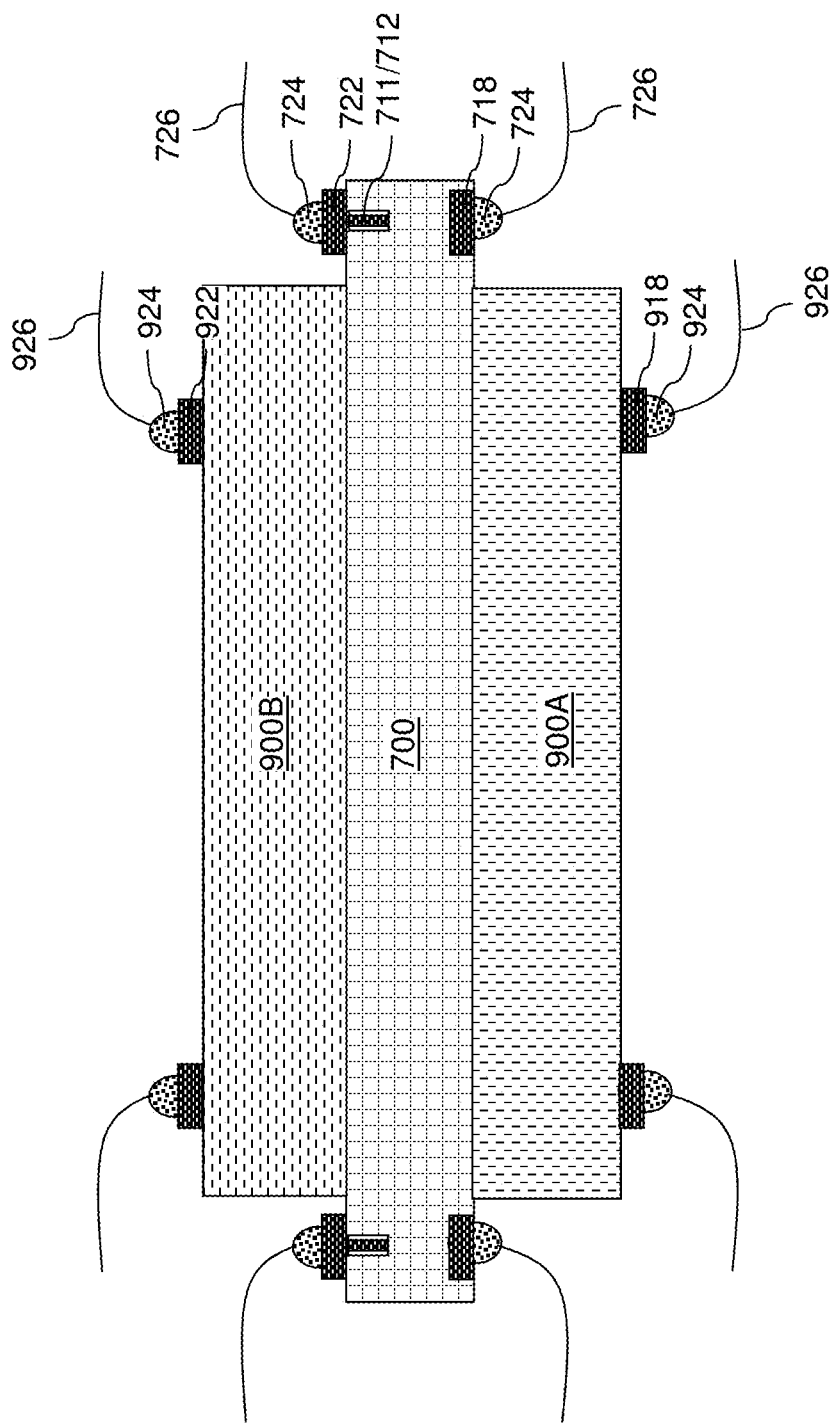
FIG. 24 is a vertical cross-sectional view of a third configuration of the bonded assembly of FIG. 21A or FIG. 21B after formation of external bonding pads, solder structures, and bonding wires according to an embodiment of the present disclosure.

Referring to FIGS. 22-24, external bonding pads (718, 722, 918, 922), solder structures (724, 924), and bonding wires (726, 926) may be formed on at least one of the support die 700, the first memory die 900A, and the second 900B. The external bonding pads (718, 722, 918, 922) may include copper plates and/or underlayer bonding material (UBM) stack. The solder structures (724, 924) may include a solder material such as a tin-silver alloy. The solder structures (724, 924) may be formed on a respective one of the external bonding pads (718, 722, 918, 922).

FIG. 22 illustrates a first configuration in which external bonding pads (718, 722), solder structures 724, and bonding wires 726 are formed only on the support die 700. In this case, the external bonding pads (718, 722) may include front-side external bonding pads 718 that are formed on the front-side surface of the support die 700 that faces the first memory die 900A, and backside external bonding pads 722 that are formed on the backside surface of the support die 700 that faces the second memory die 900B. The lateral extent of the support die 700 may be greater than the lateral extent of the first memory die 900A and/or the lateral extent of the second memory die 900B to allow placement of the external bonding pads (718, 722) on the support die 700.

FIG. 23 illustrates a second configuration in which external bonding pads (918, 922), solder structures 924, and bonding wires 926 are formed only on at least one of the first memory die 900A and the second memory die 900B. In this case, the external bonding pads (918, 922) may include front-side external bonding pads 918 that are formed on the distal-side surface of the first memory die 900A that does not contact the support die 700 and/or backside external bonding pads 922 that are formed on the distal-side surface of the second memory die 900B that does not contact the support die 700. The lateral extent of the support die 700 may be the same as, less than, or greater than, the lateral extent of the first memory die 900A and/or the lateral extent of the second memory die 900B.

FIG. 24 illustrates a third configuration in which the external bonding pads (718, 722, 918, 922), solder structures (724, 924), and bonding wires (726, 926) are formed on the support die 700, and on at least one of the first memory die 900A and the second 900B.

Referring to all drawings and according to various embodiments of the present disclosure, a bonded assembly (700, 900A, 900B) is provided, which comprises: a support die 700 comprising a peripheral circuitry 730, front support-die bonding pads 788 electrically connected to a first subset 731A of the peripheral circuitry 730, and backside bonding structures {(712, 716) or 712} electrically connected to a second subset 731B of the peripheral circuitry 730; a first memory die 900A comprising a first three-dimensional array of memory elements and first memory-die bonding pads 144 that are bonded to the front support-die bonding pads 788; and a second memory die 900B comprising a second three-dimensional array of memory elements and second memory-die bonding pads 244 that are bonded to the backside bonding structures {(712, 716) or 712}.

In one embodiment, an electrically conductive path (comprising a subset of the support-chip metal interconnect structures 780) extends through the support die 700 between a respective pair of a front support-die bonding pad 788 and a backside bonding structure {(712, 716) or 712}. In one embodiment, the electrically conductive path is connected to a node of one of the peripheral circuitry 730 in the support die 700.

In one embodiment, an intersection set of the first subset 731A of the peripheral circuitry 730 and the second subset 731B of the peripheral circuitry 730 comprises a third subset 731C of the peripheral circuitry 730 that is electrically connected to electrical nodes within the first memory die 900A and to electrical nodes within the second memory die 900B.

In one embodiment, the peripheral circuitry 730 comprises a sense amplifier 732 and a first switchable electrical connection circuit 733, wherein the first switchable electrical connection circuit 733 is configured to connect the sense amplifier 732 to a set of nodes that is selected from a set of first bit lines 128 located within the first memory die 900A and a set of second bit lines 128 located within the second memory die 900B.

In one embodiment, the peripheral circuitry 730 comprises a word line driver 734 and a second switchable electrical connection circuit 735, wherein the second switchable electrical connection circuit 735 is configured to connect the word line driver 734 to a set of nodes that is selected from a set of first word lines (comprising a subset of the electrically conductive layers 46) located within the first memory die 900A and a set of second word lines (comprising a subset of the electrically conductive layers 46) located within the second memory die 900B.

In one embodiment, the peripheral circuitry 730 comprises: a first bit line driver 736A connected to first bit lines 128 within the first memory die 900A through a first subset of the front support-die bonding pads 788 and a first subset of the first memory-die bonding pads 144; a second bit line driver 736B connected to second bit lines 128 within the second memory die 900B through a first subset of the backside bonding structures {(712, 716) or 712} and a first subset of the second memory-die bonding pads 244; a first word line driver 734A connected to first word lines (comprising a subset of the electrically conductive layers 46) within the first memory die 900A through a second subset of the front support-die bonding pads 788 and a second subset of the first memory-die bonding pads 144; and a second word line driver 734B connected to second word lines (comprising a subset of the electrically conductive layers 46) within the second memory die 900B through a second subset of the backside bonding structures {(712, 716) or 712} and a second subset of the second memory-die bonding pads 244.

In one embodiment, the peripheral circuitry 730 comprises a source power supply circuit 738 configured to drive a first source line (comprising a combination of the source regions 61, the source contact structure 76, the source-connection contact via structures 184, the first source-connection via structures 114, the first source-connection line structures 124, and the second source-connection via structures 134) in the first memory die 900A and a second source line in the second memory die 900B; and the support die 700 comprises a source power distribution network including a subset of metal interconnect structures (i.e., the support-die metal interconnect structures 780) and connected to the source power supply circuit 738, a subset of the front support-die bonding pads 788, and a subset of the backside bonding structures {(712, 716) or 712}.

In one embodiment, the bonded assembly comprises: external bonding pads (718, 722) located on the support die 700, and solder structures 724 located on the external bonding pads (718, 722).

In one embodiment, the bonded assembly comprises: external bonding pads (918, 922) located on at least one of the first memory die 900A and the second memory die 900B, and solder structures 924 located on the external bonding pads (918, 922).

In one embodiment, one of the backside bonding structures 712 comprises a through-substrate via structure 712 extending through a semiconductor substrate (such as a thinned support-die semiconductor layer 709) of the support die 700, laterally electrically insulated from the semiconductor substrate by a tubular insulating spacer 711, and contacting one of the second memory-die bonding pads 244 as illustrated in FIG. 21B.

In one embodiment, one of the backside bonding structures (712, 716) comprises: a through-substrate via structure 712 extending through a semiconductor substrate (such as a thinned support-die semiconductor layer 709) of the support die 700 and laterally electrically insulated from the semiconductor substrate by a tubular insulating spacer 711; and a backside support-die bonding pad 716 contacting the through-substrate via structure 712 and bonded to one of the second memory-die bonding pads 244.

At least some components of the peripheral circuitry 730 in the support die 700 may be shared by the first memory die 900A and the second memory die 900B. Bonding of multiple memory dies (900A, 900B) to the support die 700 may provide effective utilization of resources in the support die 700 and enhanced performance for a bonded memory chip including the support die 700, the first memory die 900A, and the second memory die 900B.

By providing memory dies on both sides of the support die, reduction in the device area of the support die may be avoided. The area of the support die may be comparable to the area of the first memory die or the second memory die.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A bonded assembly comprising:
    a support die comprising a peripheral circuitry containing field effect transistors located on a semiconductor material layer, front support-die bonding pads electrically connected to a first subset of the field effect transistors in the peripheral circuitry and overlying the semiconductor material layer, and backside bonding structures extending through the semiconductor material layer, and electrically connected to a second subset of the field effect transistors in the peripheral circuitry;
    a first memory die comprising a first three-dimensional array of memory elements and first memory-die bonding pads that are bonded to the front support-die bonding pads; and
    a second memory die comprising a second three-dimensional array of memory elements and second memory-die bonding pads that are bonded to the backside bonding structures.

2. The bonded assembly of claim 1, wherein each of the first memory die and the second memory die comprises:
    an alternating stack of insulating layers and electrically conductive layers forming word lines, the alternating stack having stepped surfaces in which a subset of the electrically conductive layers has a lateral extent that increases with a distance from the support die;
    memory stack structures vertically extending through the alternating stack and including a respective vertical semiconductor channel and a respective set of vertically stacked memory elements located at levels of the electrically conductive layers; and
    word line contact via structures contacting a respective one of the word lines and extending from the respective one of the word lines toward the support die.

3. The bonded assembly of claim 1, wherein the first memory-die bonding pads are bonded to the front support-die bonding pads by metal-to-metal bonding.

4. The bonded assembly of claim 3, wherein the second memory-die bonding pads are bonded to the backside bonding structures by metal-to-metal bonding.

5. The bonded assembly of claim 1, wherein:
    the support die comprises support-die metal interconnect structures embedded within support-chip dielectric layers;
    a first subset of the support-die metal interconnect structures provide electrical connection between the front support-die bonding pads and the first subset of the field effect transistors in the peripheral circuitry; and
    a second subset of the support-die metal interconnect structures provide electrical connection between the backside support-die bonding pads and the second subset of the field effect transistors in the peripheral circuitry.

6. The bonded assembly of claim 5, wherein one of the backside bonding structures comprises a through-substrate via structure in direct contact with a bottom surface of one of the second subset of the support-die metal interconnect structures and vertically extending from a first horizontal plane including a top surface of the semiconductor material layer to a second horizontal plane including a bottom surface of the semiconductor material layer.

7. The bonded assembly of claim 6, further comprising a tubular insulating spacer vertically extending from the first horizontal plane to the second horizontal plane and laterally surrounding the through-substrate via structure, wherein an entirety of an outer sidewall of the tubular insulating spacer contacts a semiconductor material within the semiconductor material layer.

8. The bonded assembly of claim 1, wherein the peripheral circuitry comprises:
a first bit line driver connected to first bit lines within the first memory die through a first subset of the front support-die bonding pads and a first subset of the first memory-die bonding pads; and
a second bit line driver connected to second bit lines within the second memory die through a first subset of the backside bonding structures and a first subset of the second memory-die bonding pads.

9. The bonded assembly of claim 8, wherein the peripheral circuitry further comprises:
a first word line driver connected to first word lines within the first memory die through a second subset of the front support-die bonding pads and a second subset of the first memory-die bonding pads; and
a second word line driver connected to second word lines within the second memory die through a second subset of the backside bonding structures and a second subset of the second memory-die bonding pads.

10. The bonded assembly of claim 1, wherein the semiconductor material layer comprises at least a portion of a silicon wafer.

11. A method for forming a bonded assembly, comprising:
providing a support die comprising a peripheral circuitry containing field effect transistors located on a semiconductor material layer and front support-die bonding pads electrically connected to a first subset of the field effect transistors and embedded in support-chip dielectric layers overlying the semiconductor material layer;
bonding a first memory die comprising a first three-dimensional array of memory elements to the support die, wherein first memory-die bonding pads of the first memory die are bonded to the front support-die bonding pads;
forming backside bonding structures electrically connected to a second subset of the field effect transistors through the semiconductor material layer, wherein portions of the backside bonding structures are embedded in a backside insulating layer underlying the semiconductor material layer; and
bonding a second memory die comprising a second three-dimensional array of memory elements to the support die, wherein second memory-die bonding pads of the second memory die are bonded to the backside bonding structures.

12. The method of claim 11, wherein the first memory-die bonding pads are bonded to the front support-die bonding pads by metal-to-metal bonding.

13. The method of claim 12, wherein the second memory-die bonding pads are bonded to the backside bonding structures by metal-to-metal bonding.

14. The method of claim 11, wherein:
the support die comprises support-die metal interconnect structures embedded within the support-chip dielectric layers;
a first subset of the support-die metal interconnect structures provide electrical connection between the front support-die bonding pads and the first subset of the field effect transistors in the peripheral circuitry; and
a second subset of the support-die metal interconnect structures provide electrical connection between the backside support-die bonding pads and the second subset of the field effect transistors in the peripheral circuitry.

15. The method of claim 14, wherein:
one of the backside bonding structures comprises a through-substrate via structure that is formed in direct contact with a bottom surface of one of the second subset of the support-die metal interconnect structures; and
the through-substrate via structure vertically extends from a first horizontal plane including a top surface of the semiconductor material layer to a second horizontal plane including a bottom surface of the semiconductor material layer.

16. The method of claim 15, further comprising forming a tubular insulating spacer vertically extending from the first horizontal plane to the second horizontal plane, wherein the through-substrate via structure is formed within the through-substrate via structure.

17. The method of claim 11, wherein the peripheral circuitry comprises:
a first bit line driver connected to first bit lines within the first memory die through a first subset of the front support-die bonding pads and a first subset of the first memory-die bonding pads upon bonding of the first memory-die bonding pads of the first memory die to the front support-die bonding pads; and
a second bit line driver connected to second bit lines within the second memory die through a first subset of the backside bonding structures and a first subset of the second memory-die bonding pads upon bonding of the second memory-die bonding pads of the second memory die to the backside bonding structures.

18. The method of claim 17, wherein the peripheral circuitry further comprises:
a first word line driver connected to first word lines within the first memory die through a second subset of the front support-die bonding pads and a second subset of the first memory-die bonding pads; and
a second word line driver connected to second word lines within the second memory die through a second subset of the backside bonding structures and a second subset of the second memory-die bonding pads.

19. The method of claim 11, further comprising thinning a silicon wafer supporting the peripheral circuitry to form the semiconductor material layer.

20. The method of claim 11, wherein each of the first memory die and the second memory die comprises:
an alternating stack of insulating layers and electrically conductive layers forming word lines, the alternating stack having stepped surfaces in which a subset of the electrically conductive layers has a lateral extent that increases with a distance from the support die;
memory stack structures vertically extending through the alternating stack and including a respective vertical semiconductor channel and a respective set of vertically stacked memory elements located at levels of the electrically conductive layers; and word line contact via structures contacting a respective one of the word lines and extending from the respective one of the word lines toward the support die.

\* \* \* \* \*